(12) United States Patent
Choi et al.

(10) Patent No.: US 12,272,768 B2
(45) Date of Patent: Apr. 8, 2025

(54) DISPLAY DEVICE AND METHOD FOR FABRICATING THE SAME

(71) Applicant: Samsung Display Co., LTD., Yongin-si (KR)

(72) Inventors: Jin Woo Choi, Seoul (KR); Sung Kook Park, Suwon-si (KR); Dae Ho Song, Hwaseong-si (KR); Tae Hee Lee, Hwaseong-si (KR); Hae Yun Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 540 days.

(21) Appl. No.: 17/552,152

(22) Filed: Dec. 15, 2021

(65) Prior Publication Data

US 2022/0359788 A1 Nov. 10, 2022

(30) Foreign Application Priority Data

Apr. 30, 2021 (KR) .......................... 10-2021-0056336

(51) Int. Cl.
*H01L 33/38* (2010.01)
*H01L 27/15* (2006.01)
*H01L 33/00* (2010.01)
(Continued)

(52) U.S. Cl.
CPC .......... *H01L 33/382* (2013.01); *H01L 27/156* (2013.01); *H01L 33/005* (2013.01);
(Continued)

(58) Field of Classification Search
CPC ..... H01L 33/382; H01L 33/005; H01L 33/10; H01L 33/32; H01L 33/505; H01L 33/46; H01L 33/502; H01L 33/60; H01L 33/62; H01L 33/50; H01L 27/156; H01L 27/124; H01L 2933/0016; H01L 2933/0041; H01L 2933/0025; H01L 2933/0058; H01L 25/0753; G02B 5/201
See application file for complete search history.

(56) References Cited

U.S. PATENT DOCUMENTS 6,155,699 A * 12/2000 Miller ................... H01L 33/507
257/97
11,073,718 B2 7/2021 Kim et al.
(Continued)

FOREIGN PATENT DOCUMENTS

JP 2020-529729 A 10/2020
KR 10-2018-0085848 7/2018
(Continued)

*Primary Examiner* — Sitaramarao S Yechuri
(74) *Attorney, Agent, or Firm* — Womble Bond Dickinson (US) LLP

(57) ABSTRACT

There is provided a display device comprising a substrate, a pixel electrode on the substrate, a light emitting element on the pixel electrode, and extending in a thickness direction of the substrate, a common electrode on the light emitting element, a wavelength conversion layer on the common electrode, including wavelength conversion particles for converting first light emitted from the light emitting element into second light, and a selective transmission film on an upper surface and on sides of the wavelength conversion layer, and configured to reflect the first light, and to transmit the second light.

20 Claims, 44 Drawing Sheets

(51) Int. Cl.
    *H01L 33/10*            (2010.01)
    *H01L 33/32*            (2010.01)
    *H01L 33/50*            (2010.01)

(52) U.S. Cl.
    CPC .............. *H01L 33/10* (2013.01); *H01L 33/32* (2013.01); *H01L 33/505* (2013.01); *H01L 2933/0016* (2013.01); *H01L 2933/0041* (2013.01)

(56) References Cited

U.S. PATENT DOCUMENTS

| | | | |
|---|---|---|---|
| 11,342,525 | B2 | 5/2022 | Kim et al. |
| 11,855,053 | B2 | 12/2023 | Kong et al. |
| 11,983,350 | B2 | 5/2024 | Kang et al. |
| 2007/0241657 | A1* | 10/2007 | Radkov .................. H01L 33/44 313/483 |
| 2009/0154194 | A1* | 6/2009 | Hadlich .................. H01L 33/44 257/E33.073 |
| 2012/0068620 | A1* | 3/2012 | Ishimura ............... C09K 11/574 257/E33.045 |
| 2015/0085223 | A1* | 3/2015 | Park .................. G02F 1/133615 349/65 |
| 2018/0122836 | A1* | 5/2018 | Kang .................. H01L 27/1248 |
| 2018/0203292 | A1* | 7/2018 | Kim .................. G02F 1/133617 |
| 2018/0239245 | A1* | 8/2018 | Yang ........................ C09D 4/00 |
| 2020/0066787 | A1* | 2/2020 | Park ...................... H01L 27/156 |
| 2020/0184884 | A1* | 6/2020 | Lau ........................ H05B 45/10 |
| 2021/0020619 | A1 | 1/2021 | Iguchi et al. |
| 2021/0273024 | A1* | 9/2021 | Wang ................ G02F 1/133606 |
| 2021/0296543 | A1* | 9/2021 | Aoyama ............... H01L 27/156 |
| 2022/0165921 | A1 | 5/2022 | Choi et al. |

FOREIGN PATENT DOCUMENTS

| | | |
|---|---|---|
| KR | 10-2020-0001649 | 1/2020 |
| KR | 10-2020-0058665 | 5/2020 |
| KR | 10-2020-0073340 | 6/2020 |
| KR | 2020-0127777 A | 11/2020 |

\* cited by examiner

DISPLAY DEVICE AND METHOD FOR FABRICATING THE SAME

CROSS-REFERENCE TO RELATED APPLICATION

This application claims priority to, and the benefit of, Korean Patent Application No. 10-2021-0056336 filed on Apr. 30, 2021 in the Korean Intellectual Property Office (KIPO), the entire content of which is incorporated by reference herein.

BACKGROUND

1. Field

The present disclosure relates to a display device, and a method for fabricating the same.

2. Description of the Related Art

With the advancement of the information age, the demand for a display device for displaying an image has increased with various forms. The display device may be a flat panel display device, such as a liquid crystal display device, a field emission display device, and a light emitting display panel. The light emitting display device may include an organic light emitting display device including an organic light emitting diode element as a light emitting element, an inorganic light emitting display device including an inorganic semiconductor element as a light emitting element, or a micro light emitting diode element as a light emitting element.

Recently, a head mounted display including a light emitting display device has been developed. The head mounted display (HMD) is a glasses type monitor device of a virtual reality (VR) or an augmented reality (AR), which is worn by a user in the form of glasses or a helmet, and which forms a focus, or focal point, at a distance close to eyes of the user.

A high-resolution micro light emitting diode display panel including a micro light emitting diode element is applied to a head mounted display. To reduce or prevent light emitted from the micro light emitting diode element from being mixed with light emitted from another micro light emitting diode element adjacent thereto, a partition may be located between the micro light emitting diode elements. However, because a width of the partition should be reduced due to high integration of the micro light emitting diode elements, it may be difficult to fabricate the partition.

SUMMARY

Aspects of some embodiments of the present disclosure provide a display device and a method for fabricating the same, in which mixture of light of light emitting diodes adjacent to each other may be reduced or prevented without a separate partition.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, there is provided a display device comprising a substrate, a pixel electrode on the substrate, a light emitting element on the pixel electrode, and extending in a thickness direction of the substrate, a common electrode on the light emitting element, a wavelength conversion layer on the common electrode, including wavelength conversion particles for converting first light emitted from the light emitting element into second light, and a selective transmission film on an upper surface and on sides of the wavelength conversion layer, and configured to reflect the first light, and to transmit the second light.

The selective transmission film may include a plurality of odd layers having a first refractive index, and a plurality of even layers having a second refractive index that is higher than the first refractive index, wherein the plurality of odd layers and the plurality of even layers are alternately located in the thickness direction of the substrate.

The display device may further include a color filter on the selective transmission film, configured to block or absorb the first light, and configured transmit at least a portion of the second light.

The display device may further include a reflection film on sides of the selective transmission film.

The display device may further include a connection electrode between the pixel electrode and the light emitting element.

The common electrode may be on an upper surface of the light emitting element, and may surround the sides of the light emitting element and sides of the connection electrode.

The display device may further include a first insulating film on the substrate, wherein the common electrode is on the first insulating film.

The selective transmission film may be on the common electrode.

The display device may further include a second insulating film between the sides of the light emitting element and the common electrode.

According to some embodiments of the present disclosure, there is provided a display device including a substrate, a pixel electrode on the substrate, a light emitting element on the pixel electrode, and extending in a thickness direction of the substrate, a wavelength conversion layer on the light emitting element, including wavelength conversion particles for converting first light emitted from the light emitting element into second light, a common electrode on the wavelength conversion layer, and a selective transmission film on or above the common electrode, and configured to reflect the first light, and transmit the second light The light emitting element may includes a first semiconductor layer on the pixel electrode, an active layer on the first semiconductor layer, and a second semiconductor layer on the active layer.

The wavelength conversion layer may include a third semiconductor layer defining a plurality of openings for accommodating the wavelength conversion particles.

The third semiconductor layer may include a same material as that of the second semiconductor layer.

The first semiconductor layer may include p-GaN doped with a first conductive type dopant, wherein each of the second semiconductor layer and the third semiconductor layer includes n-GaN doped with a second conductive type dopant.

A thickness of the wavelength conversion layer may be greater than that of the light emitting element.

The wavelength conversion layer may be on an upper surface and sides of the common electrode, and surrounds sides of the light emitting element.

According to some embodiments of the present disclosure, there is provided a display device including a light emitting element in each of a first light emission area configured to emit first light, a second light emission area configured to emit second light, and a third light emission area configured to emit third light, a light transmitting layer on the light emitting element in the first light emission area, a wavelength conversion layer on the light emitting element in the second light emission area and on the light emitting element in the third light emission area, and a selective transmission film on sides of the light transmitting layer in the first light emission area, and on upper surfaces and sides of the wavelength conversion layer in the second light emission area, wherein the selective transmission film is configured to reflect the first light incident from the wavelength conversion layer and to transmit the second light.

The selective transmission film may be on the upper surfaces and sides of the wavelength conversion layer in the third light emission area, and may be configured to transmit the third light.

The display device may further include a first color filter on the light transmitting layer in the first light emission area, configured to transmit the first light, and configured to absorb or block the second light and the third light, a second color filter on the wavelength conversion layer in the second light emission area, configured to transmit the second light, and configured to absorb or block the first light and the third light, and a third color filter on the wavelength conversion layer in the third light emission area, configured to transmit the third light, and configured to absorb or block the first light and the second light.

According to some embodiments of the present disclosure, there is provided a method for fabricating a display device, the method including forming a first connection electrode layer on a first substrate, forming a second connection electrode layer on a light emitting material layer of a second substrate, forming a connection electrode layer by bonding the first connection electrode layer to the second connection electrode layer, removing the second substrate, forming a mask pattern on the light emitting material layer, etching the light emitting material layer and the connection electrode layer in accordance with the mask pattern to form light emitting elements, forming an insulating film on sides of each of the light emitting elements, forming a common electrode on an upper surface of each of the light emitting elements and on the insulating film, forming a light transmitting layer on the common electrode in a first light emission area, forming a wavelength conversion layer, which is configured to convert first light emitted from the light emitting element into second light, on the common electrode in a second light emission area and in a third light emission area, and forming a selective transmission film, which is configured to reflect the first light and transmit the second light, on the wavelength conversion layer of each of the second light emission area and the third light emission area.

According to the aforementioned and other embodiments of the present disclosure, a light transmitting layer is located on an upper surface and sides of a light emitting element in each of first light emission areas, and a wavelength conversion layer is located on the upper surface and sides of the light emitting element in each of second light emission areas and third light emission areas. Further, a reflection film is located on sides of the light transmitting layer in each of the first light emission areas and sides of the wavelength conversion layer in each of the second light emission areas and the third light emission areas. Therefore, light moving to upper and lower sides, and to left and right sides not in an upper direction among light emitted from the light emitting element, may be reflected by the reflection film. Therefore, even though a separate partition is not located between light emitting elements of adjacent light emission areas, mixture of light emitted from the light emitting elements of the adjacent light emission areas may be reduced or prevented.

According to the aforementioned and other embodiments of the present disclosure, a wavelength conversion layer includes a third semiconductor layer that includes the same material as that of a semiconductor layer of a light emitting element, and defines a plurality of openings for accommodating first wavelength conversion particles. Further, a reflection film is located on sides of the wavelength conversion layer in each of first light emission areas and sides of the wavelength conversion layer in each of second light emission areas and third light emission areas. Therefore, light moving to upper and lower sides, and to left and right sides not in an upper direction among light emitted from the light emitting element may be reflected by the reflection film. Therefore, even though a separate partition is not located between light emitting elements of adjacent light emission areas, mixture of light emitted from the light emitting elements of the adjacent light emission areas may be reduced or prevented.

According to the aforementioned and other embodiments of the present disclosure, a selective transmission film may reflect first light that is not converted by first wavelength conversion particles of a wavelength conversion layer among the first light emitted from a light emitting element in each of second light emission areas and third light emission areas, and may transmit fourth light converted by the first wavelength conversion particles. The first light reflected by the selective transmission film re-enters the wavelength conversion layer, and thus may be converted into the fourth light by the first wavelength conversion particles of the wavelength conversion layer. Therefore, due to the selective transmission film, the first light emitted from the light emitting element may be converted into the fourth light by the first wavelength conversion particles of the wavelength conversion layer.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
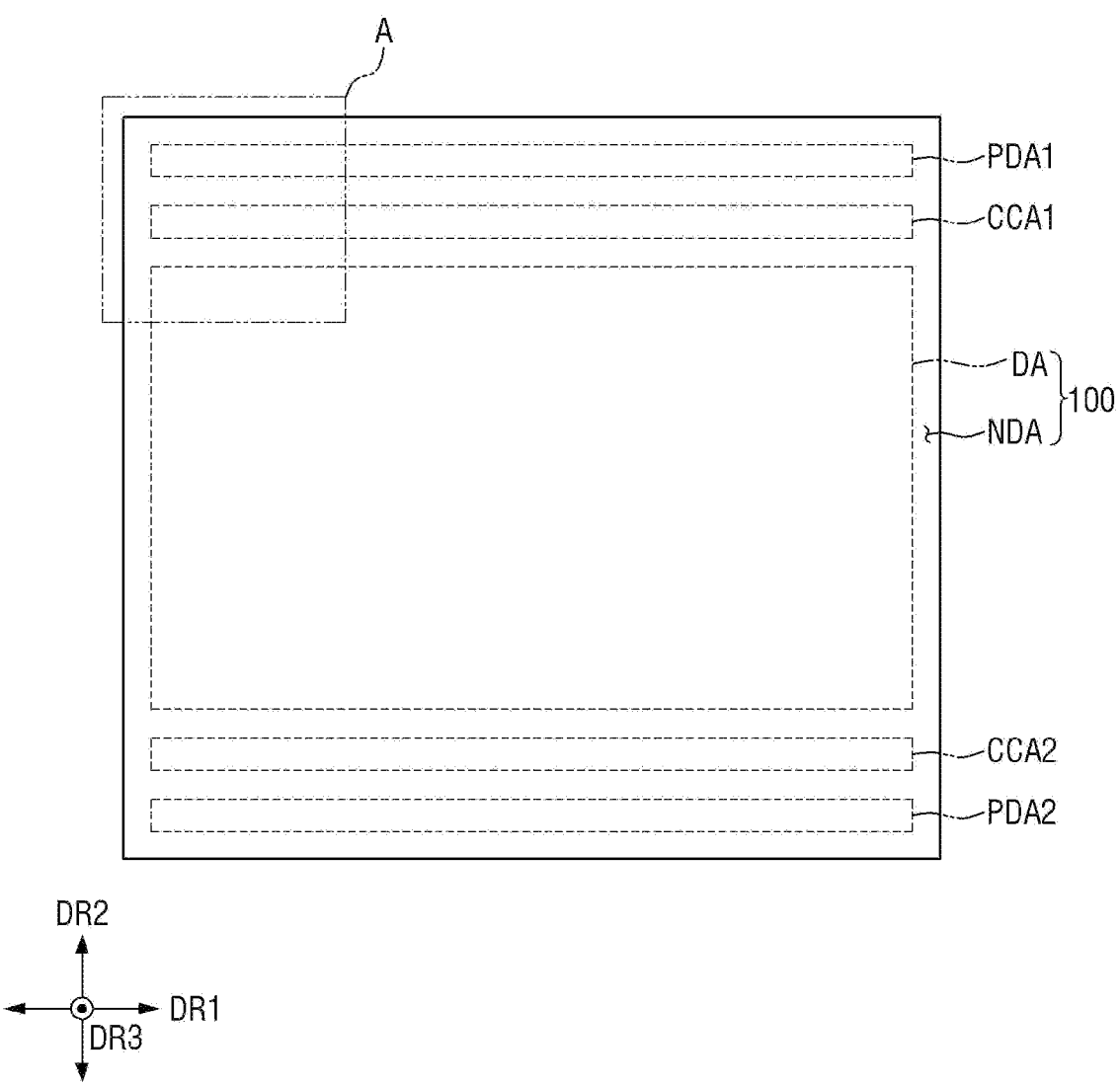
FIG. 1 is a layout view of a display device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
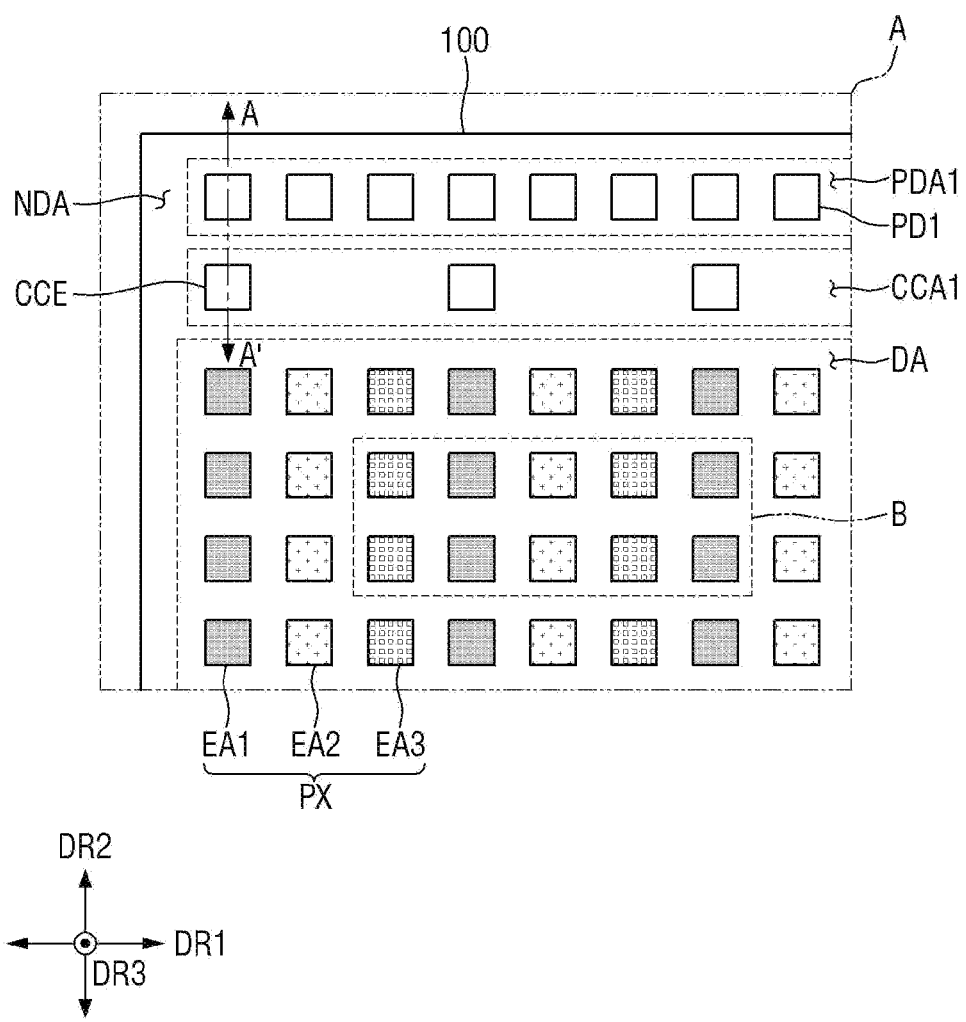
FIG. 2 is a detailed layout view illustrating an area A of FIG. 1.
Figure 3:
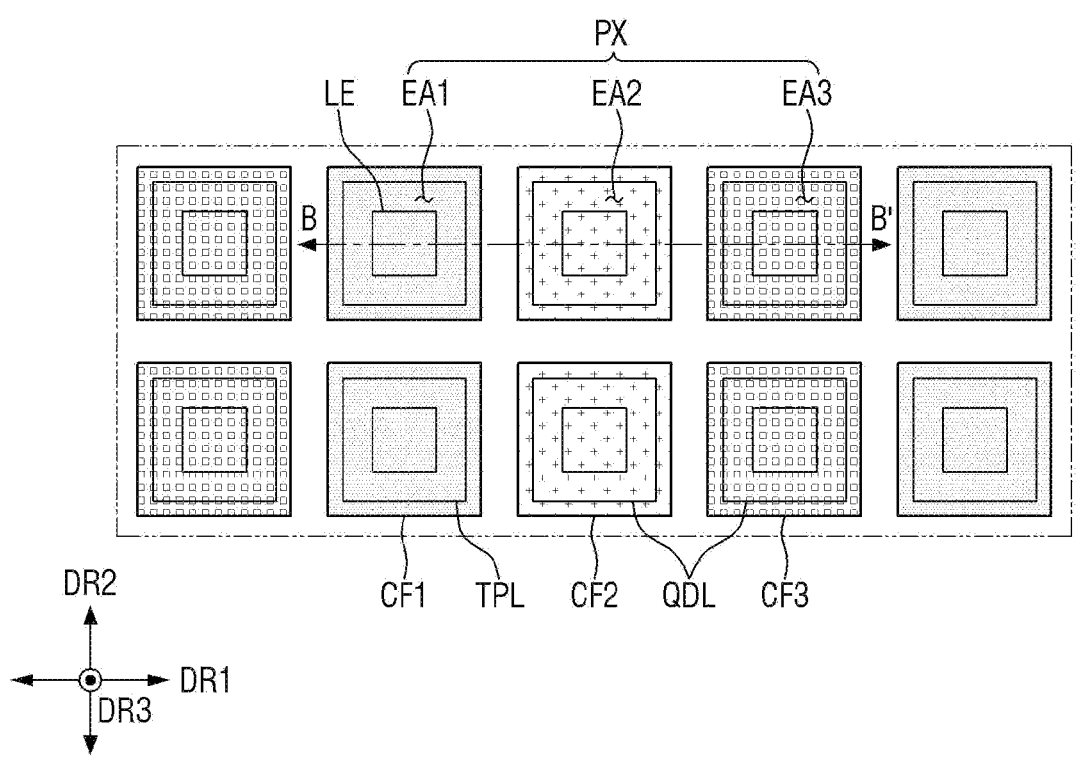
FIG. 3 is a layout view illustrating pixels of a display panel according to some embodiments of the present disclosure.

FIG. 1 is a layout view of a display device according to some embodiments of the present disclosure. FIG. 2 is a detailed layout view illustrating an area A of FIG. 1. FIG. 3 is a layout view illustrating pixels of a display panel according to some embodiments of the present disclosure.

Although the display device according to some embodiments of the present disclosure is a micro light emitting diode display device (or nano light emitting diode display device) including a micro light emitting diode as a light emitting element LE in FIGS. 1 to 3, the present disclosure is not limited thereto.

Although the display device according to some embodiments of the present disclosure is a light emitting diode on silicon (LEDoS) having light emitting diodes located, which are on a semiconductor circuit board 110 formed by a semiconductor process using a silicon wafer, as light emitting elements in FIGS. 1 to 3, the present disclosure is not limited thereto.

In addition, in FIGS. 1 to 3, a first direction DR1 indicates a horizontal direction (e.g., in a plan view) of a display panel 100, a second direction DR2 indicates a vertical direction (e.g., in a plan view) of the display panel 100, and a third direction DR2 indicates a thickness direction of the display panel 100 or a thickness direction of the semiconductor circuit board 110. In this case, "left," "right," "up," and "down," indicate directions when the display panel 100 is viewed from the plane. For example, "right" indicates one side of the first direction DR1, "left" indicates the other side of the first direction DR1, "upper" indicates one side of the second direction DR2, and "lower" indicates the other side of the second direction DR2. In addition, "upper" indicates one side of the third direction DR3, and "lower" indicates the other side of the third direction DR3.

Referring to FIGS. 1 to 3, the display device 10 according to some embodiments includes a display panel 100 including a display area DA and a non-display area NDA.

The display panel 100 may have a rectangular plane shape having a long side of the first direction DR1 (e.g., extending in the first direction DR1) and a short side of the second direction DR2 (e.g., extending in the second direction DR2), but the plane shape of the display panel 100 is not limited thereto, and the display panel 100 may have another polygonal shape in addition to the rectangular shape, a circular shape, an oval shape, or an irregular plane shape.

The display area DA may be an area where an image is displayed, and the non-display area NDA may be an area where an image is not displayed. The plane shape of the display area DA may follow the plane shape of the display panel 100. In FIG. 1, the plane shape of the display area DA is a rectangular shape. The display area DA generally may be located in a central area of the display panel 100. The non-display area NDA may be located in the vicinity of the display area DA. The non-display area NDA may be located to surround the display area DA.

The display area DA of the display panel 100 may include a plurality of pixels PX. The pixels PX may be defined as a minimum light emission unit capable of displaying white light.

Each of the plurality of pixels PX may include a plurality of light emission areas EA1, EA2, and EA3 that emit light. In some embodiments of the present disclosure, each of the plurality of pixels PX includes three light emission areas EA1, EA2, and EA3, but is not limited thereto. For example, each of the plurality of pixels PX may include four light emission areas. Each of the plurality of light emission areas EA1, EA2, and EA3 may include a light emitting element LE for emitting first light.

Each of the first light emission areas EA1 indicates an area for emitting the first light. Each of the first light emission areas EA1 may output the first light output from the light emitting element LE as it is. The first light may be the light of a blue wavelength band. The blue wavelength band may range from about 370 nm to about 460 nm, approximately, but the present disclosure is not limited thereto.

Each of the second light emission areas EA2 indicates an area for emitting second light. Each of the second light emission areas EA2 may convert a portion of the first light output from the light emitting element LE into second light, and may output the second light. The second light may be the light of a green wavelength band. The green wavelength band may range from about 480 nm to about 560 nm, approximately, but the present disclosure is not limited thereto.

Each of the third light emission areas EA3 indicates an area for emitting third light. Each of the third light emission areas EA2 may convert a portion of the first light output from the light emitting element LE into the third light, and may output the third light. The third light may be the light of a red wavelength band. The red wavelength band may range from about 600 nm to about 750 nm, approximately but the present disclosure is not limited thereto.

The first light emission areas EA1, the second light emission areas EA2, and the third light emission areas EA3 may alternately be arranged in the first direction DR1. For example, the first light emission areas EA1, the second light emission areas EA2, and the third light emission areas EA3 may be located in the first direction DR1 in due order.

The first light emission areas EA1 may be arranged in the second direction DR2. The second light emission areas EA2 may be arranged in the second direction DR2. The third light emission areas EA3 may be arranged in the second direction DR2.

Each of the first light emission areas EA1 may include a light emitting element LE, a light transmitting layer TPL, and a first color filter CF1. The light emitting element LE, the light transmitting layer TPL, and the first color filter CF1 may overlap one another in the third direction DR3. The light transmitting layer TPL may transmit the first light output from the light emitting element LE as it is, and the first color filter CF1 may transmit the first light. Therefore, each of the first light emission areas EA1 may emit the first light.

Each of the second light emission areas EA2 may include a light emitting element LE, a wavelength conversion layer QDL, and a second color filter CF2. The light emitting element LE, the wavelength conversion layer QDL, and the second color filter CF2 may overlap one another in the third direction DR3. The wavelength conversion layer QDL may convert a portion of the first light output from the light emitting element LE into fourth light, and may emit the fourth light. For example, the fourth light may be the light of a yellow wavelength band. The fourth light may include both a green wavelength band and a red wavelength band. That is, the fourth light may be the mixture light of the second light and the third light. The second color filter CF2 may transmit the second light. Therefore, each of the second light emission areas EA2 may emit the second light.

Each of the third light emission areas EA3 may include a light emitting element LE, a wavelength conversion layer QDL, and a third color filter CF3. The light emitting element LE, the wavelength conversion layer QDL, and the third color filter CF3 may overlap one another in the third direction DR3. The wavelength conversion layer QDL may convert a portion of the first light output from the light emitting element LE into the fourth light, and may emit the fourth light. The third color filter CF3 may transmit the third light. Therefore, each of the third light emission areas EA3 may emit the third light.

Each of an area of the light transmitting layer TPL and an area of the wavelength conversion layer QDL may be greater than an area of the light emitting element LE. An area of each of the first color filter CF1, the second color filter CF2, and the third color filter CF3 may be greater than that of the light emitting element LE. In addition, the area of each of the first color filter CF1, the second color filter CF2, and the third color filter CF3 may be greater than each of the area of the light transmitting layer TPL and the area of the wavelength conversion layer QDL.

In the light emission area EA1, the light emitting element LE may be completely covered by the light transmitting layer TPL, and the light transmitting layer TPL may be completely covered by the first color filter CF1. In addition, in the second light emission area EA2, the light emitting element LE may be completely covered by the wavelength conversion layer QDL, and the wavelength conversion layer QDL may be completely covered by the second color filter CF2. Furthermore, in the third light emission area EA3, the light emitting element LE may be completely covered by the wavelength conversion layer QDL, and the wavelength conversion layer QDL may be completely covered by the third color filter CF3.

A plane shape of the light transmitting layer TPL, a plane shape of the wavelength conversion layer QDL, a plane shape of the first color filter CF1, a plane shape of the second color filter CF2, and a plane shape of the third color filter CF3 follow a plane shape of the light emitting element LE. For example, when the light emitting element LE has a rectangular plane shape, each of the light transmitting layer TPL, the wavelength conversion layer QDL, the first color filter CF1, the second color filter CF2, and the third color filter CF3 may have a rectangular plane shape.

Alternatively, the light emitting element LE may have a polygonal shape other than the rectangular shape, a circular shape, an oval shape, or an irregular shape. In this case, the light transmitting layer TPL, the wavelength conversion layer QDL, the first color filter CF1, the second color filter CF2, and the third color filter CF3 may also have a polygonal shape other than the rectangular shape, a circular shape, an oval shape, or an irregular shape.

Otherwise, the plane shape of the light transmitting layer TPL, the plane shape of the wavelength conversion layer QDL, the plane shape of the first color filter CF1, the plane shape of the second color filter CF2, and the plane shape of the third color filter CF3 may not follow the plane shape of the light emitting element LE. In this case, the plane shape of the light transmitting layer TPL, the plane shape of the wavelength conversion layer QDL, the plane shape of the first color filter CF1, the plane shape of the second color filter CF2, and the plane shape of the third color filter CF3 may be different from the plane shape of the light emitting element LE. In addition, each of the plane shape of the light transmitting layer TPL and the plane shape of the wavelength conversion layer QDL may be different from each of the plane shape of the first color filter CF1, the plane shape of the second color filter CF2, and the plane shape of the third color filter CF3.

The non-display area NDA may include a first common connection area CCA1, a second common connection area CCA2, a first pad area PDA1, and a second pad area PDA2.

The first common connection area CCA1 may be located between the first pad area PDA1 and the display area DA. The second common connection area CCA2 may be located between the second pad area PDA2 and the display area DA. Each of the first common connection area CCA1 and the second common connection area CCA2 may include a plurality of common connection electrodes CCE connected to a common electrode (CE of FIG. 4 and FIG. 5). As a result, the common voltage may be supplied to the common electrode (CE of FIGS. 4 and 5) through the plurality of common connection electrodes (CCE). The plurality of common connection electrodes CCE of the first common connection area CCA1 may be electrically connected to any one of first pads PD1 of the first pad area PDA1. The plurality of common connection electrodes CCE of the second common connection area CCA2 may be electrically connected to any one of second pads PD2 of the second pad area PDA2.

The first pad area PDA1 may be located near a top of the display panel 100. The first pad area PDA1 may include the first pads PD1 connected to an external circuit board (CB of FIG. 4).

The second pad area PDA2 may be located near a bottom of the display panel 100. The second pad area PDA2 may include second pads for connection with the external circuit board (CB of FIG. 4). The second pad area PDA2 may be omitted in other embodiments.

Figure 4:
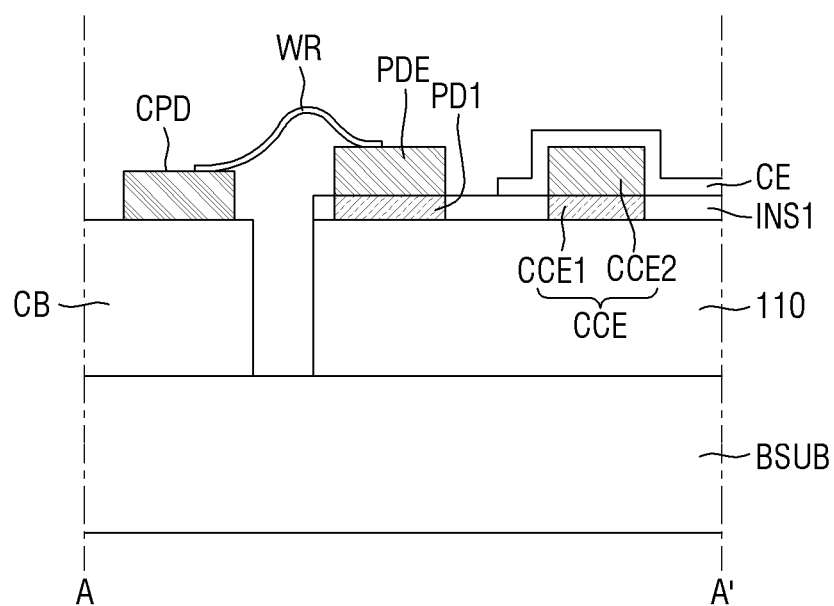
FIG. 4 is a cross-sectional view illustrating an example of a display panel taken along the line A-A' of FIG. 2.
Figure 4:
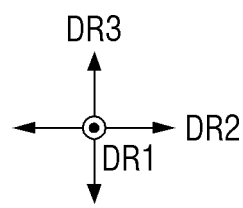
Figure 5:
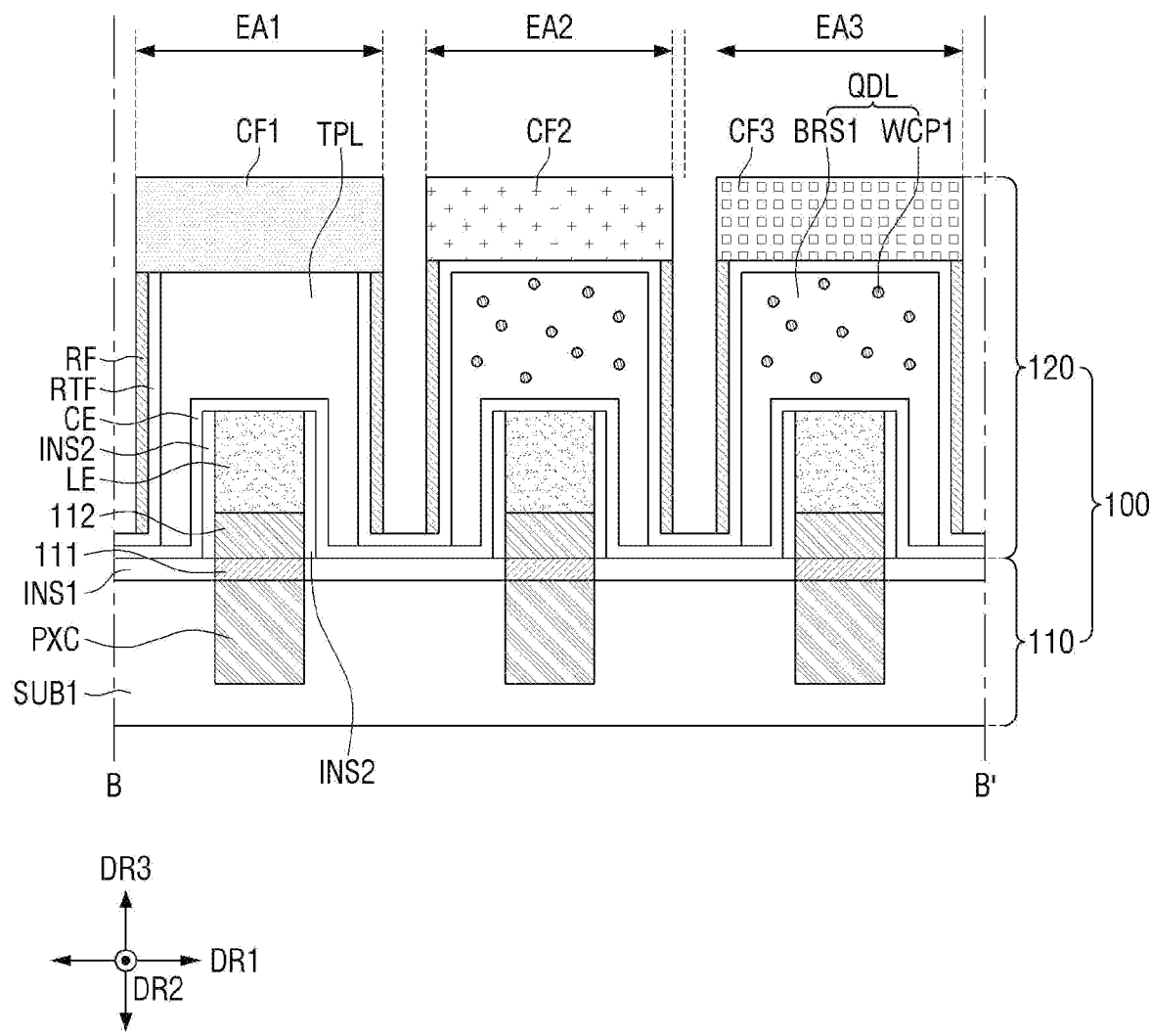
FIG. 5 is a cross-sectional view illustrating an example of a display panel taken along the line B-B' of FIG. 3.
Figure 6:
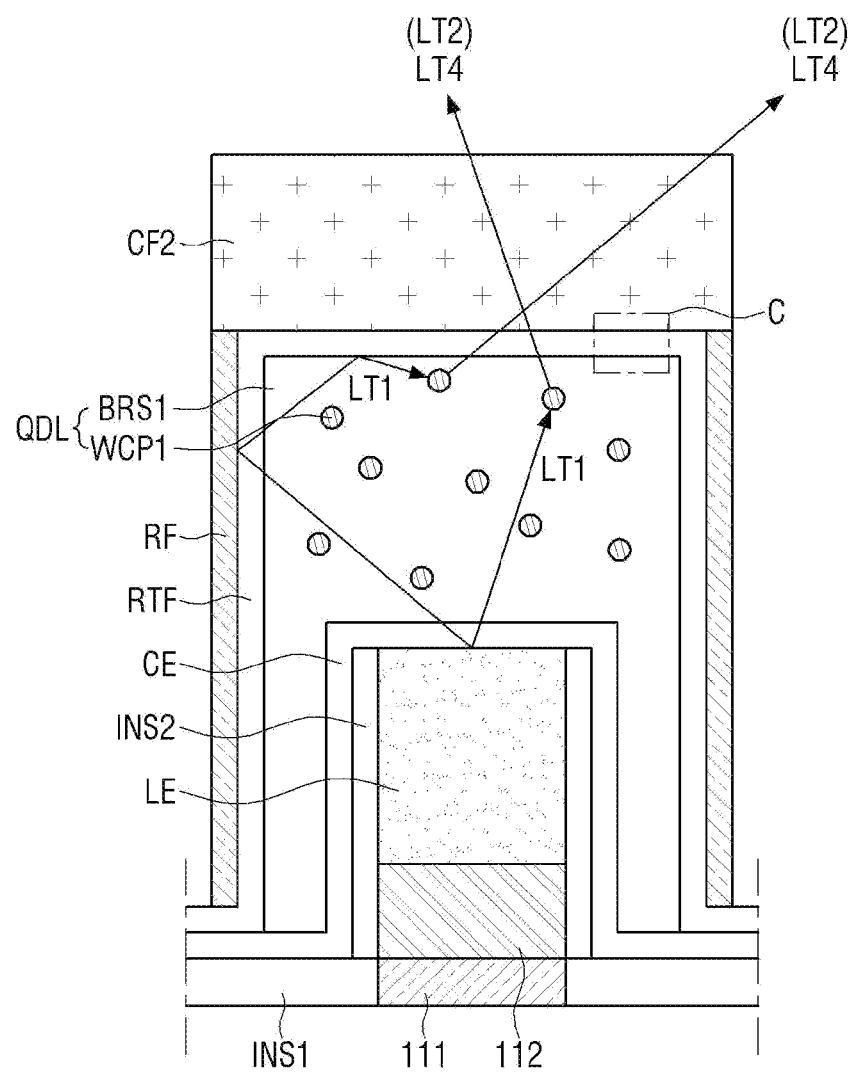
FIG. 6 is an enlarged cross-sectional view illustrating a light emitting element, a wavelength conversion layer, a selective transmission film, and a second color filter of a second light emission area of FIG. 5.
Figure 7:
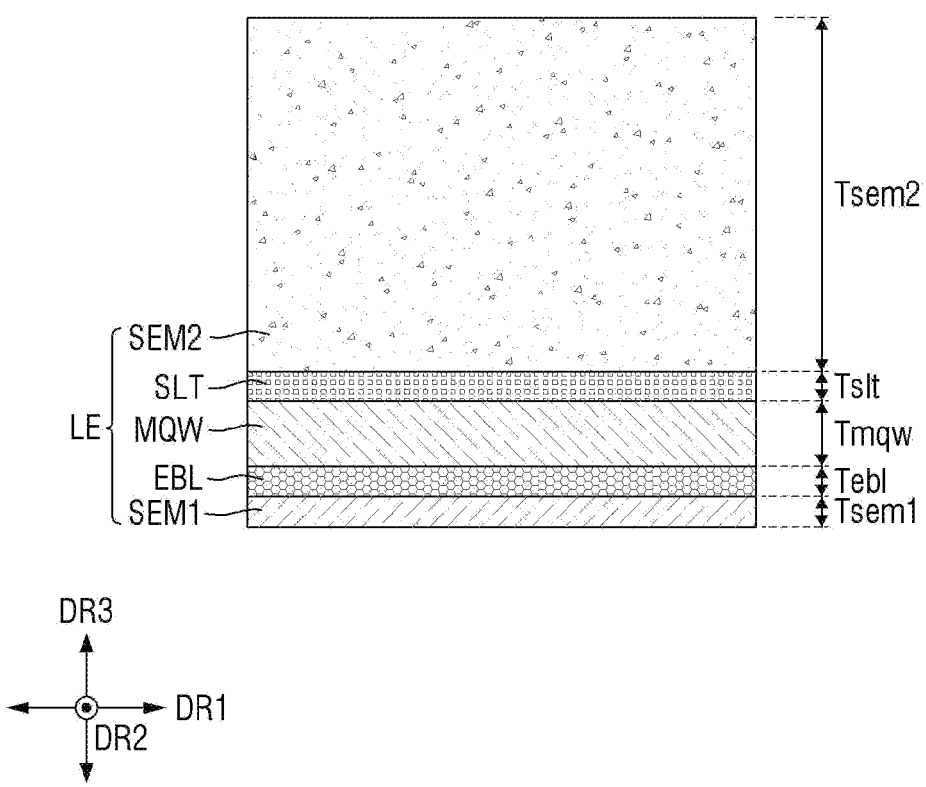
FIG. 7 is an enlarged cross-sectional view illustrating an example of light emitting element of FIG. 5.

FIG. 4 is a cross-sectional view illustrating an example of a display panel taken along the line A-A' of FIG. 2. FIG. 5 is a cross-sectional view illustrating an example of a display panel taken along the line B-B' of FIG. 3. FIG. 6 is an enlarged cross-sectional view illustrating a light emitting element, a wavelength conversion layer, a selective transmission film, and a second color filter of the second light emission area of FIG. 5. FIG. 7 is an enlarged cross-sectional view illustrating an example of the light emitting element of FIG. 5.

Referring to FIGS. 4 to 7, the display panel 100 may include a semiconductor circuit board 110 and a light emitting element layer 120.

The semiconductor circuit board 110 may include a first substrate SUB1, a plurality of pixel circuit areas PXC, pixel electrodes 111, first pads PD1, first common connection electrodes CCE1 of common connection electrodes CCE, and a first insulating film INS1.

The first substrate SUB1 may be a silicon wafer substrate. The first substrate SUB1 may be made of single crystalline silicon.

Each of the plurality of pixel circuit areas PXC may be located on the first substrate SUB1. Each of the plurality of pixel circuit areas PXC may include a complementary metal-oxide-semiconductor (CMOS) circuit formed using a semiconductor process. Each of the plurality of pixel circuit areas PXC may include at least one transistor formed by the semiconductor process. Each of the plurality of pixel circuit areas PXC may further include at least one capacitor formed by the semiconductor process.

The plurality of pixel circuit areas PXC may be located in the display area DA. Each of the plurality of pixel circuit areas PXC may be connected to a corresponding pixel electrode 111. That is, the plurality of pixel circuit areas PXC and the plurality of pixel electrodes 111 may be connected to each other in a one-to-one correspondence. Each of the pixel circuit areas PXC may apply a pixel voltage or an anode voltage to the pixel electrode 111.

Each of the pixel electrodes 111 may be located on a corresponding pixel circuit area PXC. Each of the pixel electrodes 111 may be an exposed electrode exposed from the pixel circuit area PXC. That is, each of the pixel electrodes 111 may be protruded from an upper surface of the pixel circuit area PXC. Each of the pixel electrodes 111 may be integrally formed with the pixel circuit area PXC. Each of the pixel electrodes 111 may be supplied with a pixel voltage or an anode voltage from the pixel circuit area PXC. The pixel electrodes 111 may include aluminum (Al).

Each of the first pads PD1 and the first common connection electrodes CCE1 may be an exposed electrode exposed from the first substrate SUB1. The first pad PD1 and the first common connection electrode CCE1 may include the same material as the pixel electrodes 111. For example, the first pad PD1 and the first common connection electrode CCE1 may include aluminum (Al).

Because the second pads PD2 of the second pad area PDA2 may be substantially the same as the first pad PD1 described with reference to FIG. 4, their description will be omitted.

The first insulating film INS1 may be located on the first substrate SUB1 (e.g., at areas in which the pixel electrodes 111, the first pads PD1, and the first common connection electrodes CCE1 are not located). An upper surface of the first insulating film INS1, an upper surface of each of the pixel electrodes 111, an upper surface of each of the first pads PD1, and an upper surface of each of the first common connection electrodes CCE1 may be connected to, or adjacent to, one another to be substantially flat. Alternatively, the first insulating film INS1 may be located to cover the pixel electrodes 111, the first pads PD1, and the first common connection electrodes CCE1. In this case, at least a portion of each of the pixel electrodes 111, the first pads PD1, and the first common connection electrodes CCE1 may be exposed (e.g., not covered by the first insulating film INS1) through a contact hole passing through the first insulating film INS1. The first insulating film INS1 may be formed of an inorganic film, such as a silicon oxide film ($SiO_2$), an aluminum oxide film ($Al_2O_3$), or a hafnium oxide film ($HfO_x$).

The light emitting element layer 120 may include a plurality of light emission areas EA1, EA2, and EA3, and thus may be a layer that emits light. The light emitting element layer 120 may include connection electrodes 112, a pad connection electrode PDE, a second common connection electrode CCE2 of a common connection electrode CCE, light emitting elements LE, a second insulating film INS2, a common electrode CE, a wavelength conversion layer QDL, a selective transmission film RTF, a reflection film RF, and a plurality of color filters CF1, CF2, and CF3.

Each of the connection electrodes 112 may be located on a corresponding pixel electrode 111. That is, the connection electrodes 112 may be connected to the pixel electrodes 111 in one-to-one correspondence. The connection electrodes 112 may serve as a bonding metal to bond the pixel electrodes 111 with the light emitting elements LE in a fabricating process. For example, the connection electrodes 112 may include at least one of gold (Au), copper (Cu), aluminum (Al), or tin (Sn). Alternatively, the connection electrodes 112 may include a first layer including any one of gold (Au), copper (Cu), aluminum (Al), or tin (Sn), and a second layer including one of gold (Au), copper (Cu), aluminum (Al), or tin (Sn). In this case, the second layer may be located on the first layer.

The pad connection electrode PDE may be located on the first pad PD1, and the second common connection electrode CCE2 may be located on the first common connection electrode CCE1. The pad connection electrode PDE may be in contact with the upper surface of the first pad PD1, and the second common connection electrode CCE2 may be in contact with the upper surface of the first common connection electrode CCE1. The pad connection electrode PDE and the second common connection electrode CCE2 may include the same material as that of the connection electrodes 112. For example, each of the pad connection electrode PDE and the second common connection electrode CCE2 may include at least one of gold (Au), copper (Cu), aluminum (Al), or tin (Sn). When each of the connection electrodes 112 includes the first layer and the second layer, each of the pad connection electrode PDE and the second common connection electrode CCE2 may include the first layer and the second layer.

The pad connection electrode PDE may be connected to a pad CPD of the circuit board CB through a conductive connection member such as a wire WR. That is, the first pad PD1, the pad connection electrode PDE, the wire WR, and the pad CPD of the circuit board CB may be electrically connected to one another.

The semiconductor circuit board 110 and the circuit board CB may be located on a base substrate BSUB. The semiconductor circuit board 110 and the circuit board CB may be attached to an upper surface of the base substrate BSUB by an adhesive member, such as a pressure sensitive adhesive.

The circuit board CB may be a flexible printed circuit board (FPCB), a printed circuit board (PCB), a flexible printed circuit (FPC), or a flexible film such as a chip on film (COF).

Each of the light emitting elements LE may be located on the connection electrode 112. The light emitting element LE may be a vertical light emitting diode element extending in the third direction DR3. That is, a length of the light emitting element LE in the third direction DR3 may be longer than a length in a horizontal direction. The length in the horizontal direction may indicate a length in the first direction DR1 or a length in the second direction DR2. For example, the length of the light emitting element LE in the third direction DR3 may be about 1 µm to about 5 µm, approximately.

As shown in FIG. 7, the light emitting element LE may be a micro light emitting diode element or a nano light emitting diode. The light emitting element LE includes a first semiconductor layer SEM1, an electron blocking layer EBL, an active layer MQW, a superlattice layer SLT, and a second semiconductor layer SEM2 in the third direction DR3. The first semiconductor layer SEM1, the electron blocking layer EBL, the active layer MQW, the superlattice layer SLT, and the second semiconductor layer SEM2 may sequentially be deposited in the third direction DR3.

The first semiconductor layer SEM1 may be located on the connection electrode 112. The first semiconductor layer SEM1 may be doped with a first conductive type dopant, such as Mg, Zn, Ca, and Ba. For example, the first semiconductor layer 31 may be p-GaN doped with p-type Mg. A thickness Tsem1 of the first semiconductor layer 31 may be about 30 nm to about 200 nm, approximately.

The electron blocking layer EBL may be located on the first semiconductor layer SEM1. The electron blocking layer EBL may be a layer for suppressing or preventing too many electrons from flowing to the active layer MQW. For example, the electron blocking layer EBL may be p-AlGaN doped with p-type Mg. A thickness Tebl of the electron blocking layer EBL may be about 10 nm to about 50 nm, approximately. The electron blocking layer EBL may be omitted in some embodiments.

The active layer MQW may be located on the electron blocking layer EBL. The active layer MQW may emit light by combination of electron-hole pairs in accordance with an electrical signal applied through the first semiconductor layer SEM1 and the second semiconductor layer SEM2. The active layer MQW may emit first light having a main peak wavelength band ranging from about 450 nm to about 495 nm, that is, light of a blue wavelength band.

The active layer MQW may include a single or multiple quantum well structure material. When the active layer MQW includes a multiple quantum well structure material, a plurality of well layers and a plurality of barrier layers may alternately be deposited. In this case, the well layer may be formed of, but not limited to, InGaN, and the barrier layer may be formed of, but not limited to, GaN or AlGaN. A thickness of the well layer may be about 1 nm to about 4 nm, approximately, and a thickness of the barrier layer may be about 3 nm to about 10 nm, approximately.

Alternately, the active layer MQW may have a structure in which semiconductor materials having a large Band gap energy and semiconductor materials having a low Band gap energy are alternately deposited, and may include different Group III to Group V semiconductor materials depending on a wavelength band of light that is emitted. The light emitted from the active layer MQW might not be limited to the first light (light of a blue wavelength band), but may emit second light (light of a green wavelength band) or third light (light of red wavelength band) as the case may be.

The superlattice layer SLT may be located on the active layer MQW. The superlattice layer SLT may be a layer for mitigating stress between the second semiconductor layer SEM2 and the active layer MQW. For example, the superlattice layer SLT may be formed of InGaN or GaN. A thickness Tslt of the superlattice layer SLT may be about 50 nm to about 200 nm, approximately. The superlattice layer SLT may be omitted in other embodiments.

The second semiconductor layer SEM2 may be located on the superlattice layer SLT. The second semiconductor layer SEM2 may be doped with a second conductive type dopant such as Si, Ge, Se, and Sn. For example, the second semiconductor layer SEM2 may be n-GaN doped with n-type Si. A thickness Tsem2 of the second semiconductor layer SEM2 may be about 500 nm to about 1 µm, approximately.

The second insulating film INS2 may be located on sides of each of the light emitting elements LE. The second insulating film INS2 may not be located on an upper surface of each of the light emitting elements LE. In addition, the second insulating film INS2 may be located on sides of each of the pixel electrodes 111 and the connection electrodes 112. The second insulating film INS2 may be formed of an inorganic film such as a silicon oxide film ($SiO_2$), an aluminum oxide film ($Al_2O_3$), or a hafnium oxide film ($HfO_x$), but is not limited thereto.

The common electrode CE may be located on the upper surface of each of the light emitting elements LE, an upper surface of the first insulating film INS1, and an upper surface of the second insulating film INS2. The common electrode CE may be located to completely cover each of the light emitting elements LE.

The common electrode CE may include a transparent conductive material. For example, the common electrode CE may include a transparent conductive oxide (TCO), such as indium tin oxide (ITO) or indium zinc oxide (IZO).

The light transmitting layer TPL may be located on the common electrode CE in each of the first light emission areas EA1. The light transmitting layer TPL may overlap the light emitting element LE in the third direction DR3 in each of the first light emission areas EA1. The light transmitting layer TPL may be located to completely cover the light emitting element LE in each of the first light emission areas EA1.

The light transmitting layer TPL may include a light-transmissive organic material. For example, the light transmitting layer TPL may include an epoxy-based resin, an acrylic resin, a cardo-based resin, or an imide-based resin.

The wavelength conversion layer QDL may be located on the common electrode CE in each of the second light emission areas EA2 and the third light emission areas EA3. The wavelength conversion layer QDL may overlap the light emitting element LE in the third direction DR3 in each of the second light emission areas EA2 and the third light emission areas EA3. The wavelength conversion layer QDL may be located to completely cover the light emitting elements LE in each of the second light emission areas EA2 and the third light emission areas EA3.

The wavelength conversion layer QDL may include a first base resin BRS1 and first wavelength conversion particles WCP1. The first base resin BRS1 may include a light-transmissive organic material. For example, the first base resin BRS1 may include an epoxy-based resin, an acrylic resin, a cardo-based resin, or an imide-based resin.

The first wavelength conversion particles WCP1 may convert the first light emitted from the light emitting element LE into the fourth light. For example, the first wavelength conversion particles WCP1 may convert the light of the blue wavelength band into light of a yellow wavelength band. The first wavelength conversion particles WCP1 may be quantum dots (QD), quantum rods, fluorescent materials, or phosphorescent materials. The quantum dots may include group IV nanocrystal, group II-VI compound nanocrystal, group III-V compound nanocrystal, group IV-VI nanocrystal, or their combination.

The quantum dots may include a core and a shell that overcoats the core. For example, the core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, or Ge. The shell may include, but is not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, or PbTe.

The wavelength conversion layer QDL may further include a scatterer for scattering the light of the light emitting element LE in a random direction. In this case, the scatterer may include metal oxide particles or organic particles. For example, the metal oxide may be titanium oxide ($TiO_2$), zirconium oxide ($ZrO_2$), silicon dioxide ($SiO_2$), aluminum oxide ($Al_2O_3$), indium oxide ($In_2O_3$), zinc oxide (ZnO), or tin oxide ($SnO_2$). In addition, the organic particles may include an acrylic resin or a urethane-based resin. A diameter of the scatterer may be several nanometers to several tens of nanometers.

The selective transmission film RTF may be located on sides of the light transmitting layer TPL in each of the first light emission areas EA1, whereas the selective transmission film RTF may be located on an upper surface and sides of the wavelength conversion layer QDL in each of the second light emission areas EA2 and the third light emission areas EA3. The selective transmission film RTF may be located to completely cover the wavelength conversion layer QDL in each of the second light emission areas EA2 and the third light emission areas EA3. The selective transmission film RTF may be located on the common electrode CE located on the first insulating film INS1.

As shown in FIG. 6, the selective transmission film RTF reflects the first light LT1 that is not converted by the first wavelength conversion particles WCP1 of the wavelength conversion layer QDL among the first light LT1 emitted from the light emitting element LE in each of the second light emission areas EA2 and the third light emission areas EA3, and transmits the fourth light LT4 converted by the first wavelength conversion particles WCP1. Because the first light LT1 reflected by the selective transmission film RTF re-enters the wavelength conversion layer QDL, the first light LT1 may be converted into the fourth light LT4 by the first wavelength conversion particles WCP1 of the wavelength conversion layer QDL. Also, because the fourth light LT4 is a mixture of the second light LT2 and the third light LT3, the second light LT2 may transmit through the second color filter CF2. Therefore, due to the selective transmission film RTF, efficiency of the first light LT1 emitted from the light emitting element LE and converted into the fourth light LT4 by the first wavelength conversion particles WCP1 of the wavelength conversion layer QDL may be enhanced.

The selective transmission film RTF may be a distributed Bragg reflector, and a detailed description of the selective transmission film RTF will be described later with reference to FIGS. 8 and 9.

The reflection film RF may be located on portions of the selective transmission film RTF located on the sides of the light transmitting layer TPL and the sides of the wavelength conversion layer QDL. The reflection film RF may be located on the common electrode CE located on the first insulating film INS1. The reflection film RF serves to reflect the light moving to upper and lower sides, and to left and right sides not in an upper direction among the light emitted from the light emitting element LE. The reflection film RF may include a metal material having high reflectance, such as aluminum (Al). A thickness of the reflection film RF may be about 0.1 μm, approximately.

The plurality of color filters CF1, CF2, and CF3 may include first color filters CF1, second color filters CF2, and third color filters CF3.

The first color filters CF1 may be located on the light transmitting layer TPL in the first light emission areas EA1. Each of the first color filters CF1 may transmit the first light, and absorb or block the second light and the third light. For example, each of the first color filters CF1 may transmit light of the blue wavelength band, and may absorb or block light of the green and red wavelength bands. Therefore, each of the first color filters CF1 may transmit the first light emitted from the light emitting element LE. That is, the first light emitted from the light emitting element LE in the first light emission area EA1 is not converted by a separate wavelength conversion layer, and may transmit through the first color filter CF1 and through the light transmitting layer TPL. Therefore, each of the first light emission areas EA1 may emit the first light.

Each of the second color filters CF2 may be located on the wavelength conversion layer QDL in the second light emission area EA2. Each of the second color filters CF2 may transmit the second light, and may absorb or block the first light and the third light. For example, each of the second color filters CF2 may transmit the light of the green wavelength band, and may absorb or block the light of the blue and red wavelength bands. Therefore, each of the second color filters CF2 may absorb or block the first light that is not converted by the wavelength conversion layer QDL among the first light emitted from the light emitting element LE. In addition, each of the second color filters CF2 may transmit the second light corresponding to the green wavelength band among the fourth light converted by the wavelength conversion layer QDL, and may absorb or block the third light corresponding to the blue wavelength band. Therefore, each of the second light emission areas EA2 may emit the second light.

Each of the third color filters CF3 may be located on the wavelength conversion layer QDL in the third light emission area EA3. Each of the third color filters CF3 may transmit the third light, and may absorb or block the first light and the second light. For example, each of the third color filters CF3 may transmit the light of the red wavelength band, and may absorb or block the light of the blue and green wavelength bands. Therefore, each of the third color filters CF3 may absorb or block the first light that is not converted by the wavelength conversion layer QDL among the first light emitted from the light emitting element LE. In addition, each of the third color filters CF3 may transmit the third light corresponding to the red wavelength band among the fourth light converted by the wavelength conversion layer QDL, and may absorb or block the second light corresponding to the green wavelength band. Therefore, each of the third light emission areas EA3 may emit the third light.

A black matrix may be located among the plurality of color filters CF1, CF2, and CF3. For example, the black matrix may be located between adjacent ones of the first color filter CF1 and the second color filter CF2, between adjacent ones of the second color filter CF2 and the third color filter CF3, and between adjacent ones of the first color filter CF1 and the third color filter CF3. The black matrix may include inorganic black pigments or organic black pigments, such as carbon black.

In FIG. 5, to simplify the fabricating process, instead of the light transmitting layer TPL, the wavelength conversion layer QDL may be located in each of the first light emission areas EA1.

As shown in FIGS. 4 to 7, the light transmitting layer TPL is located on the upper surface and sides of the light emitting element LE in each of the first light emission areas EA1, and the wavelength conversion layer QDL is located on the upper surface and sides of the light emitting element LE in each of the second light emission areas EA2 and the third light emission area EA3. In addition, the reflection film RF is located on the sides of the light transmitting layer TPL in each of the first light emission areas EA1 and the sides of the wavelength conversion layer QDL in each of the second light emission areas EA2 and the third light emission areas EA3. Therefore, the light moving to upper and lower sides, and to left and right sides not in an upper direction, among the light emitted from the light emitting element LE may be reflected by the reflection film RF. Therefore, even though a separate partition is not located between the light emitting elements LE of the light emission areas EA1, EA2, and EA3 adjacent to one another, mixture of the light emitted from the light emitting elements LE of the adjacent light emission areas EA1, EA2, and EA3 may be reduced or prevented.

Also, as shown in FIGS. 4 to 7, the selective transmission film RTF may reflect the first light that is not converted by the first wavelength conversion particles WCP1 of the wavelength conversion layer QDL among the first light LT1 emitted from the light emitting element LE in each of the second light emission areas EA2 and the third light emission area EA3, and may transmit the fourth light converted by the first wavelength conversion particles WCP1. Because the first light reflected by the selective transmission film RTF re-enters the wavelength conversion layer QDL, the first light may be converted into the fourth light by the first wavelength conversion particles WCP1 of the wavelength conversion layer QDL. Therefore, due to the selective transmission film RTF, efficiency of the first light emitted from the light emitting element LE and converted into the fourth light by the first wavelength conversion particles WCP1 of the wavelength conversion layer QDL may be enhanced.

Figure 8:
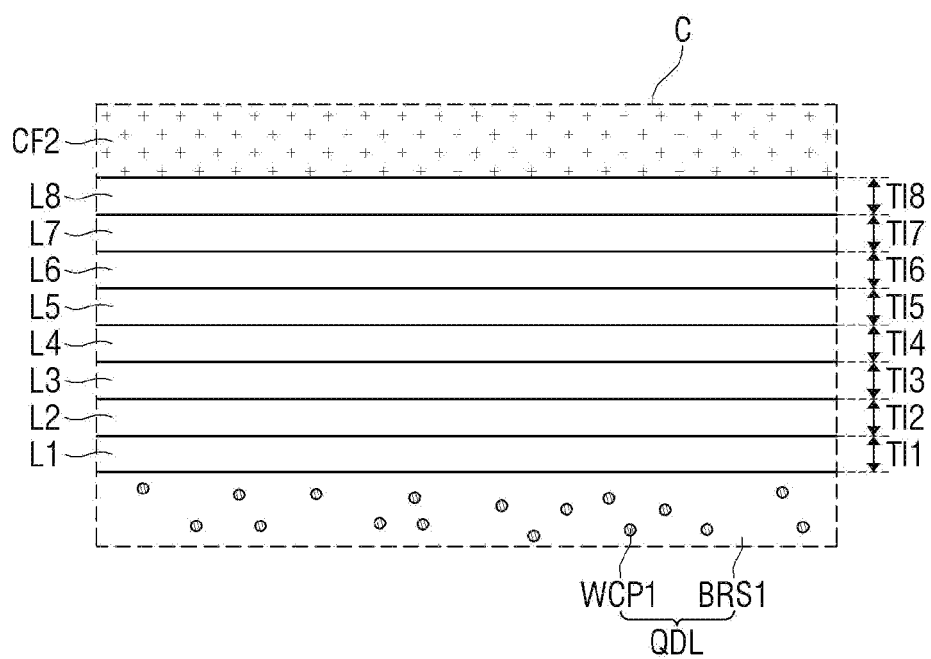
FIG. 8 is an enlarged cross-sectional view illustrating an example of the selective transmission film of FIG. 6.
Figure 9:
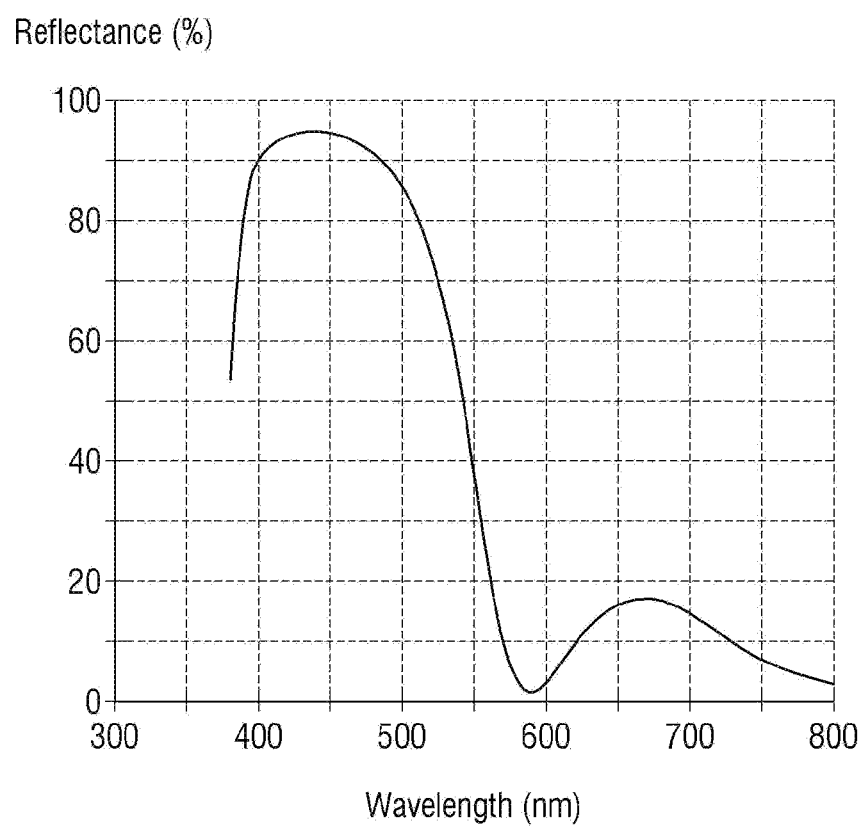
FIG. 9 is a graph illustrating a reflective wavelength band of the selective transmission film of FIG. 8.

FIG. 8 is an enlarged cross-sectional view illustrating an example of the selective transmission film of FIG. 6, and FIG. 9 is a graph illustrating a reflective wavelength band of the selective transmission film of FIG. 8. An enlarged cross-sectional view of an area C of FIG. 6 is shown in FIG. 8.

Referring to FIGS. 8 and 9, the selective transmission film RTF may include a plurality of layers to serve as a distributed Bragg reflector. The plurality of layers may include first to eighth layers L1, L2, L3, L4, L5, L6, L7, and L8.

Among the first to eighth layers L1, L2, L3, L4, L5, L6, L7, and L8, a refractive index of each of the odd layers (odd numbered layers), that is, the first layer L1, the third layer L3, the fifth layer L5, and the seventh layer L7 may be higher than that of each of the even layers (even numbered layers), that is, the second layer L2, the fourth layer L4, the sixth layer L6 and the eighth layer L8. In summary, the first layer L1, the third layer L3, the fifth layer L5 and the seventh layer L7 may be high refractive layers, and the second layer L2, the fourth layer L4, the sixth layer L6 and the eighth layer L8 may be low refractive layers. The selective transmission film RTF may have a structure in which high refractive layers and low refractive layers are alternately located. For example, the low refractive layer may be a silicon oxide ($SiO_2$) film having a refractive index of about 1.46488, approximately, and the high refractive layer may be a titanium oxide film ($TiO_2$) having a refractive index of about 2.40695, approximately.

The wavelength band in which the light entering the selective transmission film RTF is reflected may be set by adjusting thicknesses of the first to eighth layers L1, L2, L3, L4, L5, L6, L7, and L8. For example, when a thickness TI1 of the first layer L1, a thickness TI2 of the second layer L2, a thickness TI3 of the third layer L3, a thickness TI4 of the fourth layer L4, a thickness TI5 of the fifth layer L5, a thickness TI6 of the sixth layer L6, a thickness TI7 of the seventh layer L7, and a thickness TI8 of the eighth layer L8 are set as listed in Table 1, 90% or more of the light of the wavelength band approximately ranging from about 400 nm to about 500 nm may be reflected as shown in FIG. 9.

TABLE 1

| | |
|---|---|
| Thickness TI1 of the first layer L1 | 49.49 nm |
| Thickness TI2 of the second layer L2 | 63.38 nm |
| Thickness TI3 of the third layer L3 | 62.74 nm |
| Thickness TI4 of the fourth layer L4 | 63.38 nm |
| Thickness TI5 of the fifth layer L5 | 60.44 nm |
| Thickness TI6 of the sixth layer L6 | 63.33 nm |
| Thickness TI7 of the seventh layer L7 | 50.86 nm |
| Thickness TI8 of the eighth layer L8 | 49.56 nm |

Therefore, most of the first light that is not converted by the first wavelength conversion particles WCP1 of the wavelength conversion layer QDL among the first light LT1 emitted from the light emitting element LE may be reflected by the selective transmission film RTF. In addition, most of the fourth light converted by the first wavelength conversion particles WCP1 of the wavelength conversion layer QDL among the first light LT1 emitted from the light emitting element LE may transmit through the selective transmission film RTF without being reflected by the selective transmission film RTF. Therefore, due to the selective transmission film RTF, efficiency of the first light emitted from the light emitting element LE and converted into the fourth light by the first wavelength conversion particles WCP1 of the wavelength conversion layer QDL may be enhanced.

Figure 10A:
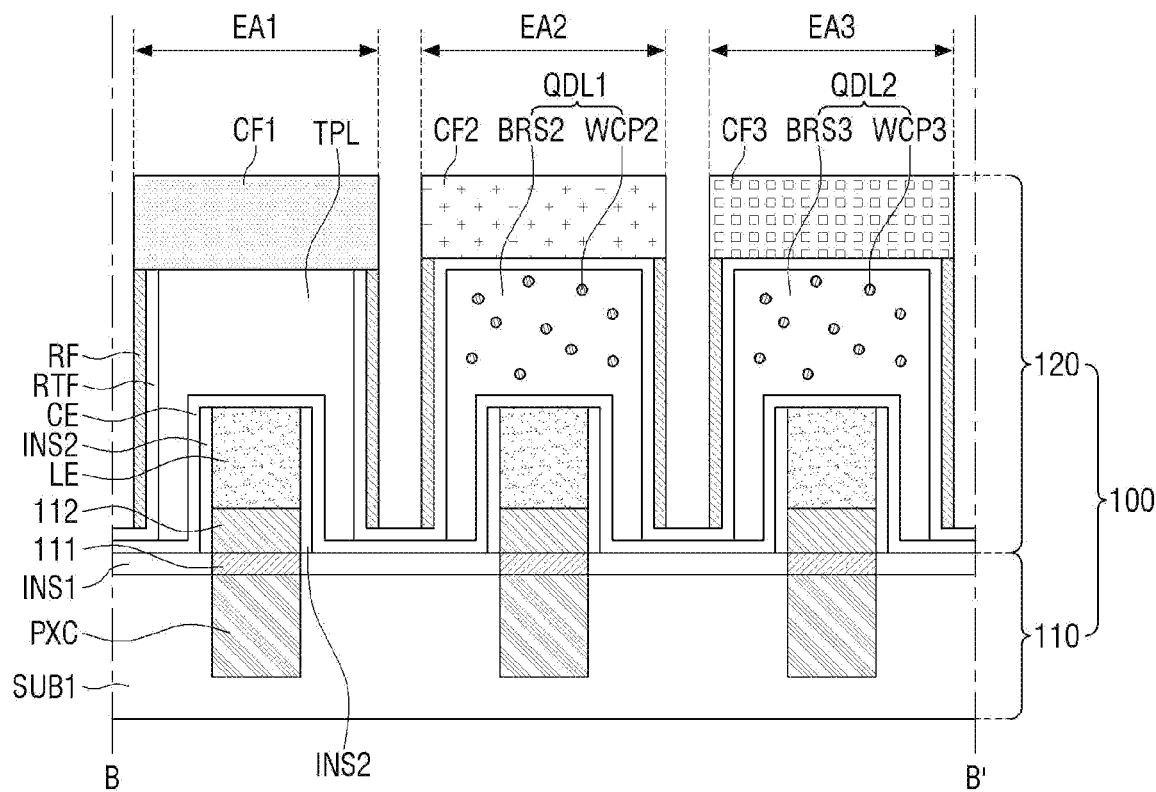
FIG. 10A is a cross-sectional view illustrating another example of a display panel taken along the line B-B' of FIG. 3.
Figure 10A:
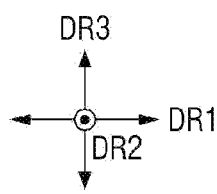

FIG. 10A is a cross-sectional view illustrating another example of a display panel taken along the line B-B' of FIG. 3. The embodiments of FIG. 10A are different from the embodiments of FIG. 5 in that a first wavelength conversion layer QDL1 is located in each of the second light emission areas EA2, and a second wavelength conversion layer QDL2 is located in each of the third light emission areas EA3. In FIG. 10A, description previously described with respect to the embodiments of FIG. 5 will be omitted.

Referring to FIG. 10A, the first wavelength conversion layer QDL1 may be located on the common electrode CE in each of the second light emission areas EA2. The first wavelength conversion layer QDL1 may overlap with the light emitting element LE in the third direction DR3 in each of the second light emission areas EA2. The first wavelength conversion layer QDL1 may be located to completely cover the light emitting element LE in each of the second light emission areas EA2.

The first wavelength conversion layer QDL1 may include a second base resin BRS2 and second wavelength conversion particles WCP2. The second base resin BRS2 may be substantially the same as the first base resin BRS1. The second base resin BRS2 may include an epoxy-based resin, an acrylic resin, a cardo-based resin, or an imide-based resin. The second wavelength conversion particles WCP2 may convert the first light emitted from the light emitting element LE into the second light. For example, the second wavelength conversion particles WCP2 may convert the light of the blue wavelength band into the light of the green wavelength band.

The second wavelength conversion layer QDL2 may be located on the common electrode CE in each of the third light emission areas EA3. The second wavelength conversion layer QDL2 may overlap the light emitting element LE in the third direction DR3 in each of the third light emission areas EA3. The second wavelength conversion layer QDL2 may be located to completely cover the light emitting element LE in each of the third light emission areas EA3.

The second wavelength conversion layer QDL2 may include a third base resin BRS3 and third wavelength conversion particles WCP3. The third base resin BRS3 may be substantially the same as the first base resin BRS1. The third base resin BRS3 may include an epoxy-based resin, an acrylic resin, a cardo-based resin, or an imide-based resin. The third wavelength conversion particles WCP3 may convert the first light emitted from the light emitting element LE into the third light. For example, the third wavelength conversion particles WCP3 may convert the light of the blue wavelength band into the light of the red wavelength band.

The second light converted by the second wavelength conversion particles WCP2 of the first wavelength conversion layer QDL1 among the first light emitted from the light emitting element LE in the second light emission area EA2 may transmit through the second color filter CF2. The first light that is not converted by the first wavelength conversion layer QDL1 among the first light emitted from the light emitting element LE in the second light emission area EA2 may be absorbed or blocked by the second color filter CF2. Therefore, the second light emission area EA2 may emit the second light.

The third light converted by the second wavelength conversion layer QDL2 among the first light emitted from the light emitting element LE in the third light emission area EA3 may transmit through the third color filter CF3. The first light that is not converted by the second wavelength conversion layer QDL2 among the first light emitted from the light emitting element LE in the third light emission area EA3 may be absorbed or blocked by the third color filter CF3. Therefore, the third light emission area EA3 may emit the third light.

Figure 10B:
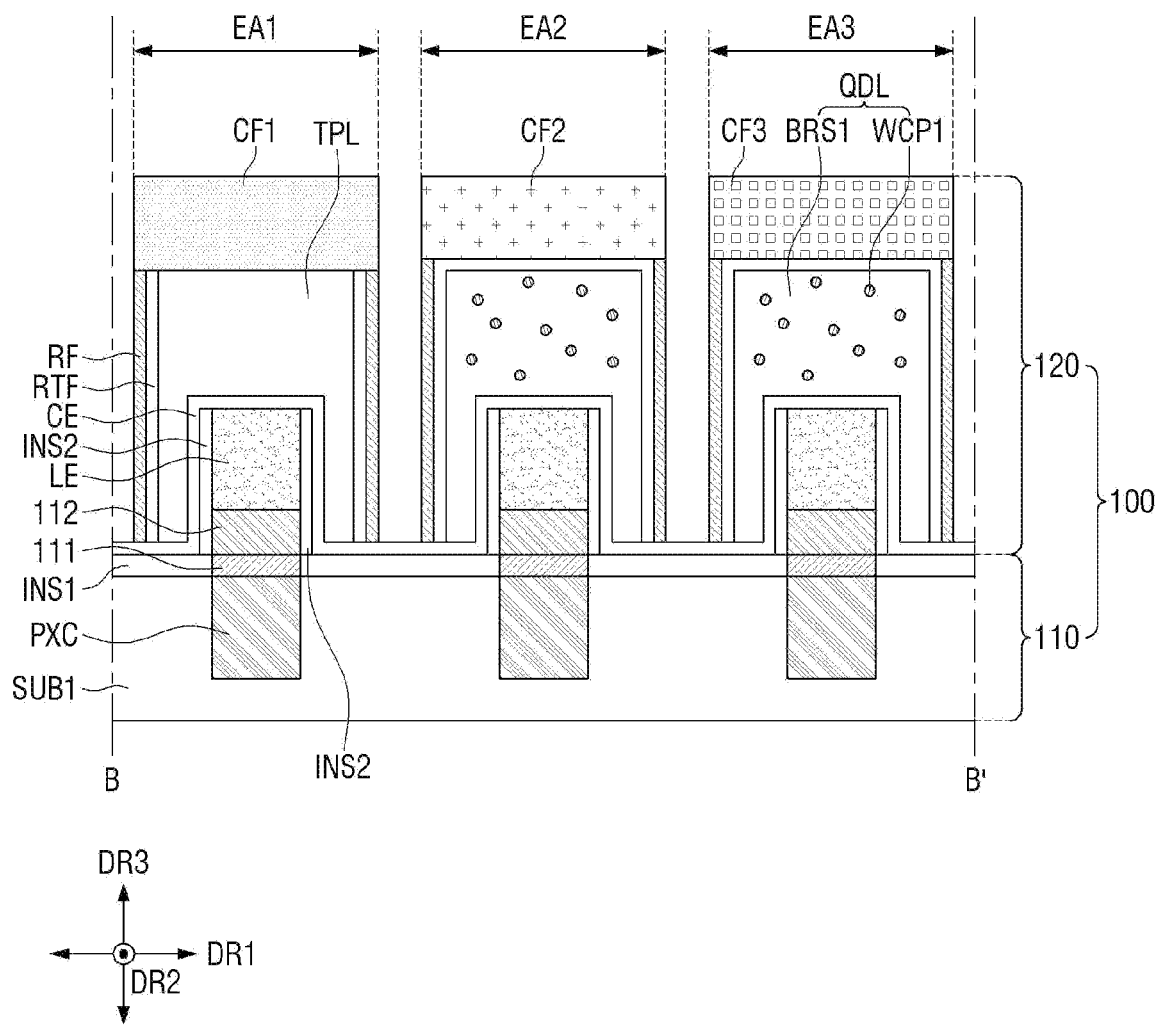
FIG. 10B is a cross-sectional view illustrating still another example of a display panel taken along the line B-B' of FIG. 3.

FIG. 10B is a cross-sectional view illustrating still another example of a display panel taken along the line B-B' of FIG. 3.

The embodiments of FIG. 10B are different from the embodiments of FIG. 5 in that the selective transmission film RTF is not located between adjacent light emission areas. In FIG. 10B, description previously described with respect to the embodiments of FIG. 5 will be omitted.

Referring to FIG. 10B, the selective transmission film RTF might not be located on the common electrode CE between adjacent ones of the first light emission area EA1 and the second light emission area EA2, between adjacent ones of the second light emission area EA2 and the third light emission area EA3, or between adjacent ones of the first light emission area EA1 and the third light emission area EA3. Therefore, the light emitted from the light emitting element LE of the first light emission area EA1 may be prevented from moving to the second light emission area EA2 (or reduced) through the selective transmission film RTF, or the light emitted from the light emitting element LE of the second light emission area EA2 may be prevented from moving to the first light emission area EA1 (or reduced) through the selective transmission film RTF. In addition, the light emitted from the light emitting element LE of the second light emission area EA2 may be prevented from moving to the third light emission area EA3 (or reduced) through the selective transmission film RTF, or the light emitted from the light emitting element LE of the third light emission area EA3 may be prevented from moving to the second light emission area EA2 (or reduced) through the selective transmission film RTF. In addition, the light emitted from the light emitting element LE of the first light emission area EA1 may be prevented from moving to the third light emission area EA3 through the selective transmission film RTF, or the light emitted from the light emitting element LE of the third light emission area EA3 may be prevented from moving to the first light emission area EA1 (or reduced) through the selective transmission film RTF. That is, the selective transmission film RTF may be prevented from serving as an optical waveguide between the adjacent light emission areas.

Figure 10C:
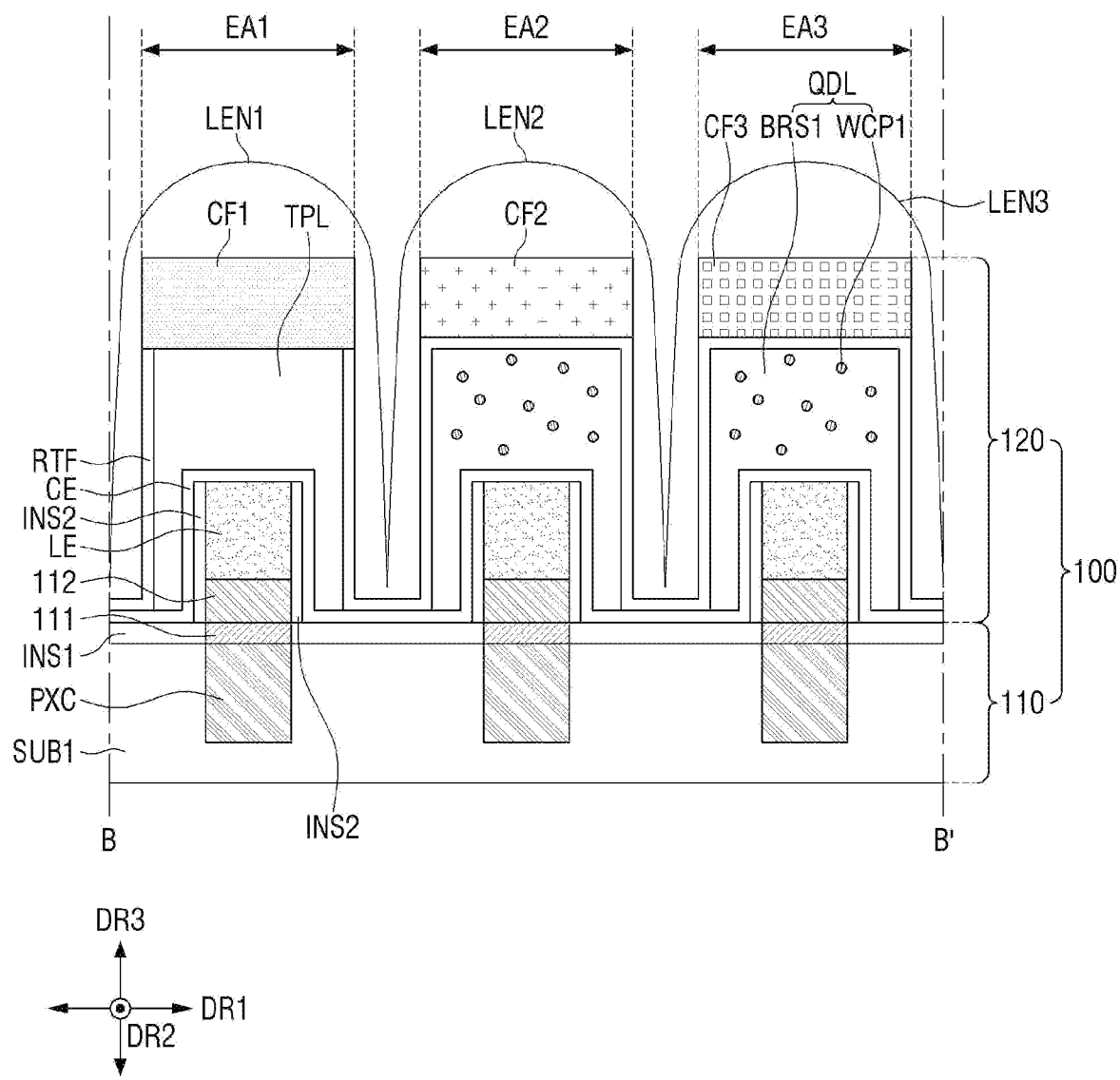
FIG. 10C is a cross-sectional view illustrating further still another example of a display panel taken along the line B-B' of FIG. 3.

FIG. 10C is a cross-sectional view illustrating further still another example of a display panel taken along the line B-B' of FIG. 3.

The embodiments of FIG. 10C are different from the embodiments of FIG. 5 in that the reflection film RF is eliminated, a first lens pattern LEN1 covering the light transmitting layer TPL and the first color filter CF1 is added in the first light emission area EA1, a second lens pattern LEN2 covering the wavelength conversion layer QDL and the second color filter CF2 is added in the second light emission area EA2, and a third lens pattern LEN3 covering the wavelength conversion layer QDL and the third color filter CF2 is added in the third light emission area EA3. In FIG. 10C, description previously described with respect to the embodiments of FIG. 5 will be omitted.

Referring to FIG. 10C, each of the first lens pattern LEN1, the second lens pattern LEN2, and the third lens pattern LEN3 may have a convex cross-sectional shape in the upper direction. The refractive index of each of the first lens pattern LEN1, the second lens pattern LEN2, and the third lens pattern LEN3 may be substantially the same as that of the eighth layer L8 of the selective transmission film RTF shown in FIG. 8. Alternatively, a difference between the refractive index of each of the first lens pattern LEN1, the second lens pattern LEN2, and the third lens pattern LEN3 and the refractive index of the eighth layer L8 of the selective transmission film RTF shown in FIG. 8 may be about 0.1 or less. Each of the first lens pattern LEN1, the second lens pattern LEN2, and the third lens pattern LEN3 may include an organic material. For example, the light transmitting layer TPL may include an epoxy-based resin, an acrylic resin, a cardo-based resin, or an imide-based resin.

The light moving to the side of the light transmitting layer TPL among the light emitted from the light emitting element LE in the first light emission area EA1 may be refracted at an interface between the first lens pattern LEN1 and the air, and may move in the upper direction. In addition, the light moving to the side of the wavelength conversion layer QDL among the light emitted from the light emitting element LE in the second light emission area EA2 may be refracted at an interface between the second lens pattern LEN2 and the air, and may move in the upper direction. Furthermore, the light moving to the side of the wavelength conversion layer QDL among the light emitted from the light emitting element LE in the third light emission area EA3 may be refracted at an interface of the third lens pattern LEN3 and the air and move in the upper direction. Therefore, even though the reflection film RF is eliminated, mixture of the light between the adjacent light emission areas may be reduced or prevented by the first lens pattern LEN1, the second lens pattern LEN2, and the third lens pattern LEN3.

Figure 11:
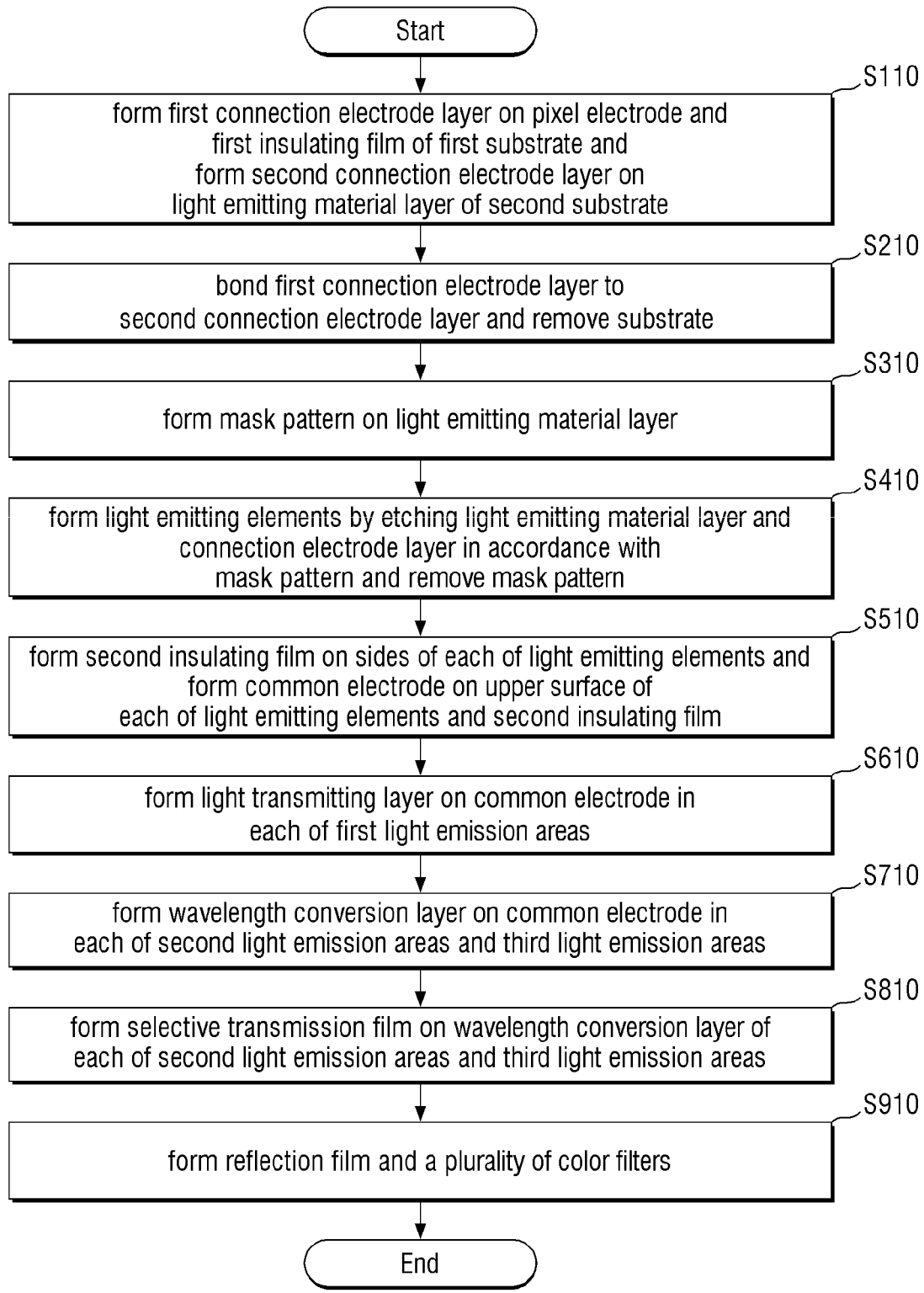
FIG. 11 is a flow chart illustrating a method for fabricating a display device according to some embodiments of the present disclosure.

FIG. 11 is a flow chart illustrating a method for fabricating a display device according to some embodiments of the present disclosure. FIGS. 12 to 20 are cross-sectional views illustrating a method for fabricating a display device according to some embodiments of the present disclosure. In FIGS. 12 to 20, cross-sectional views of a display panel taken along the line B-B' of FIG. 3 are shown. Hereinafter, a method for fabricating a display panel according to some embodiments of the present disclosure will be described in detail with reference to FIGS. 11 to 20.

Figure 12:
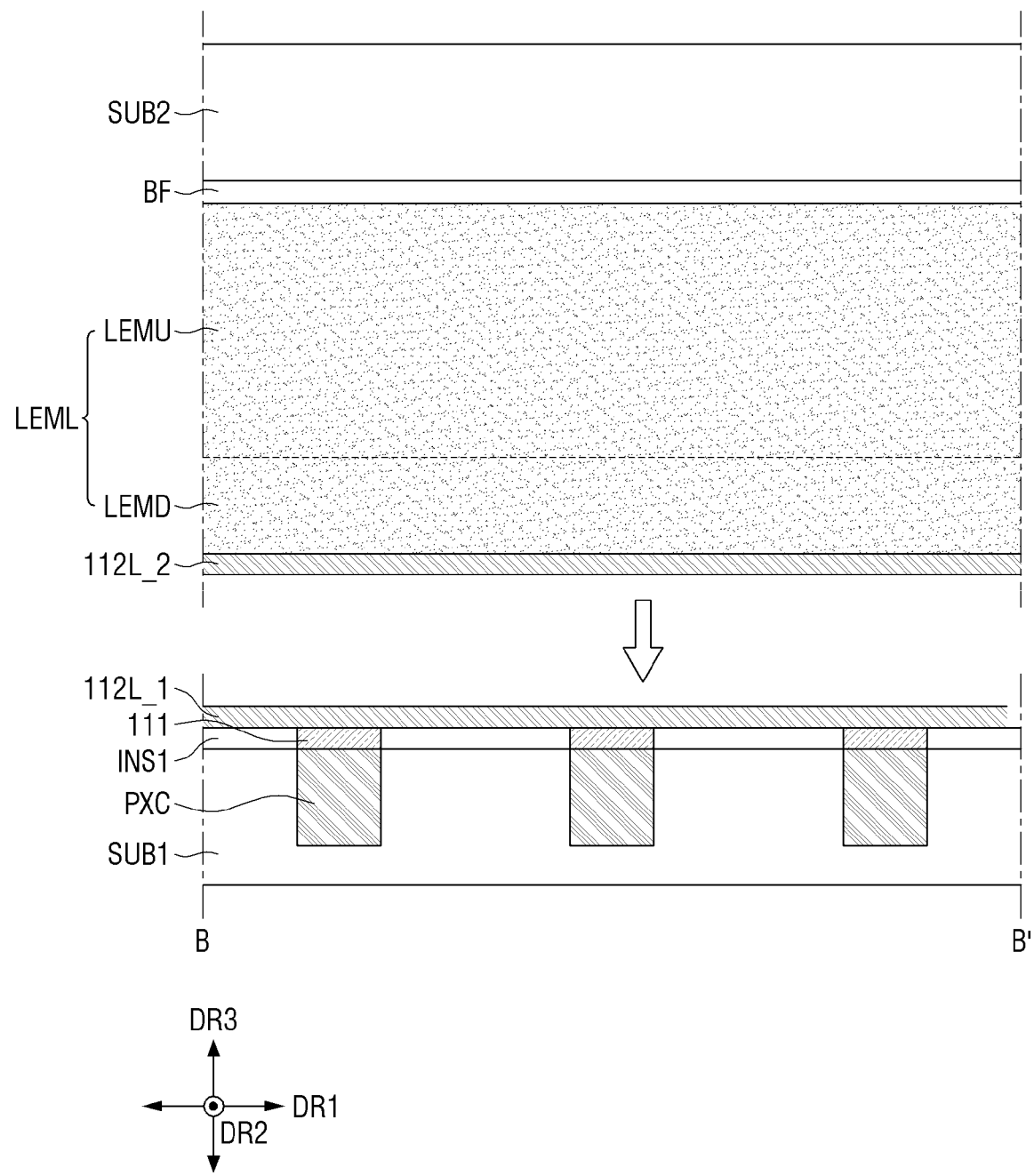
FIGS. 12 to 20 are cross-sectional views illustrating a method for fabricating a display device according to some embodiments of the present disclosure.

First, as shown in FIG. 12, a first connection electrode layer 112L_1 is formed on, or at a layer above, the pixel electrodes 111 and/or the first insulating film INS1 of the first substrate SUB1, and a second connection electrode layer 112L_2 is formed on a light emitting material layer LEML of the second substrate SUB2 (S110 of FIG. 11).

The first insulating film INS1 is formed on the first substrate SUB1 in which the pixel electrodes 111, the first pads PD1, and the first common connection electrodes CCE1 are not located. The upper surface of the first insulating film INS1, the upper surface of each of the pixel electrodes 111, the upper surface of each of the first pads PD1, and the upper surface of each of the first common connection electrodes CCE1 may be connected to one another, or adjacent to each other, to be substantially flat. That is, a height difference between the upper surface of the first substrate SUB1 and the upper surface of the pixel electrode 111 may be reduced or substantially eliminated by the first insulating film INS1. The first insulating film INS1 may be formed of an inorganic film such as a silicon oxide film ($SiO_2$), an aluminum oxide film ($Al_2O_3$), or a hafnium oxide film ($HfO_x$).

Then, the first connection electrode layer 112L_1 is deposited on the pixel electrodes 111 and the first insulating film INS1. The first connection electrode layer 112L_1 may include gold (Au), copper (Cu), aluminum (Al), or tin (Sn).

A buffer film BF may be formed on one surface of the second substrate SUB2. The second substrate SUB2 may be a silicon substrate or a sapphire substrate. The buffer film BF may be formed of an inorganic film, such as a silicon oxide film ($SiO_2$), an aluminum oxide film ($Al_2O_3$), or a hafnium oxide film ($HfO_x$).

The light emitting material layer LEML may be located on the buffer film BF. The light emitting material layer LEML may include a first semiconductor material layer LEMD and a second semiconductor material layer LEMU. The second semiconductor material layer LEMU may be located on the buffer film BF, and the first semiconductor material layer LEMD may be located on the second semiconductor material layer LEMU. A thickness of the second semiconductor material layer LEMU may be greater than that of the first semiconductor material layer LEMD.

Similarly to the light emitting element LE shown in FIG. 7, the first semiconductor material layer LEMD may include a first semiconductor layer SEM1, an electron blocking layer EBL, an active layer MQW, a superlattice layer SLT, and a second semiconductor layer SEM2. The second semiconductor material layer LEMU may be a semiconductor layer that is not doped with a dopant, that is, an undoped semiconductor layer. For example, the second semiconductor material layer LEMU may be undoped-GaN that is not doped with a dopant.

The second connection electrode layer 112L_2 may be deposited on the first semiconductor material layer LEMD. The second connection electrode layer 112L_2 may include gold (Au), copper (Cu), aluminum (Al) or tin (Sn).

Figure 13:
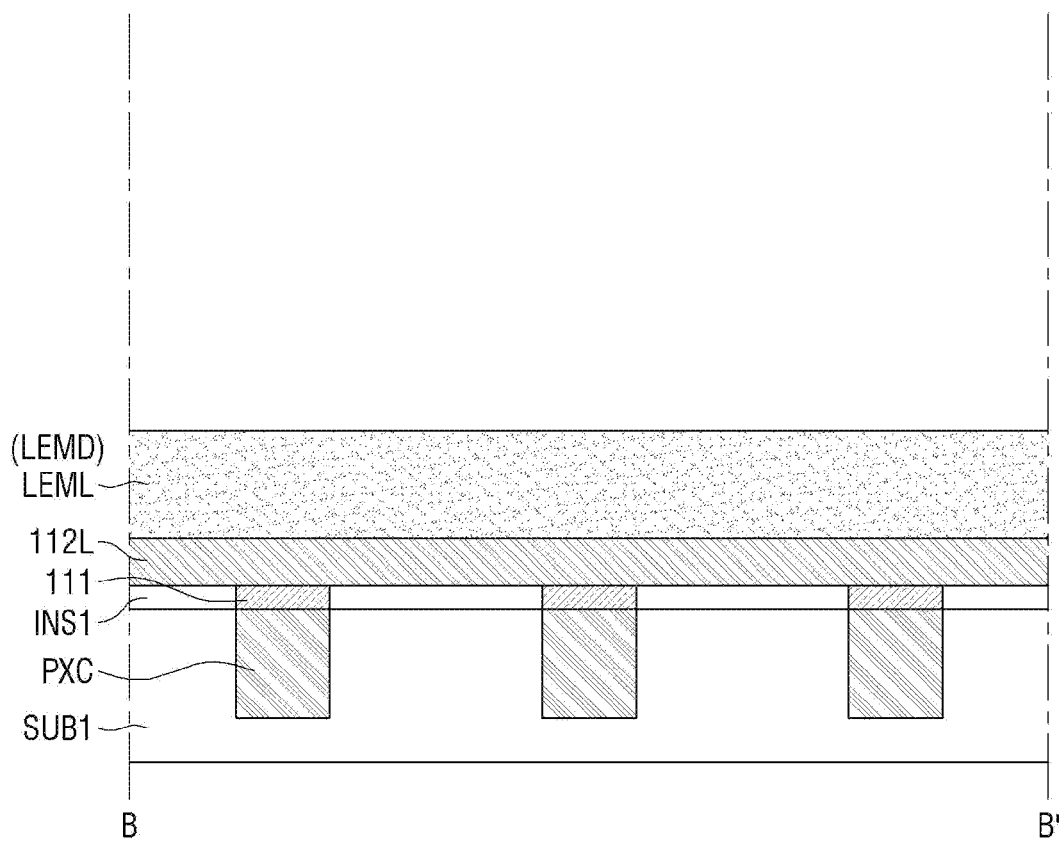

Second, as shown in FIG. 13, the first connection electrode layer 112L_1 and the second connection electrode layer 112L_2 are adhered to each other, and the second substrate SUB2 is removed (S210 of FIG. 11).

The first connection electrode layer 112L_1 of the first substrate SUB1 and the second connection electrode layer 112L_2 of the second substrate SUB2 are brought into contact with each other. Then, the first connection electrode layer 112L_1 and the second connection electrode layer 112L_2 are subjected to melt bonding at a corresponding temperature (e.g., a predetermined temperature) to form one connection electrode layer 112L. That is, the connection electrode layer 112L is located between the pixel electrodes 111 of the first substrate SUB1 and the light emitting material layer LEML of the second substrate SUB2, and serves as a bonding metal layer for bonding the pixel electrodes 111 of the first substrate SUB1 to the light emitting material layer LEML of the second substrate SUB2.

Then, the second substrate SUB2 and the buffer film BF may be removed through a polishing process, such as a chemical mechanical polishing (CMP) process, and/or an etching process. In addition, the second semiconductor material layer LEMU of the light emitting material layer LEML may be removed through the polishing process, such as the CMP process.

Figure 14:
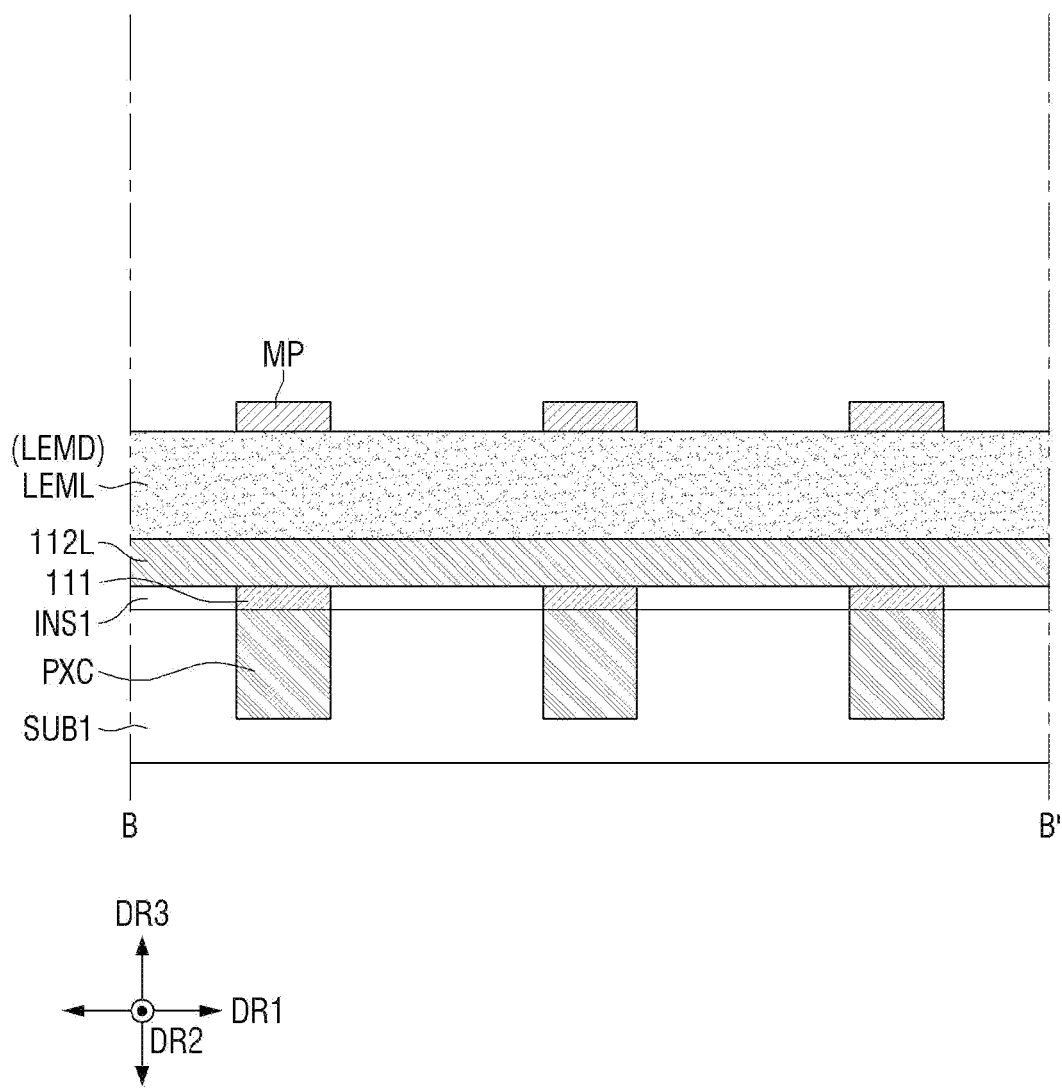

Third, as shown in FIG. 14, a mask pattern MP is formed on the light emitting material layer LEML (S310 of FIG. 11).

A mask pattern MP is formed on the upper surface of the light emitting material layer LEML. The upper surface of the light emitting material layer LEML may be an upper surface of a first light emitting material layer LEMD exposed by removing the second substrate SUB2, the buffer film BF, and the second light emitting material layer LEMU. The mask pattern MP may be located in an area where the light emitting element LE is to be formed. As a result, the mask pattern MP may overlap the pixel electrode 111 in the third direction DR3. The mask pattern MP may include a conductive material such as nickel (Ni). A thickness of the mask pattern MP may be about 0.01 μm to about 1 μm, approximately.

Figure 15:
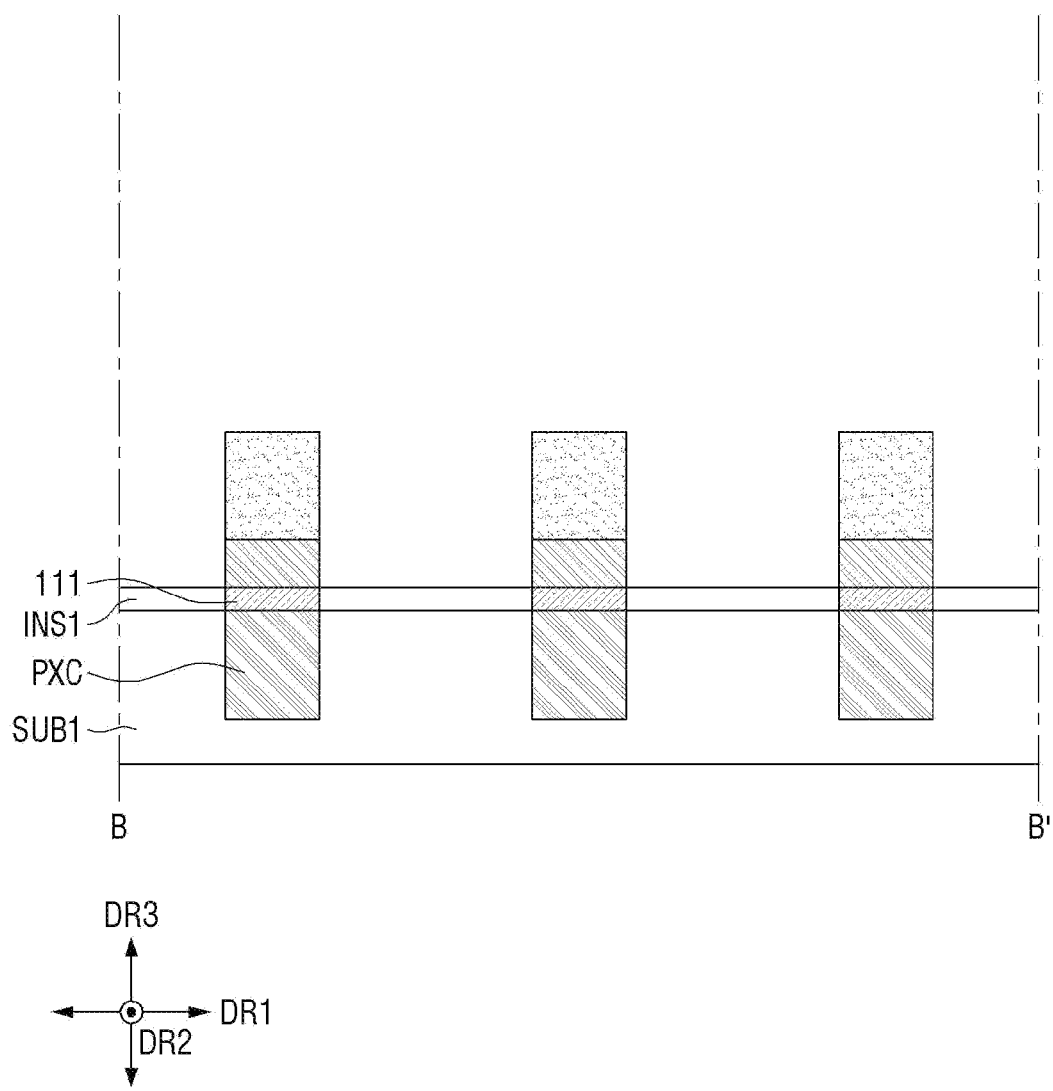

Fourth, as shown in FIG. 15, the light emitting material layer LEML and the connection electrode layer 112L are etched in accordance with the mask pattern MP to form the light emitting elements LE, and the mask pattern MP is removed (S410 of FIG. 11).

The mask pattern MP might not be etched by a first etching material for etching the light emitting material layer LEML, or by a second etching material for etching the connection electrode layer 112L and a first insulating film INS1. For this reason, the light emitting material layer LEML and the connection electrode layer 112L of the area where the mask pattern MP is located might not be etched. Therefore, the connection electrode 112 and the light emitting element LE may be formed on the upper surface of each of the pixel electrodes 111. The mask pattern MP is then removed.

Figure 16:
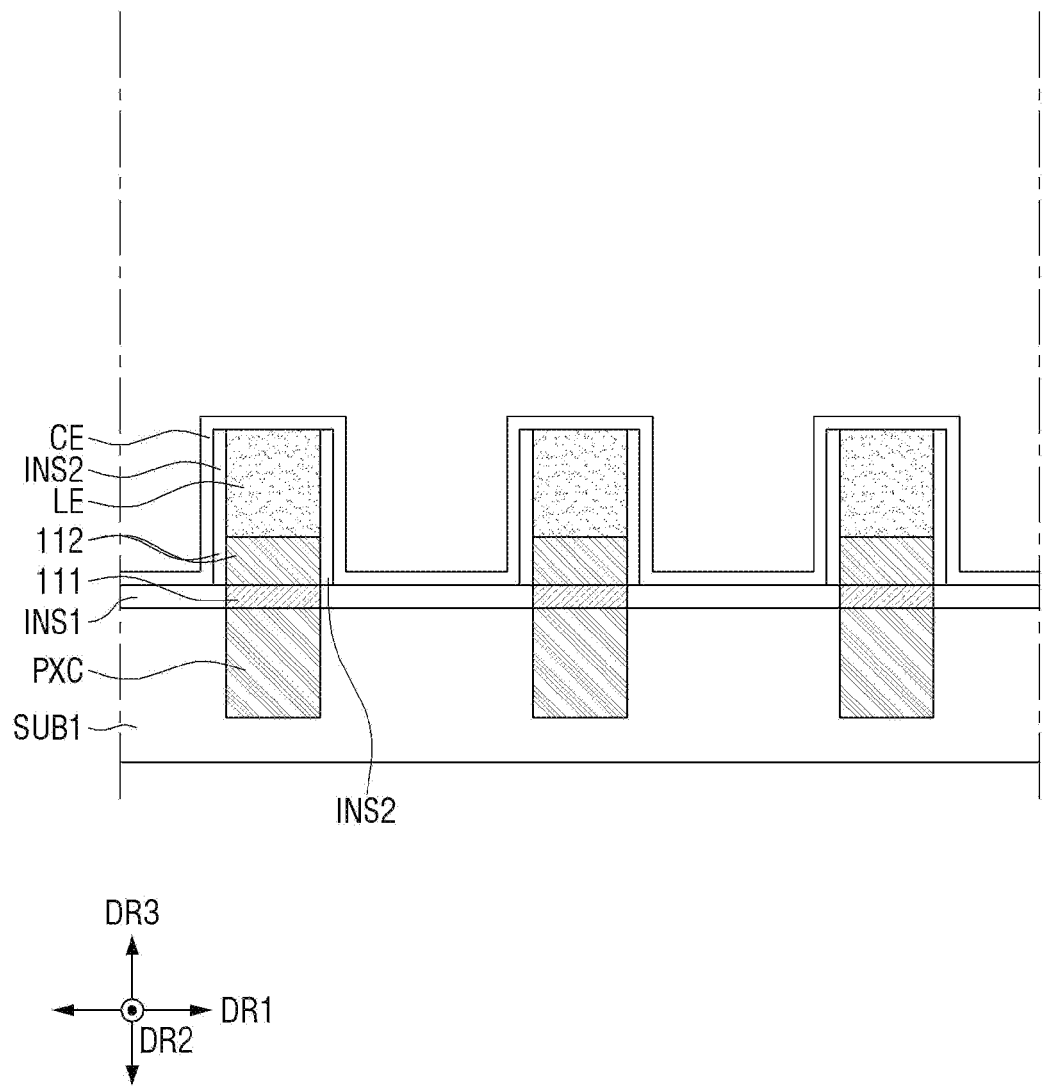

Fifth, as shown in FIG. 16, the second insulating film INS2 is formed on the sides of each of the light emitting elements LE, and the common electrode CE is formed on the upper surface of each of the light emitting elements LE and the second insulating film INS2 (S510 of FIG. 11)

A second insulating film layer is deposited on the upper surface and sides of each of the light emitting elements LE.

The second insulating film layer may be located on the upper surface and sides of each of the light emitting elements LE, on the sides of the connection electrodes 112, and on the first insulating film INS1. The second insulating film layer may be formed of an inorganic film such as a silicon oxide film ($SiO_2$), an aluminum oxide film ($Al_2O_3$), or a hafnium oxide film ($HfO_x$).

A relatively large voltage difference is formed with respect to the third direction DR3 without a separate mask, and the second insulating film layer may be etched by the first etching material. In this case, the first etching material may etch the second insulating film layer while moving in the third direction DR3 (e.g., while moving from the top to the bottom). For this reason, the second insulating film layer located on a horizontal plane defined by the first direction DR1 and the second direction DR2 is removed, whereas the second insulating film layer located on a vertical plane defined by, or corresponding to, the third direction DR3 might not be removed. Therefore, the second insulating film layer located on the upper surface of each of the light emitting elements LE and located on the upper surface of the first insulating film INS1 may be removed. In contrast, the second insulating film layer located on the sides of each of the light emitting elements LE and located on the sides of the connection electrodes 112 might not be removed. Therefore, the second insulating film INS2 may be formed on the sides of each of the light emitting elements LE and on the sides of the connection electrodes 112.

Then, the common electrode CE is deposited on the upper surface of each of the light emitting elements LE and the second insulating film INS2. Also, as shown in FIG. 4, the common electrode CE may be located on the upper surface and the sides of the second common connection electrode CCE2 in the non-display area NDA. The common electrode CE may include a transparent conductive oxide (TCO) such as indium tin oxide (ITO) or indium zinc oxide (IZO).

Figure 17:
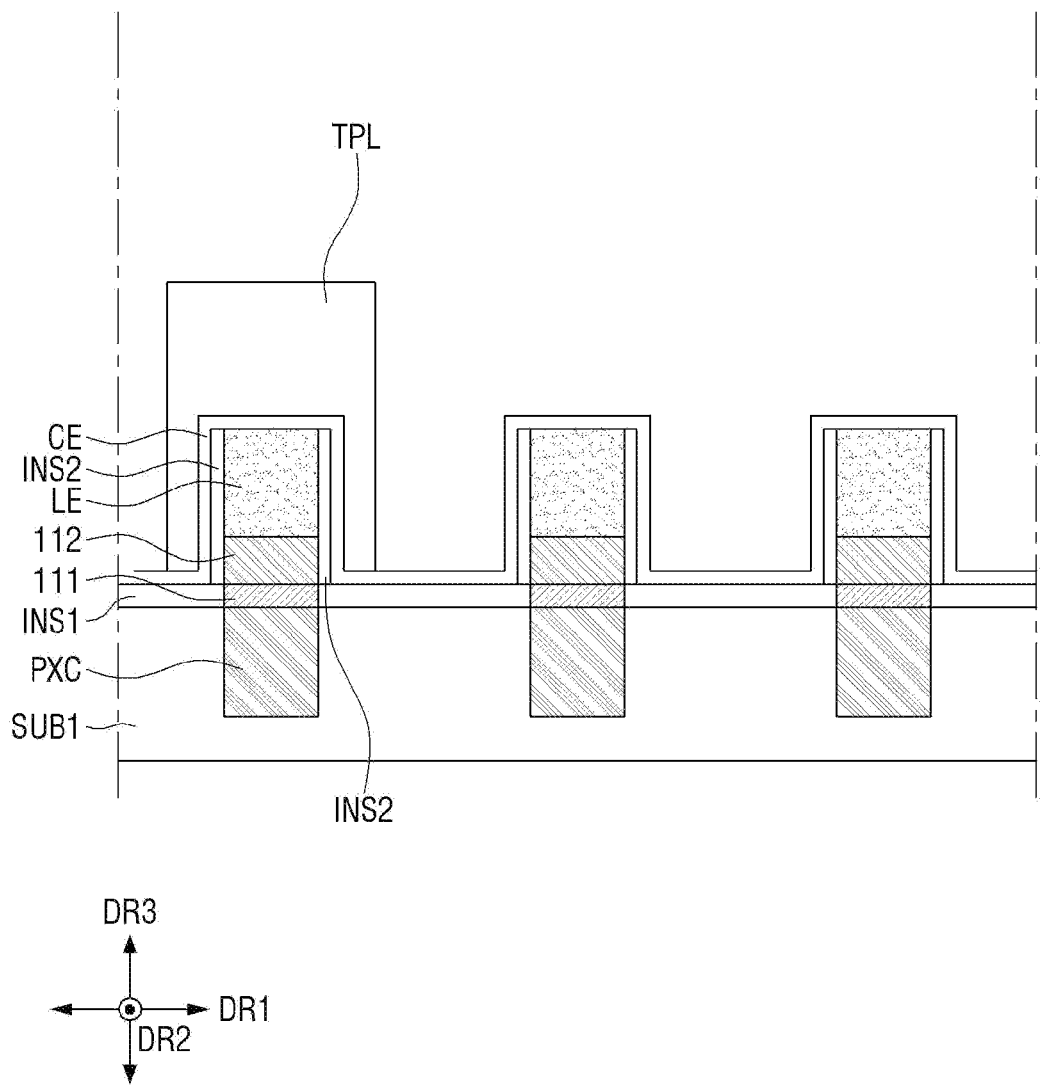

Sixth, as shown in FIG. 17, the light transmitting layer TPL is formed on the common electrode CE in each of the first light emission areas EA1 (S610 of FIG. 11)

The light transmitting layer TPL may be fully formed on the light emitting elements LE in the first light emission areas EA1, the second light emission areas EA2, and the third light emission areas EA3, and then patterned using a photolithography process. As the light emitting elements LE become thicker, the light transmitting layer TPL may be difficult to flow on the light emitting elements LE, whereby the light transmitting layer TPL may be difficult to be fully formed on the light emitting elements LE in the first light emission areas EA1, the second light emission areas EA2, and the third light emission areas EA3. To avoid such a scenario, the thickness of each of the light emitting elements LE may be about 1 μm or less, approximately. In this case, the thickness of the second semiconductor layer SEM2 of each of the light emitting elements LE may be about 500 nm to about 1 μm, approximately, but is not limited thereto. The light transmitting layer TPL may include an epoxy-based resin, an acrylic resin, a cardo-based resin, or an imide-based resin.

The light transmitting layer TPL may overlap the light emitting element LE in the third direction DR3 in each of the first light emission areas EA1. The light transmitting layer TPL may be located to completely cover the light emitting element LE in each of the first light emission areas EA1.

Figure 18:
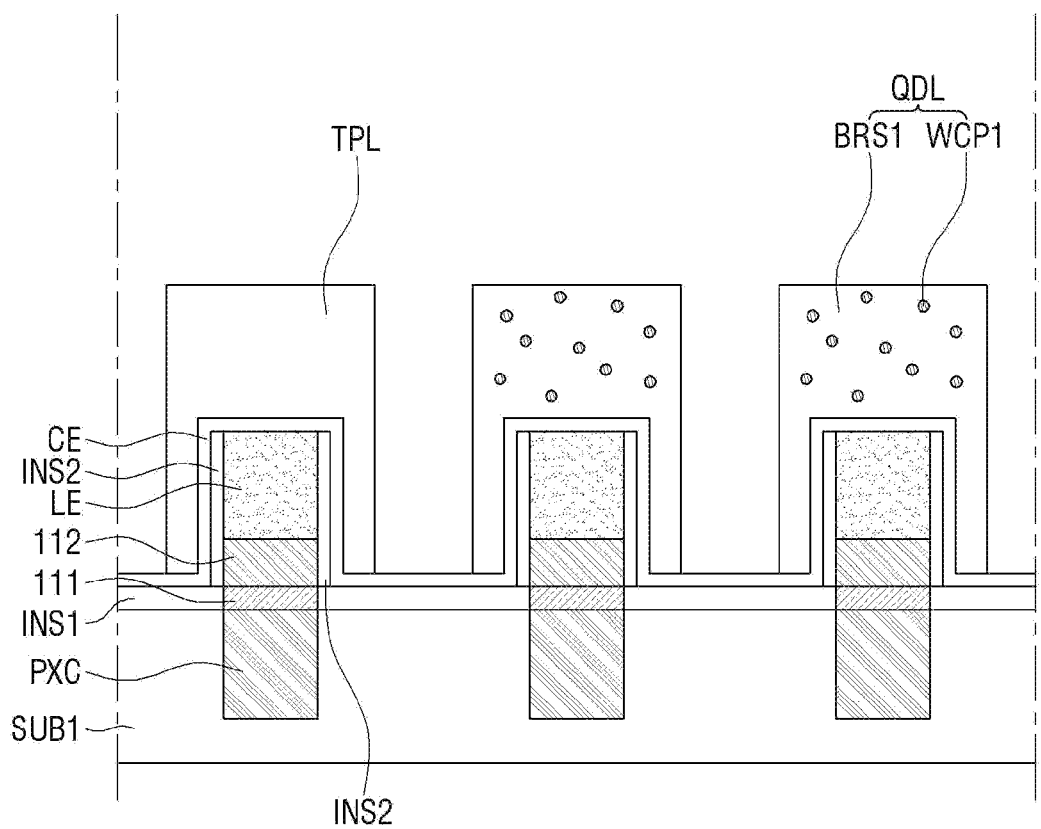

Seventh, as shown in FIG. 18, the wavelength conversion layer QDL is formed on the common electrode CE in each of the second light emission areas EA2 and the third light emission areas EA3 (S710 of FIG. 11).

The wavelength conversion layer QDL may be formed on the light emitting elements LE in the second light emission areas EA2 and the third light emission areas EA3, and then patterned using a photolithography process. As the light emitting elements LE become thicker, it may be difficult for the wavelength conversion layer QDL to flow, whereby it may be difficult for the wavelength conversion layer QDL to be fully formed on the light emitting elements LE in the first light emission areas EA1, the second light emission areas EA2, and the third light emission areas EA3. To avoid this situation, the thickness of each of the light emitting elements LE may be about 1 μm or less, approximately. In this case, the thickness of the second semiconductor layer SEM2 of each of the light emitting elements LE may be about 500 nm, approximately, but is not limited thereto.

The wavelength conversion layer QDL may include a first base resin BRS1 and first wavelength conversion particles WCP1. For example, the first base resin BRS1 may include an epoxy-based resin, an acrylic resin, a cardo-based resin, or an imide-based resin.

The wavelength conversion layer QDL may overlap the light emitting element LE in the third direction DR3 in each of the second light emission areas EA2 and the third light emission areas EA3. The wavelength conversion layer QDL may be located to completely cover the light emitting element LE in each of the second light emission areas EA2 and the third light emission areas EA3.

A process error of a width of a pattern formed by the photolithography process may be reduced as a thickness of the pattern formed by the photolithography process becomes thinner. When the light emitting element LE is a micro light emitting diode element or a nano light emitting diode element, an interval between the light emitting elements LE is very narrow within the range of about several μm. Therefore, to reduce the process error of the width of the pattern formed by the photolithography process, the thickness of the light transmitting layer TPL and the wavelength conversion layer QDL may be about 1 μm to about 2 μm, approximately.

Figure 19:
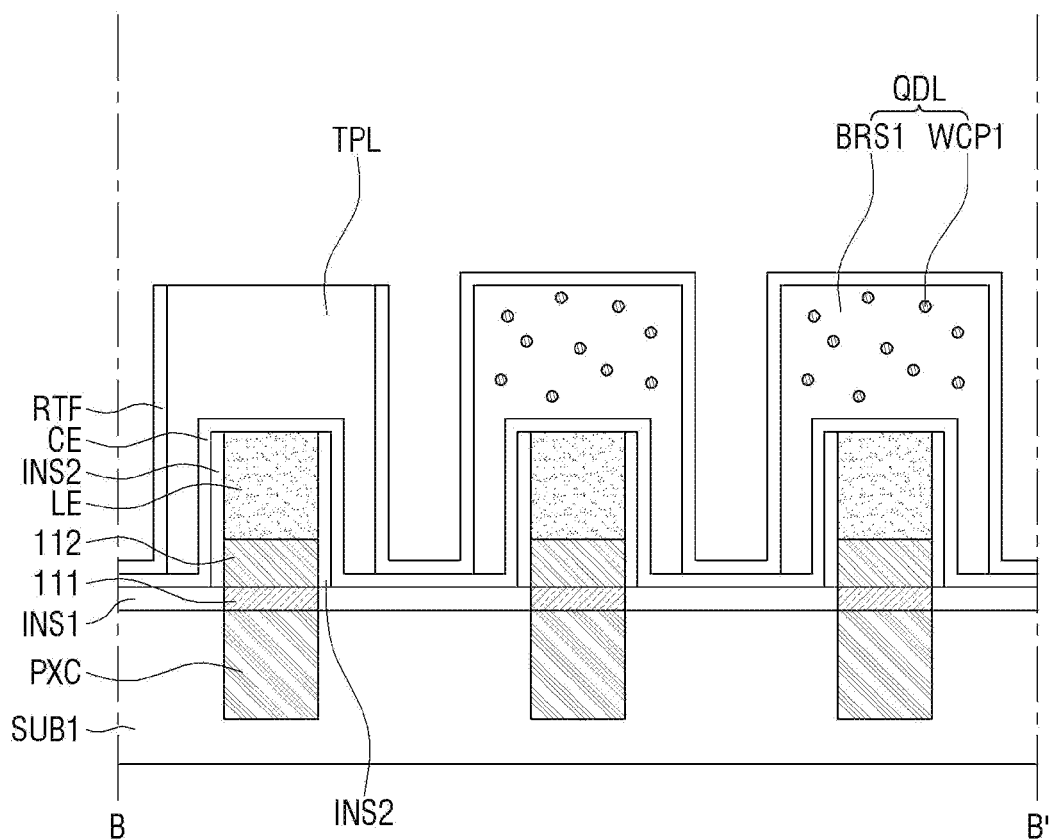
Figure 19:
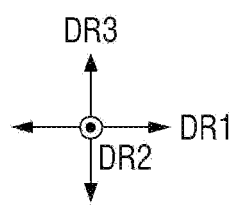

Eighth, as shown in FIG. 19, the selective transmission film RTF is formed on the wavelength conversion layer QDL in each of the second light emission areas EA2 and the third light emission areas EA3 (S810 of FIG. 11).

The selective transmission film RTF may be deposited on the upper surface and sides of the light transmitting layer TPL of each of the first light emission areas EA1, on the upper surface and on sides of the wavelength conversion layer QDL of each of the second light emission areas EA2 and the third light emission areas EA3, and on the common electrode CE (e.g., on portions of the common electrode CE).

Then, the mask pattern is formed to cover the selective transmission film TFT located on the sides of the light transmitting layer TPL of each of the first light emission areas EA1 and the upper surface and the sides of the wavelength conversion layer QDL of each of the second light emission areas EA2 and the third light emission areas EA3.

Then, the selective transmission film RTF located on the upper surface of the light transmitting layer TPL of each of the first light emission areas EA1, which is not covered by the mask pattern, may be removed.

Then, the mask pattern is removed.

Figure 20:
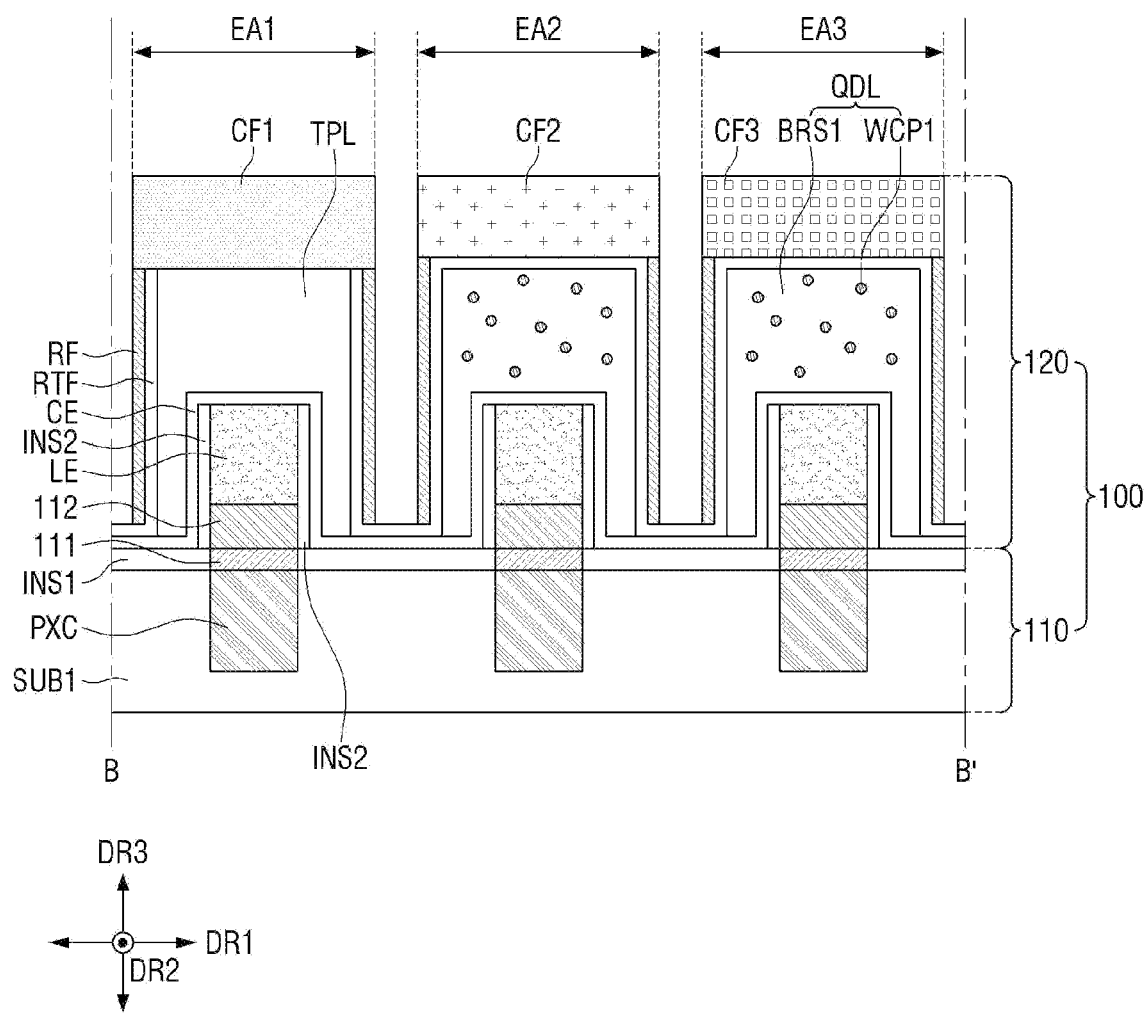

Ninth, as shown in FIG. 20, the reflection film RF and the plurality of color filters CF1, CF2, and CF3 are formed (S910 of FIG. 11).

A reflection layer is deposited to cover the upper surface of the light transmitting layer TPL of each of the first light emission areas EA1 and the selective transmission film RTF.

Then, a relatively large voltage difference is formed with respect to the third direction DR3 without a separate mask, and the reflection layer is etched by the second etching material. In this case, the second etching material may etch the reflection layer while moving in the third direction DR3 (e.g., while moving from the top to the bottom) under the control of a voltage. For this reason, the reflection layer located on a horizontal plane defined by the first direction DR1 and the second direction DR2 may be removed, whereas the reflection layer located on a vertical plane defined by the third direction DR3 might not be removed. Therefore, the reflection layer located on the upper surface of the light transmitting layer TPL and the upper surface of the wavelength conversion layer QDL may be removed. In contrast, the reflection layer located on the sides of the light transmitting layer TPL and the sides of the wavelength conversion layer QDL may not be removed. Therefore, the reflection film RF may be located on the selective transmission film RTF that is located on the sides of the light transmitting layer TPL and the sides of the wavelength conversion layer QDL.

The reflection film RF may include a metal material having high reflectance, such as aluminum (Al). A thickness of the reflection film RF may be about 0.1 µm, approximately.

Then, the first color filter CF1 may be formed on the light transmitting layer TPL in each of the first light emission areas EA1, the second color filter CF2 may be formed on the wavelength conversion layer QDL in each of the second light emission areas EA2, and the third color filter CF3 may be formed on the wavelength conversion layer QDL in each of the third light emission areas EA3.

Figure 21:
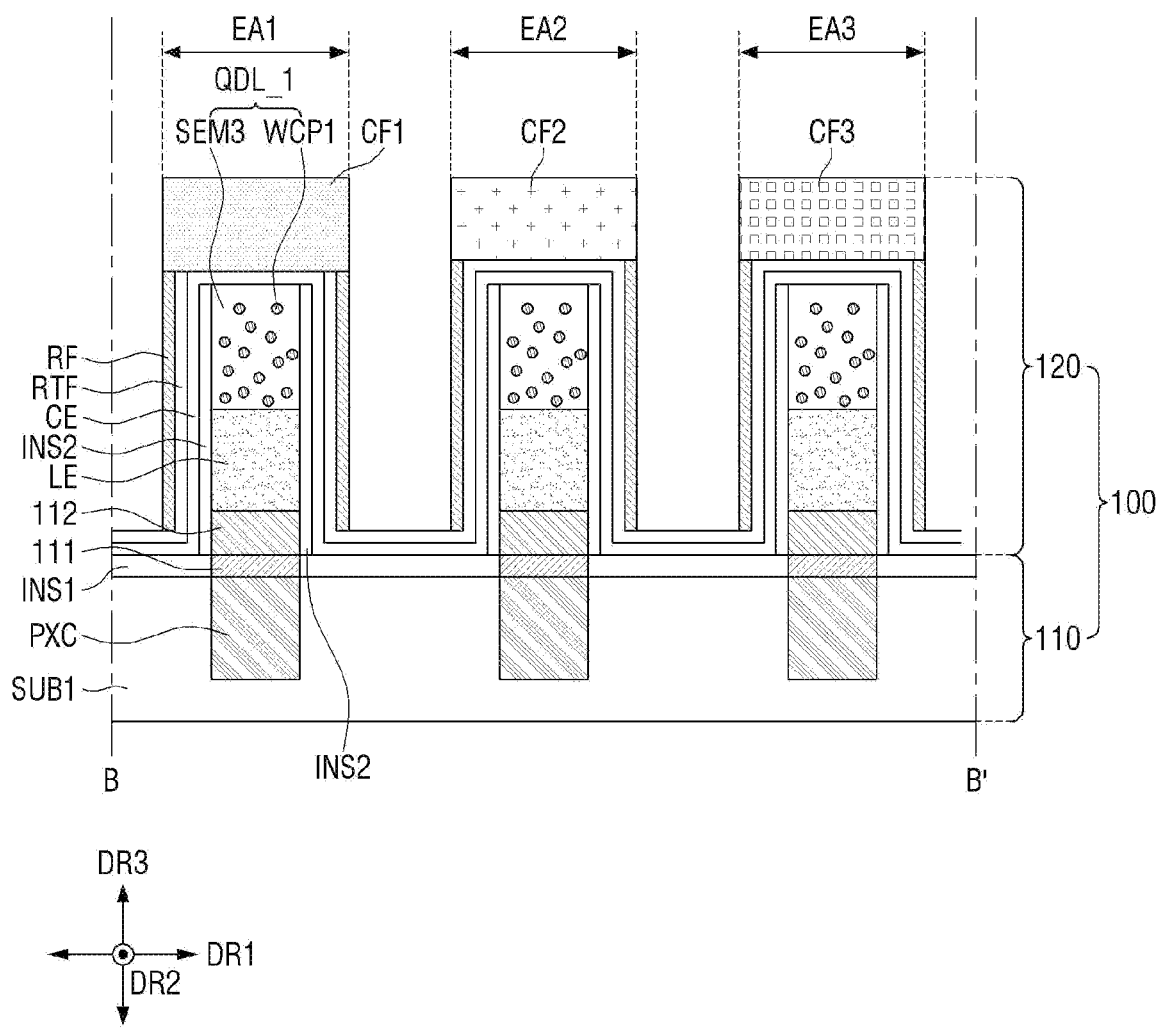
FIG. 21 is a cross-sectional view illustrating another example of a display panel taken along the line B-B' of FIG. 3.
Figure 22:
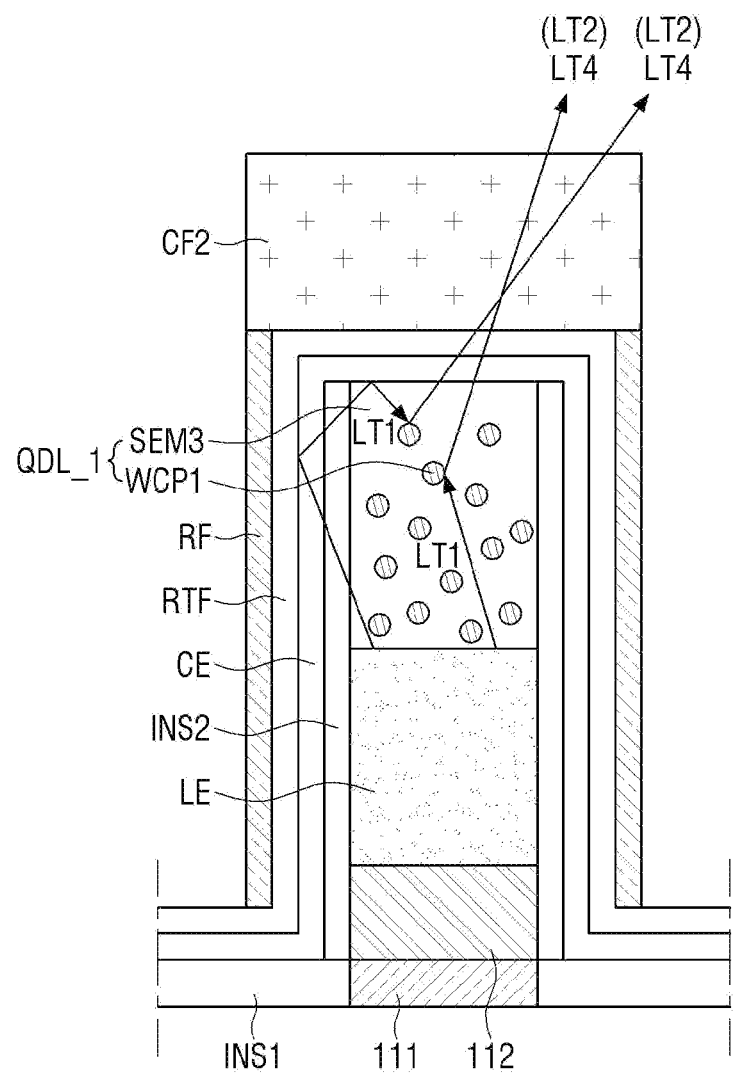
FIG. 22 is an enlarged cross-sectional view illustrating a light emitting element, a wavelength conversion layer, a selective transmission film, and a second color filter of a second light emission area of FIG. 21.
Figure 23:
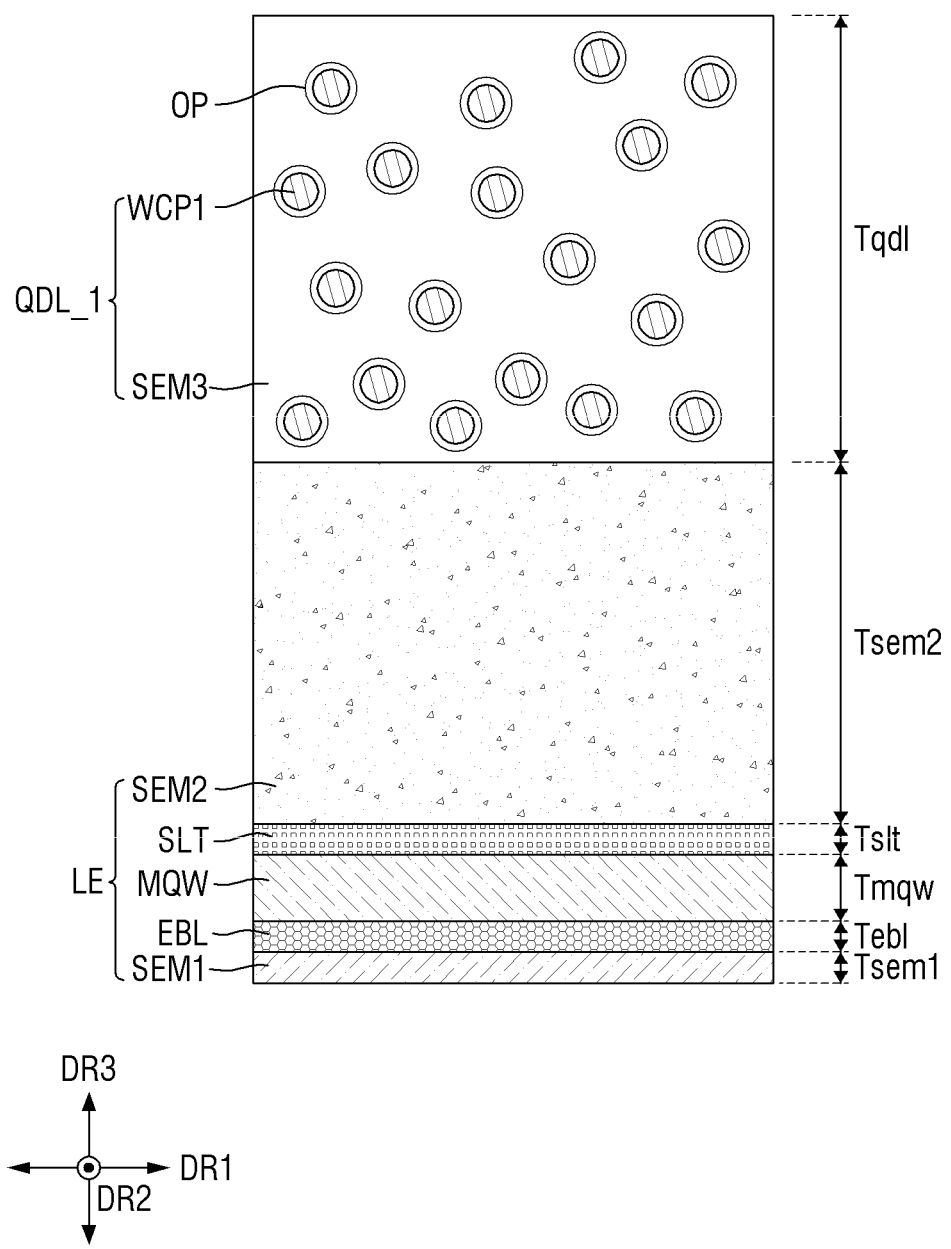
FIG. 23 is an enlarged cross-sectional view illustrating an example of the light emitting element and the wavelength conversion layer of FIG. 22.

FIG. 21 is a cross-sectional view illustrating another example of a display panel taken along the line B-B' of FIG. 3. FIG. 22 is an enlarged cross-sectional view illustrating a light emitting element, a wavelength conversion layer, a selective transmission film, and a second color filter of a second light emission area of FIG. 21. FIG. 23 is an enlarged cross-sectional view illustrating an example of the light emitting element and the wavelength conversion layer of FIG. 22.

The embodiments of FIGS. 21 to 23 are different from the embodiments of FIGS. 5 to 7 in that the wavelength conversion layer QDL includes a third semiconductor layer SEM3 instead of the first base resin BRS1. In FIGS. 21 to 23, description previously described with respect to that of FIGS. 5 to 7 will be omitted.

Referring to FIGS. 21 and 22, in each of the first light emission areas EA1, the second light emission areas EA2, and the third light emission areas EA3, a wavelength conversion layer QDL_1 may be located on the light emitting element LE. The wavelength conversion layer QDL_1 may be in contact with the upper surface of the light emitting element LE. A thickness Tqdl of the wavelength conversion layer QDL_1 may be thicker than that of the light emitting element LE, as shown in FIG. 23.

The wavelength conversion layer QDL_1 may include a third semiconductor layer SEM3 and first wavelength conversion particles WCP1. Because the first wavelength conversion particles WCP1 are substantially the same as those described with reference to FIGS. 5 to 7, their repeated description will be omitted.

The third semiconductor layer SEM3 may include the same material as that of the second semiconductor layer SEM2. The third semiconductor layer SEM3 may be doped with a second conductive type dopant such as Si, Ge, and Sn. For example, the third semiconductor layer SEM3 may be n-GaN doped with n-type Si. A thickness Tqdl of the third semiconductor layer SEM3 may be greater than the thickness Tsem2 of the second semiconductor layer SEM2. The thickness Tqdl of the third semiconductor layer SEM3 may be about 3 µm, approximately. The third semiconductor layer SEM3 may include a plurality of openings OP for accommodating the first wavelength conversion particles WCP1.

The second insulating film INS2 may be located on the sides of the light emitting element LE and the sides of the wavelength conversion layer QDL_1.

The common electrode CE may be located on an upper surface of the wavelength conversion layer QDL_1 and the second insulating film INS2. The common electrode CE may be located to completely cover the light emitting element LE and the wavelength conversion layer QDL_1. Because the third semiconductor layer SEM3 of the wavelength conversion layer QDL_1 is a semiconductor layer doped with the second conductive type dopant, a common voltage of the common electrode CE may be supplied to the second semiconductor layer SEM2 of the light emitting element LE through the third semiconductor layer SEM3 of the wavelength conversion layer QDL_1.

The selective transmission film RTF may be located on the sides of the wavelength conversion layer QDL_1 of the first light emission area EA1, whereas the selective transmission film RTF may be located on both of the upper surface and the sides of the wavelength conversion layer QDL in each of the second light emission areas EA2 and the third light emission areas EA3. The selective transmission film RTF may be located to cover the common electrode CE in each of the second light emission areas EA2 and the third light emission areas EA3. In contrast, the selective transmission film RTF may not cover the common electrode CE located on the upper surface of the light transmitting layer TPL in the first light emission area EA1.

As shown in FIG. 22, the selective transmission film RTF reflects the first light LT1 that is not converted by the first wavelength conversion particles WCP1 of the wavelength conversion layer QDL among the first light LT1 emitted from the light emitting element LE in each of the second light emission areas EA2 and the third light emission areas EA3, and the fourth light LT4 converted by the first wavelength conversion particles WCP1 is transmitted. Because the first light LT1 reflected by the selective transmission film RTF re-enters the wavelength conversion layer QDL, the first light LT1 may be converted into the fourth light LT4 by the first wavelength conversion particles WCP1 of the wavelength conversion layer QDL. Also, because the fourth light LT4 is the mixture light of the second light LT2 and the third light LT3, the second light LT2 may transmit through the second color filter CF2. Therefore, due to the selective transmission film RTF, efficiency of the first light LT1 light, which is emitted from the light emitting element LE and converted into the fourth light LT4 by the first wavelength conversion particles WCP1 of the wavelength conversion layer QDL, may be enhanced.

The selective transmission film RTF may be a distributed Bragg reflector to reflect the first light and to transmit the fourth light as described with reference to FIGS. 8 and 9.

The reflection film RF may be located on the selective transmission film RTF that is located on, or surrounds, the sides of the light emitting elements LE (e.g., with the common electrode CE and the second insulating film INS2 therebetween), that is located on the sides of the light transmitting layer TPL (in some embodiments), and that is located on, or surrounds, the sides of the wavelength conversion layer QDL (e.g., with the common electrode CE and the second insulating film INS2 therebetween). Also, the reflection film RF may be located on (e.g., above) the common electrode CE located on the first insulating film INS1 (e.g., with the selective transmission film RTF therebetween). The reflection film RF serves to reflect the light moving to the upper and lower sides, and to the left and right sides not in the upper direction, among the light emitted from the light emitting element LE. The reflection film RF may include a metal material having high reflectance, such as aluminum (Al). A thickness of the reflection film RF may be about 0.1 μm, approximately.

As shown in FIGS. 21 to 23, the wavelength conversion layer QDL_1 includes the same material as that of the second semiconductor layer SEM2 of the light emitting element LE, and includes a third semiconductor layer SEM3 having a plurality of openings OP for accommodating the first wavelength conversion particles WCP1. In addition, the reflection film RF is located on, or surrounds, the sides of the wavelength conversion layer QDL_1 (e.g., with the selective transmission film RTF, the common electrode CE, and the second insulating film INS2 therebetween) in each of the first light emission areas EA1, and on the sides of the wavelength conversion layer QDL in each of the second light emission areas EA2 and the third light emission areas EA3. Therefore, the light moving to the upper and lower sides, and to the left and right sides not in the upper direction, among the light emitted from the light emitting element LE may be reflected by the reflection film RF. Therefore, even though a separate partition is not located between the light emitting elements LE of the light emission areas EA1, EA2, and EA3 adjacent to one another, the light emitted from the light emitting elements LE of the adjacent light emission areas EA1, EA2, and EA3 may be prevented from being mixed, or a mixture thereof may be reduced.

Also, as shown in FIGS. 21 to 23, the selective transmission film RTF may reflect the first light that is not converted by the first wavelength conversion particles WCP1 of the wavelength conversion layer QDL_1 among the first light LT1 emitted from the light emitting element LE in each of the second light emission areas EA2 and the third light emission areas EA3, and may transmit the fourth light converted by the first wavelength conversion particles WCP1. Because the first light reflected by the selective transmission film RTF re-enters the wavelength conversion layer QDL_1, the first light reflected by the selective transmission film RTF may be converted into the fourth light by the first wavelength conversion particles WCP1 of the wavelength conversion layer QDL_1. Therefore, due to the selective transmission film RTF, efficiency of the first light emitted from the light emitting element LE and converted into the fourth light by the first wavelength conversion particles WCP1 of the wavelength conversion layer QDL may be enhanced.

Figure 24A:
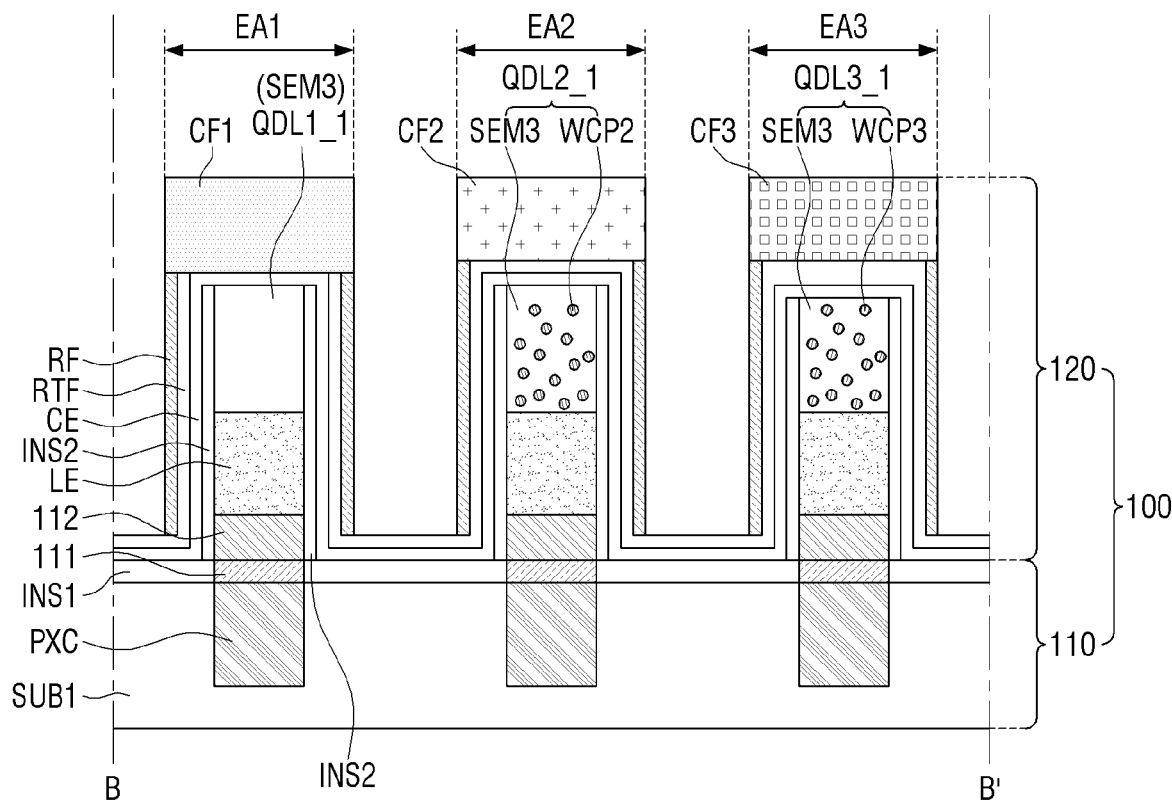
FIG. 24A is a cross-sectional view illustrating still another example of a display panel taken along the line B-B' of FIG. 3.

FIG. 24A is a cross-sectional view illustrating still another example of a display panel taken along the line B-B' of FIG. 3.

The embodiments of FIG. 24A are different from the embodiments of FIG. 21 in that a first wavelength conversion layer QDL1_1 is located in each of the first light emission areas EA1, a second wavelength conversion layer QDL2_1 is located in each of the second light emission areas EA2, and a third wavelength conversion layer QDL3_1 is located in each of the third light emission areas EA3. In FIG. 24A, description previously described with respect to the embodiments of FIG. 21 will be omitted.

Referring to FIG. 24A, the first wavelength conversion layer QDL1_1 may be located on the light emitting element LE in each of the first light emission areas EA1. The first wavelength conversion layer QDL1_1 may be in contact with the upper surface of the light emitting element LE in each of the first light emission areas EA1.

The first wavelength conversion layer QDL1_1 may include a third semiconductor layer SEM3. Because the third semiconductor layer SEM3 is substantially the same as that described with reference to FIG. 21, repeated description thereof will be omitted. Although FIG. 24A illustrates that the first wavelength conversion layer QDL1_1 does not include wavelength conversion particles, the present disclosure is not limited thereto. The first wavelength conversion layer QDL1_1 may include wavelength conversion particles.

The second wavelength conversion layer QDL2_1 may be located on the light emitting element LE in each of the second light emission areas EA2. The second wavelength conversion layer QDL2_1 may be in contact with the upper surface of the light emitting element LE in each of the second light emission areas EA2.

The second wavelength conversion layer QDL2_1 may include a third semiconductor layer SEM3 and second wavelength conversion particles WCP2. The second wavelength conversion particles WCP2 may convert the first light emitted from the light emitting element LE into the second light. For example, the second wavelength conversion particles WCP2 may convert the light of the blue wavelength band into the light of the green wavelength band.

The third wavelength conversion layer QDL3_1 may be located on the light emitting element LE in each of the third light emission areas EA3. The third wavelength conversion layer QDL3_1 may be in contact with the upper surface of the light emitting element LE in each of the third light emission areas EA3.

The third wavelength conversion layer QDL3_1 may include a third semiconductor layer SEM3 and third wavelength conversion particles WCP3. The third wavelength conversion particles WCP3 may convert the first light emitted from the light emitting element LE into the third light. For example, the third wavelength conversion particles WCP3 may convert the light of the blue wavelength band into the light of the red wavelength band.

The second light converted by the second wavelength conversion particles WCP2 of the second wavelength conversion layer QDL2 among the first light emitted from the light emitting element LE in the second light emission area EA2 may transmit through the second color filter CF2. The first light that is not converted by the second wavelength conversion layer QDL2 (among the first light emitted from the light emitting element LE in the second light emission area EA2) may be absorbed or blocked by the second color filter CF2. Therefore, the second light emission area EA2 may emit the second light.

The third light converted by the third wavelength conversion layer QDL3 (among the first light emitted from the light emitting element LE in the third light emission area EA3) may transmit through the third color filter CF3. The first light that is not converted by the third wavelength conversion layer QDL3 (among the first light emitted from the light emitting element LE in the third light emission area EA3) may be absorbed or blocked by the third color filter CF3. Therefore, the third light emission area EA3 may emit the third light.

Figure 24B:
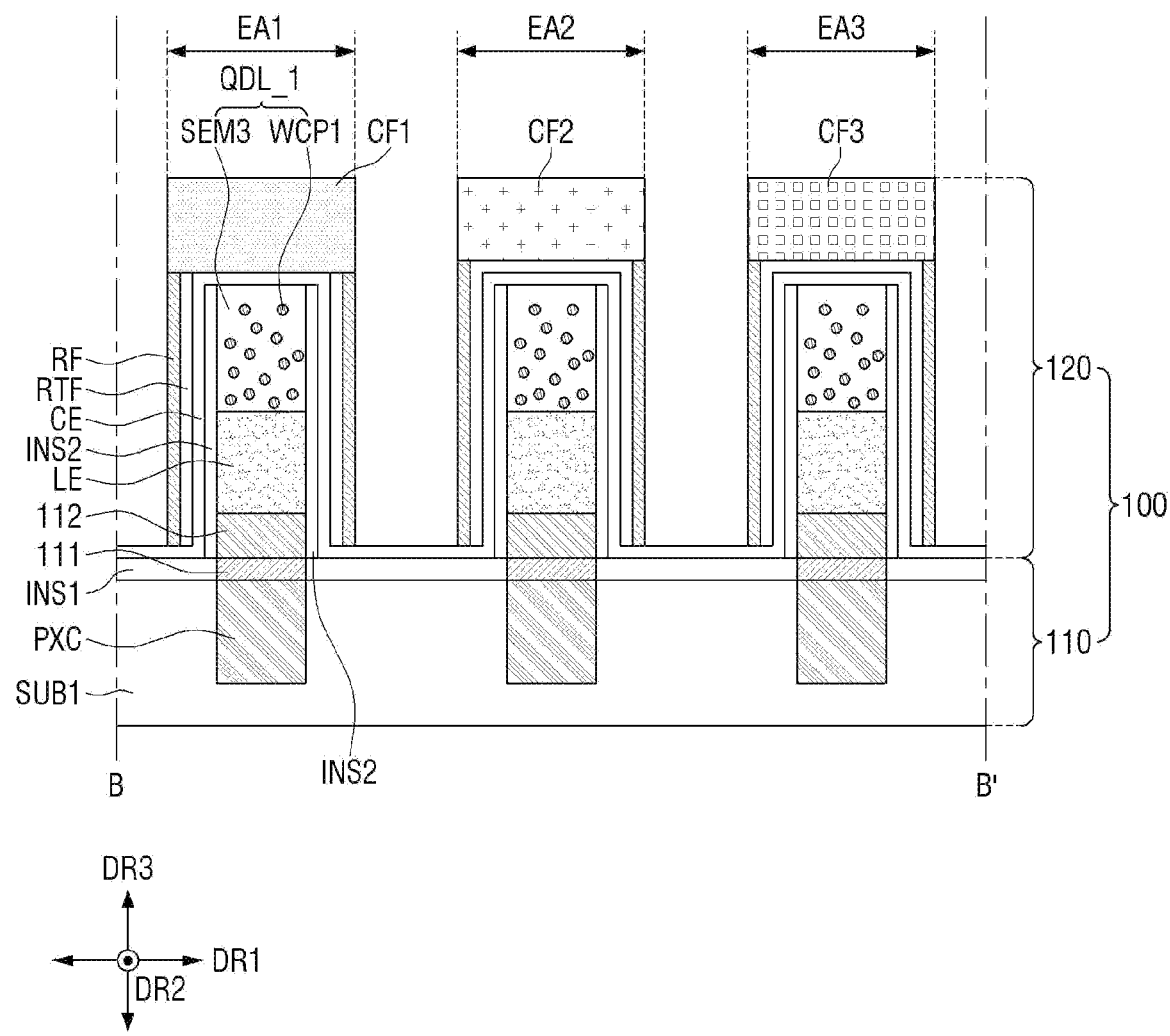
FIG. 24B is a cross-sectional view illustrating further still another example of a display panel taken along the line B-B' of FIG. 3.

FIG. 24B is a cross-sectional view illustrating further still another example of a display panel taken along the line B-B' of FIG. 3.

The embodiments of FIG. 24B are different from the embodiments of FIG. 21 in that the selective transmission film RTF is not located between adjacent light emission areas. Because the selective transmission film RTF in the embodiments of FIG. 24B is substantially the same as that described with reference to FIG. 10B, repeated description thereof will be omitted.

Figure 24C:
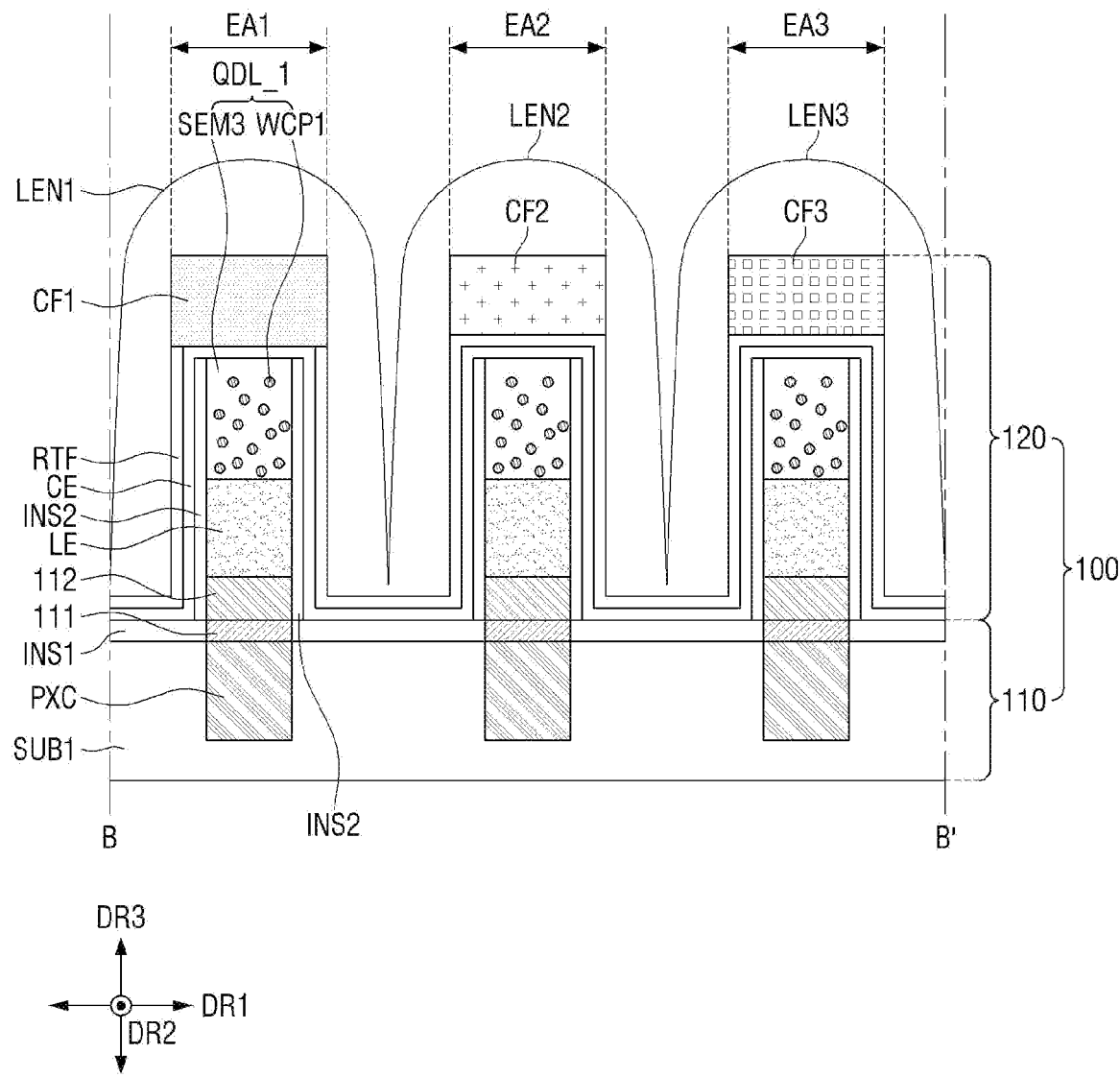
FIG. 24C is a cross-sectional view illustrating further still another example of a display panel taken along the line B-B' of FIG. 3.

FIG. 24C is a cross-sectional view illustrating further still another example of a display panel taken along the line B-B' of FIG. 3.

The embodiments of FIG. 24C are different from the embodiments of FIG. 21 in that the reflection film RF is eliminated, and a first lens pattern LEN1 covering the light emitting element LE, the light transmitting layer TPL (or the wavelength conversion layer QDL_1), and the first color filter CF1 in the first light emission area EA1, a second lens pattern LEN2 covering the light emitting element LE, the wavelength conversion layer QDL and the second color filter CF2 in the second light emission area EA2, and a third lens pattern LEN3 covering the light emitting element LE, the wavelength conversion layer QDL and the third color filter CF3 in the third light emission area EA3, are added. In FIG. 24C, because the first lens pattern LEN1, the second lens pattern LEN2, and the third lens pattern LEN3 are substantially the same as those described with reference to FIG. 10C, their repeated description will be omitted.

Figure 25:
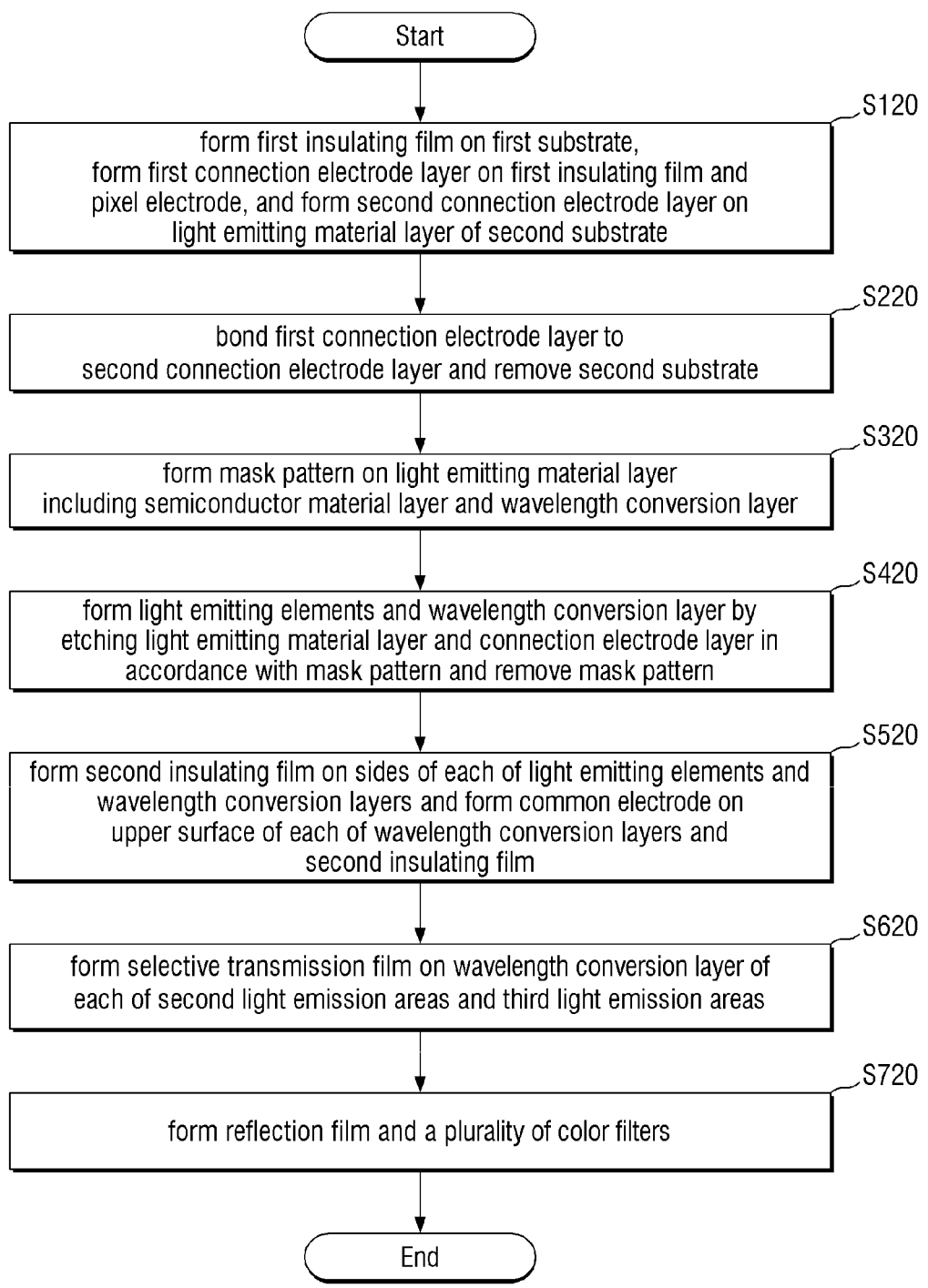
FIG. 25 is a flow chart illustrating a method for fabricating a display device according to some embodiments of the present disclosure.

FIG. 25 is a flow chart illustrating a method for fabricating a display device according to some embodiments of the present disclosure. FIGS. 26 to 32 are cross-sectional views illustrating a method for fabricating a display device according to other embodiments of the present disclosure. In FIGS. 25 to 32, cross-sectional views of a display panel taken along the line B-B' of FIG. 21 are shown. Hereinafter, the method for fabricating a display panel according to some embodiments of the present disclosure will be described in detail with reference to FIGS. 25 to 32.

Figure 26:
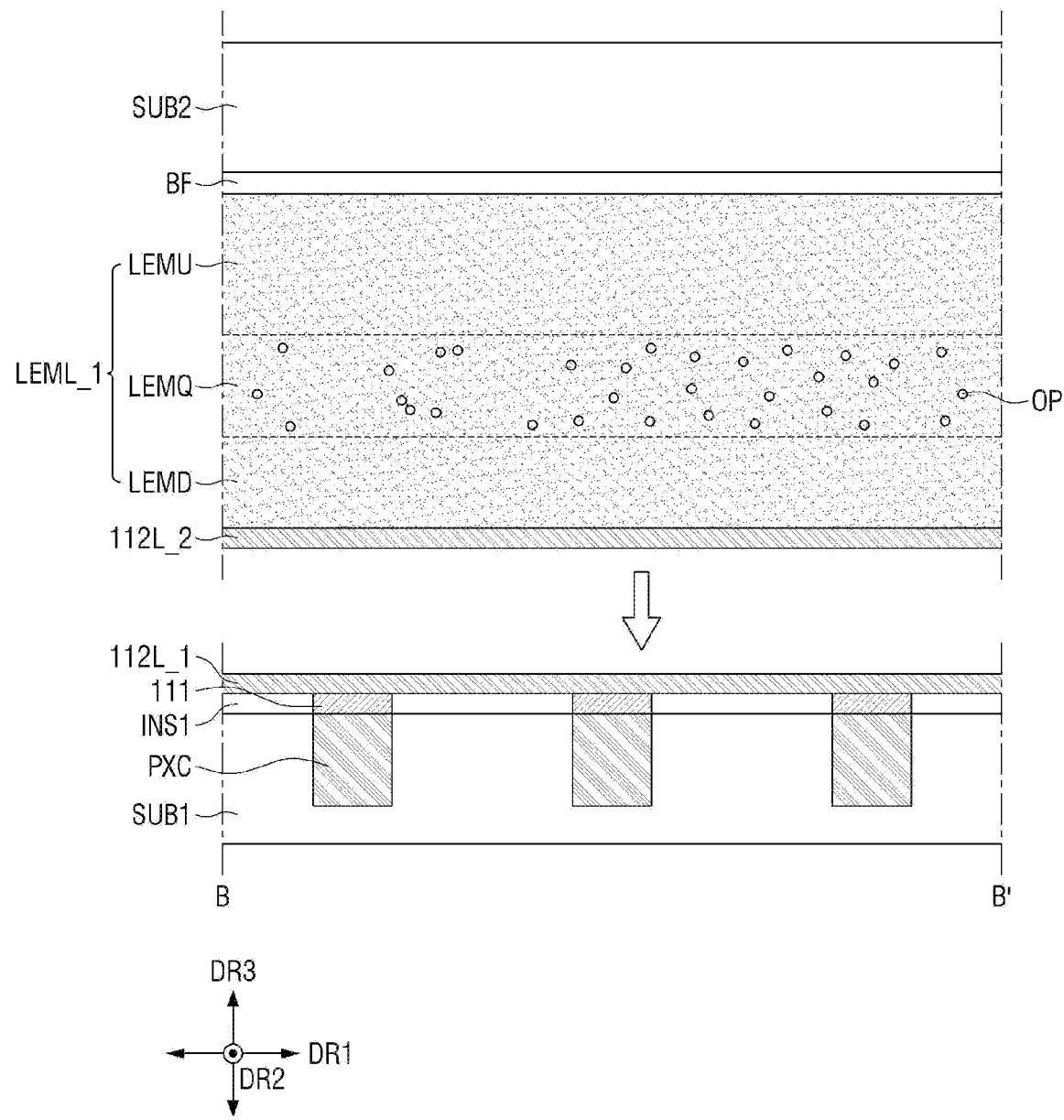
FIGS. 26 to 32 are cross-sectional views illustrating a method for fabricating a display device according to other embodiments of the present disclosure.

First, as shown in FIG. 26, a first connection electrode layer 112L_1 is formed on the pixel electrodes 111 and the first insulating film INS1 that is on or above the first substrate SUB1, and a second connection electrode layer 112L_2 is formed on a light emitting material layer LEML_1 of the second substrate SUB2 (S120 of FIG. 25).

The operation S120 of FIG. 25 may be different from the operation S110 of FIG. 11 in that a light emitting material layer LEML_1 includes a first semiconductor material layer LEMD, a second semiconductor material layer LEMQ, and a third semiconductor material layer LEMU. In the operation S120 of FIG. 25, description previously described with respect to the operation S110 of FIG. 11 will be omitted.

The light emitting material layer LEML_1 may include a first semiconductor material layer LEMD, a second semiconductor material layer LEMQ, and a third semiconductor material layer LEMU. The third semiconductor material layer LEMU may be located on (e.g., contacting or below) the buffer film BF, the second semiconductor material layer LEMQ may be located on the third semiconductor material layer LEMU, and the first semiconductor material layer LEMD may be located on the second semiconductor material layer LEMQ. A thickness of the second semiconductor material layer LEMQ may be greater than a thickness of the first semiconductor material layer LEMD in some embodiments.

As shown in FIGS. 23 and 26, the first semiconductor material layer LEMD (e.g., the light emitting element LE) may include a first semiconductor layer SEM1, an electron blocking layer EBL, an active layer MQW, a superlattice layer SLT, and a second semiconductor layer SEM2. The second semiconductor material layer LEMQ (e.g., the third semiconductor layer SEM3) may include a plurality of openings OP. The second semiconductor material layer LEMQ may include the same material as that of the second semiconductor layer SEM2. The third semiconductor material layer LEMU may be a semiconductor layer that is not doped with a dopant, that is, an undoped semiconductor layer. For example, the third semiconductor material layer LEMU may be undoped-GaN that is not doped with a dopant.

Figure 27:
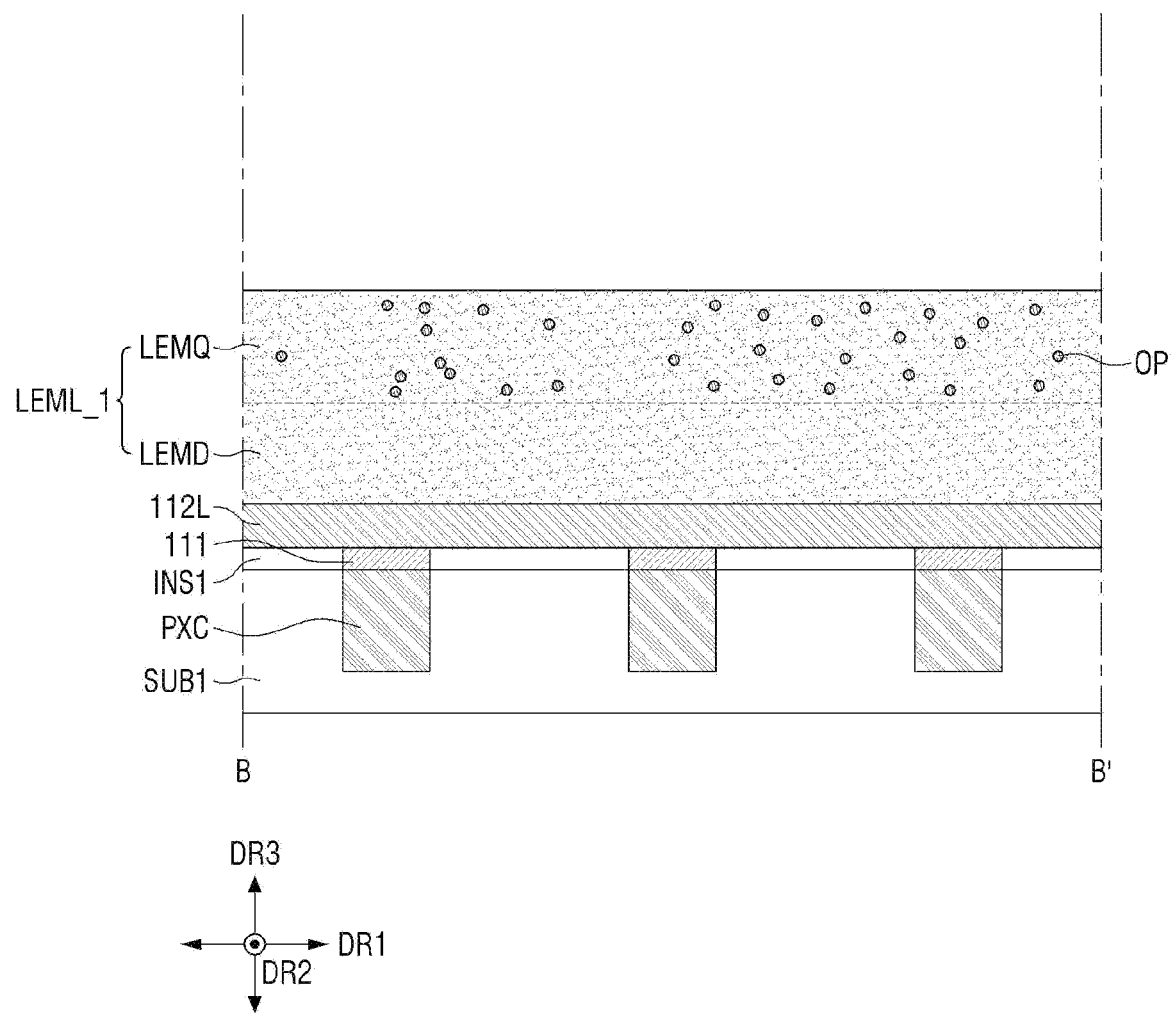

Second, as shown in FIG. 27, the first connection electrode layer 112L_1 and the second connection electrode layer 112L_2 are bonded to each other, and the second substrate SUB2 is removed (S220 of FIG. 25).

The first connection electrode layer 112L_1 and the second connection electrode layer 112L_2 are subjected to melt bonding at a corresponding temperature (e.g., a predetermined temperature) to form one connection electrode layer 112L. That is, the connection electrode layer 112L is located between the pixel electrodes 111 of the first substrate SUB1 and the light emitting material layer LEML_1 of the second substrate SUB2, thereby serving as a bonding metal layer for bonding the pixel electrodes 111 of the first substrate SUB1 to the light emitting material layer LEML_1 of the second substrate SUB2.

Then, the second substrate SUB2 and the buffer film BF may be removed through a polishing process such as a chemical mechanical polishing CMP process and/or an etching process. In addition, the third semiconductor material layer LEMU of the light emitting material layer LEML_1 may be removed through the polishing process, such as the CMP process.

Figure 28:
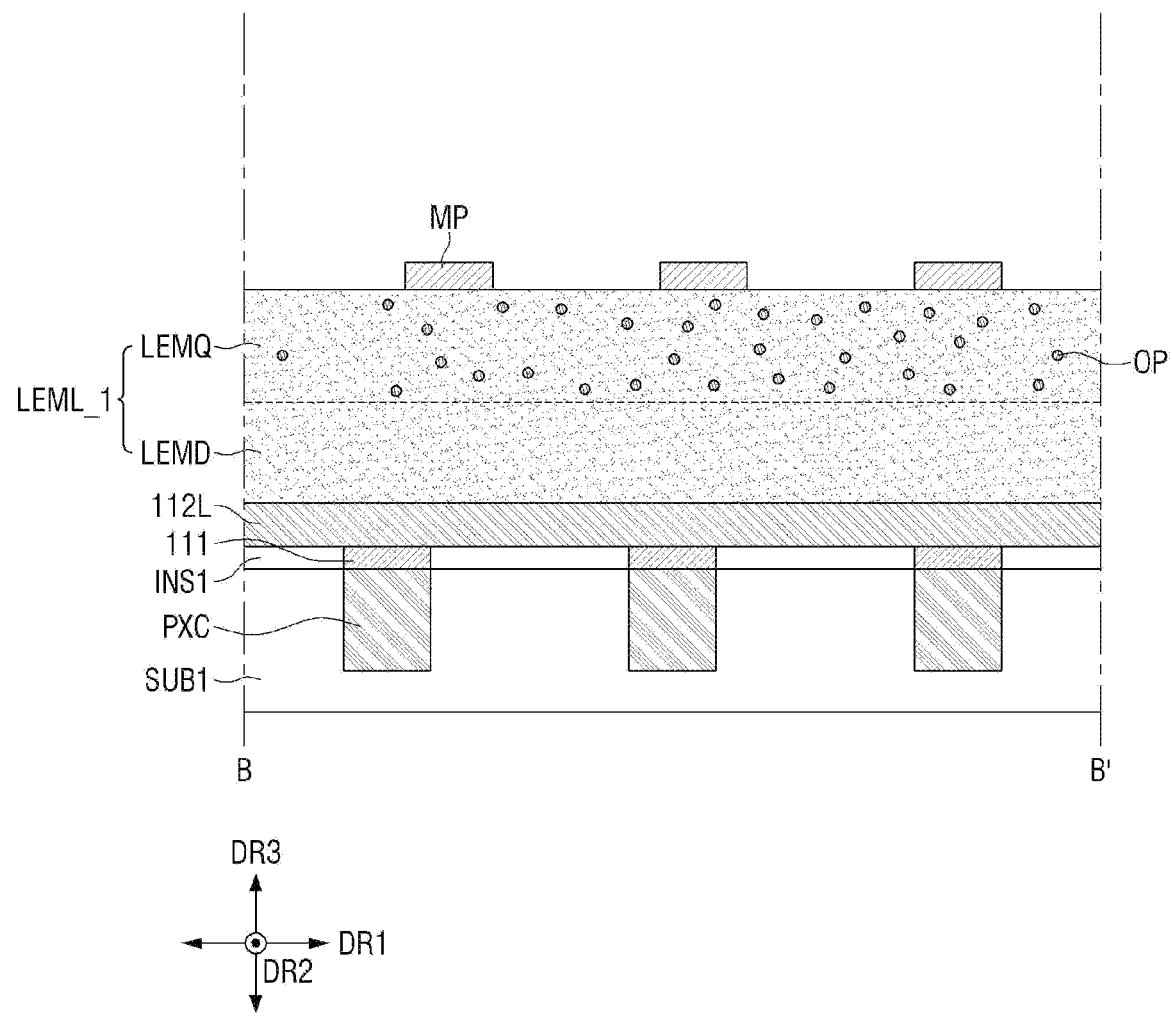

Third, as shown in FIG. 28, a mask pattern MP is formed on the light emitting material layer LEML_1 (S320 of FIG. 25).

The mask pattern MP is formed on an upper surface of the light emitting material layer LEML_1. The upper surface of the light emitting material layer LEML_1 may be an upper surface of the second light emitting material layer LEMQ, which is exposed by removing the second substrate SUB2, the buffer film BF, and the third light emitting material layer LEMU.

Figure 29A:
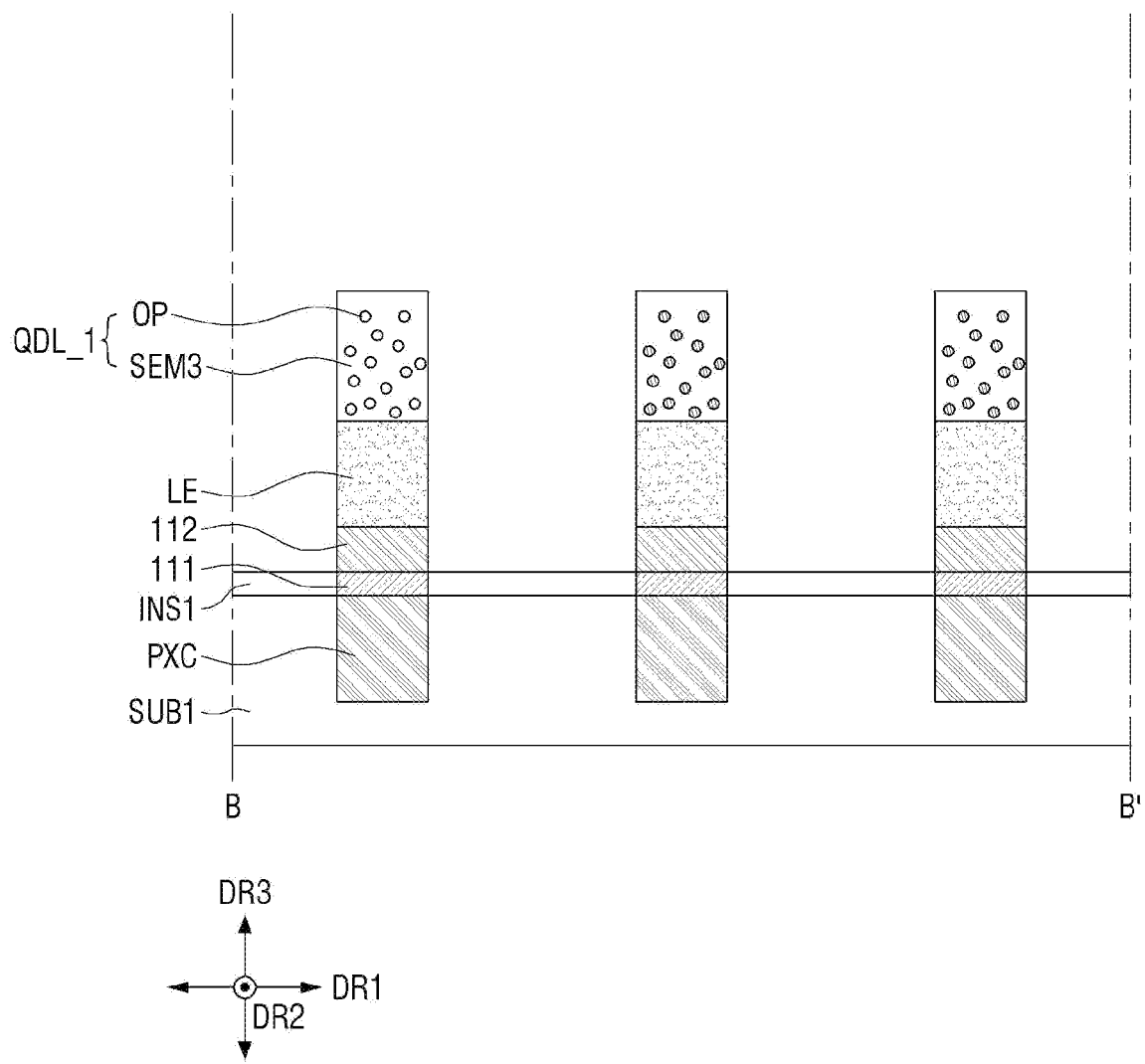
Figure 29B:
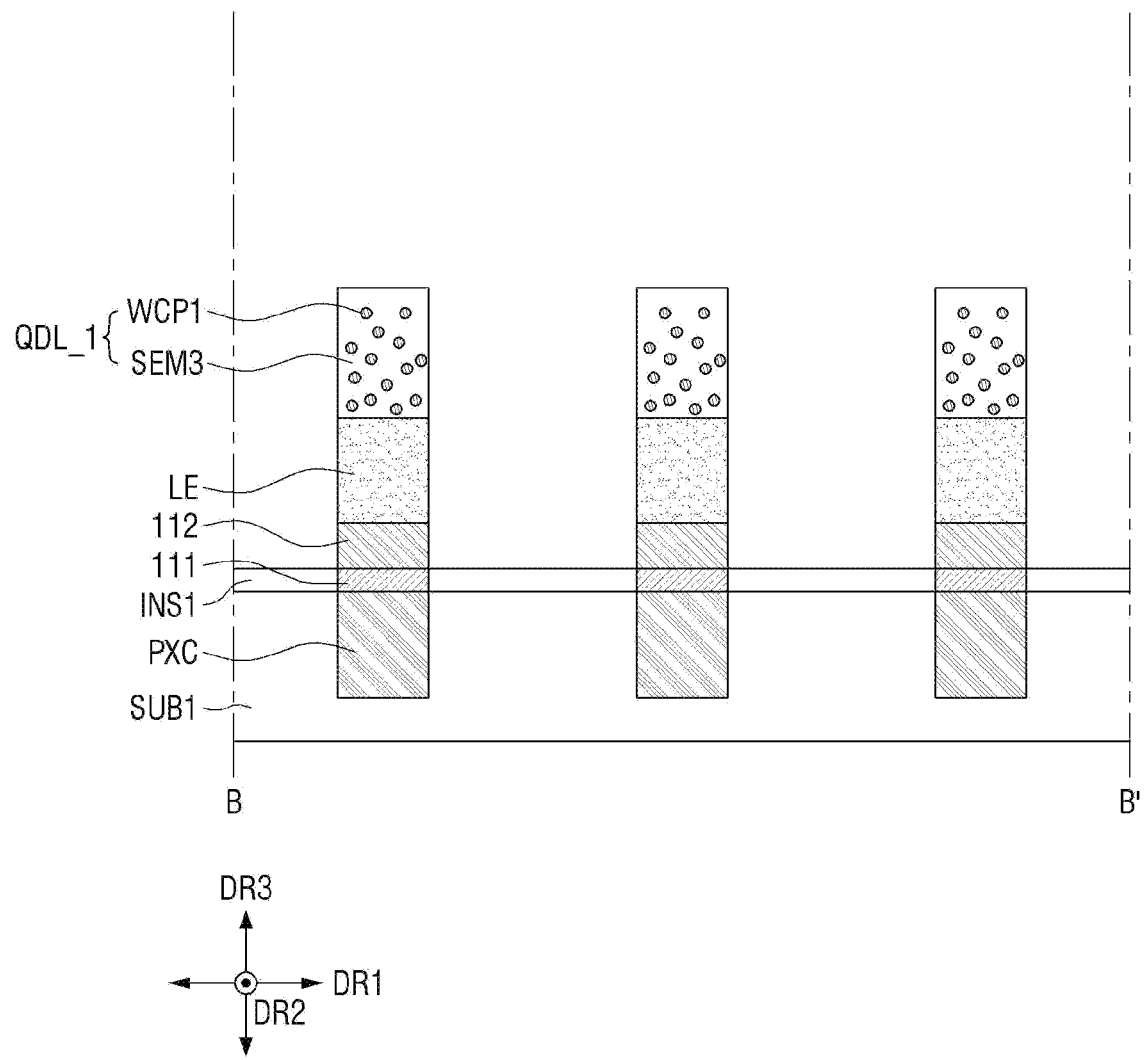

Fourth, as shown in FIGS. 29A and 29B, the light emitting material layer LEML_1 and the connection electrode layer 112L are etched in accordance with the mask pattern MP to form the light emitting elements LE and the wavelength conversion layers QDL_1, and the mask pattern MP is removed (S420 of FIG. 25).

The mask pattern MP might not be etched by a first etching material for etching the light emitting material layer LEML_1, or by a second etching material for etching the connection electrode layer 112L and a first insulating film INS1. For this reason, the light emitting material layer LEML_1 and the connection electrode layer 112L of the area where the mask pattern MP is located might not be etched. Therefore, the connection electrode 112, the light emitting element LE, and the wavelength conversion layer QDL_1 may be formed on the upper surface of each of the pixel electrodes 111.

Then, the mask pattern MP is removed, and the first wavelength conversion particles WCP1 are formed in the openings OP of the third semiconductor layer SEM3 of the wavelength conversion layer QDL_1. When an organic material (e.g., a predetermined organic material) including the first wavelength conversion particles WCP1 is injected into the openings OP of the third semiconductor layer SEM3, the first wavelength conversion particles WCP1 may be located in the openings OP of the third semiconductor layer SEM3. The first wavelength conversion particles WCP1 may have a diameter of about several nanometers to about several tens of nanometers. For example, the first wavelength conversion particles WCP1 may be about 10 nm, approximately.

Figure 30:
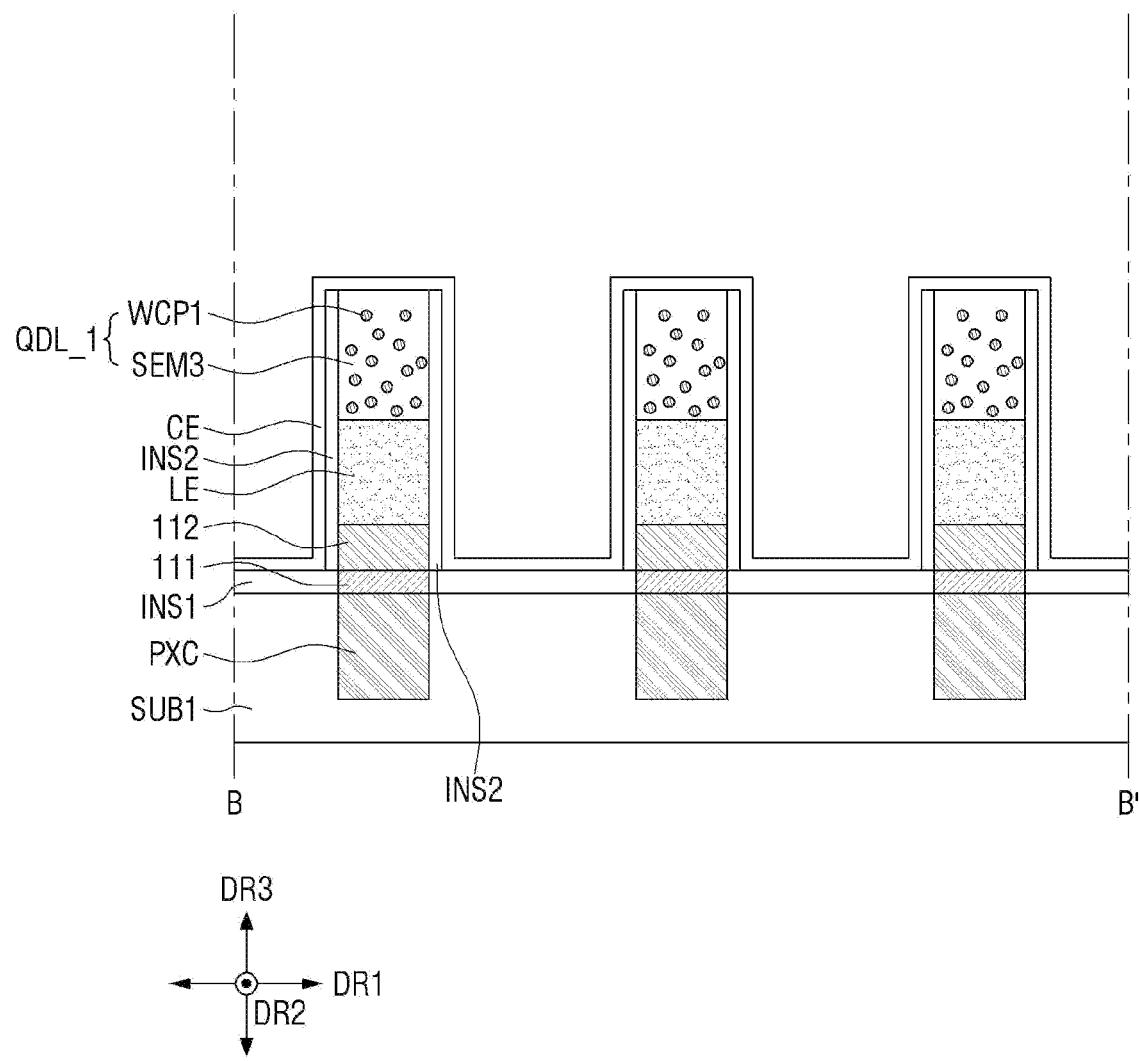

Fifth, as shown in FIG. 30, the second insulating film INS2 is formed on the sides of each of the light emitting elements LE and the wavelength conversion layers QDL_1, and the common electrode CE is formed on the upper surface of each of the light emitting elements LE and the second insulating film INS2 (S520 of FIG. 25).

A second insulating film layer is deposited on the sides of each of the light emitting elements LE and the upper surface and sides of each of the wavelength conversion layers QDL_1. The second insulating film layer may be located on the upper surface and sides of each of the wavelength conversion layers QDL_1, the sides of each of the light emitting elements LE, the sides of each of the connection electrodes 112, and the first insulating film INS1.

Then, a relatively large voltage difference is formed in the third direction DR3 without a separate mask, and the second insulating film layer is etched by the first etching material. In this case, the first etching material may etch the second insulating film layer while moving in the third direction DR3, i.e., from the top to the bottom. For this reason, the second insulating film layer located on a horizontal plane defined by the first direction DR1 and the second direction DR2 is removed, whereas the second insulating film layer located on a vertical plane defined by the third direction DR3 may not be removed. Therefore, the second insulating film layer located on the upper surface of each of the wavelength conversion layer QDL_1 and the upper surface of the first insulating film INS1 may be removed. In contrast, the second insulating film layer located on the sides of each of the wavelength conversion layer QDL_1, the sides of each of the light emitting elements LE and the sides of each of the connection electrodes 112 may not be removed. Therefore, the second insulating film INS2 may be formed on the sides of each of the wavelength conversion layer QDL_1, the sides of each of the light emitting elements LE and the sides of each of the connection electrodes 112.

Then, the common electrode CE is deposited on the upper surface of each of the wavelength conversion layers QDL_1 and the second insulating film INS2.

Figure 31:
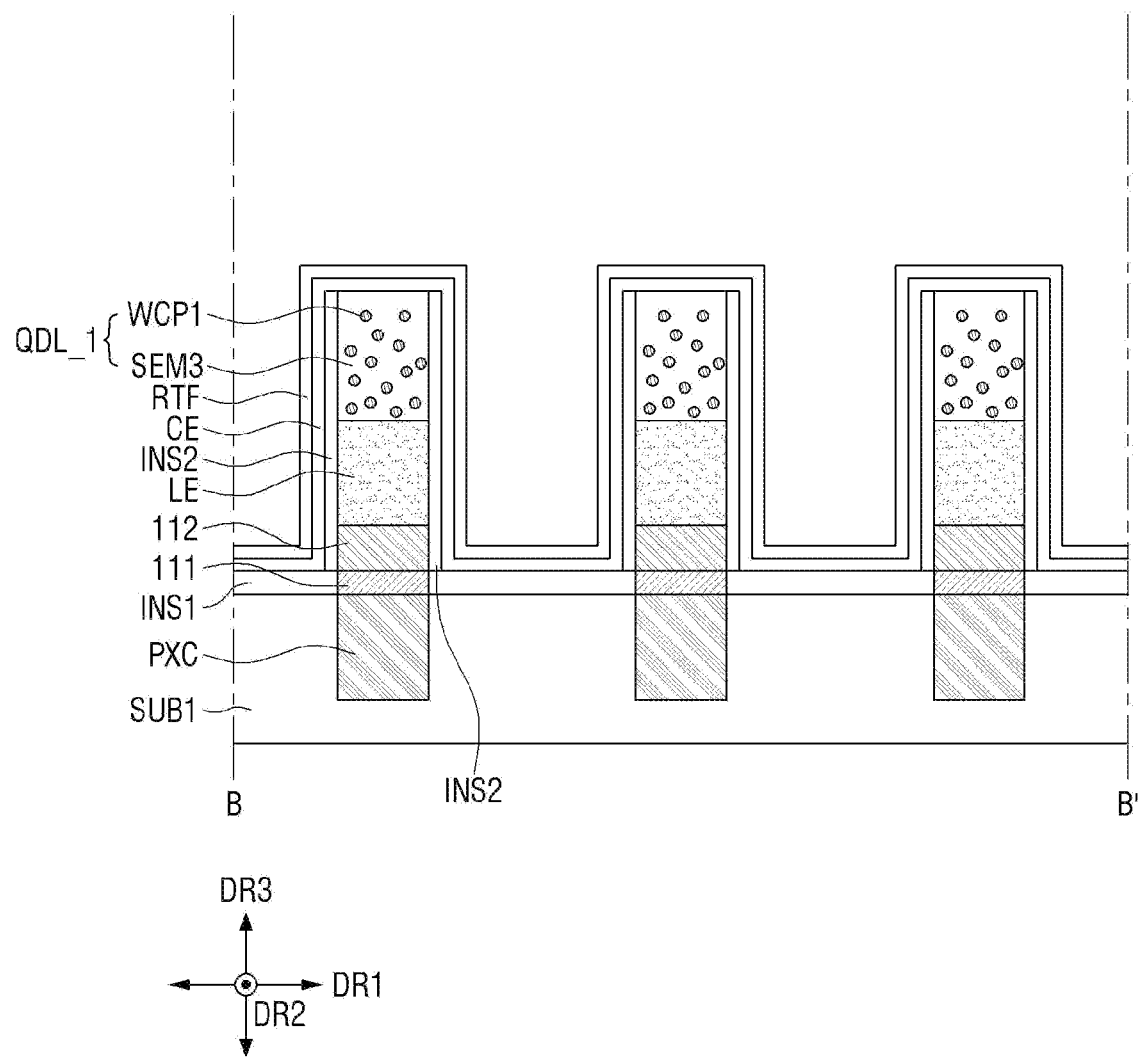

Sixth, as shown in FIG. 31, the selective transmission film RTF is formed on the wavelength conversion layer QDL_1 in each of the second light emission areas EA2 and the third light emission areas EA3 (S620 of FIG. 25).

In some embodiments, the selective transmission film RTF may be deposited on the upper surface and sides of the wavelength conversion layer QDL_1 of each of the first light emission areas EA1, the second light emission areas EA2, and the third light emission areas EA3, and the common electrode CE.

Then, the mask pattern is formed to cover the selective transmission film RTF located on the sides of the wavelength conversion layer QDL_1 of each of the first light emission areas EA1 and the upper surface and sides of the wavelength conversion layer QDL_1 of each of the second light emission areas EA2 and the third light emission areas EA3.

Then, the selective transmission film RTF located on the upper surface of the wavelength conversion layer QDL_1 of each of the first light emission areas EA1, which is not covered by the mask pattern, is removed.

Then, the mask pattern is removed.

Figure 32:
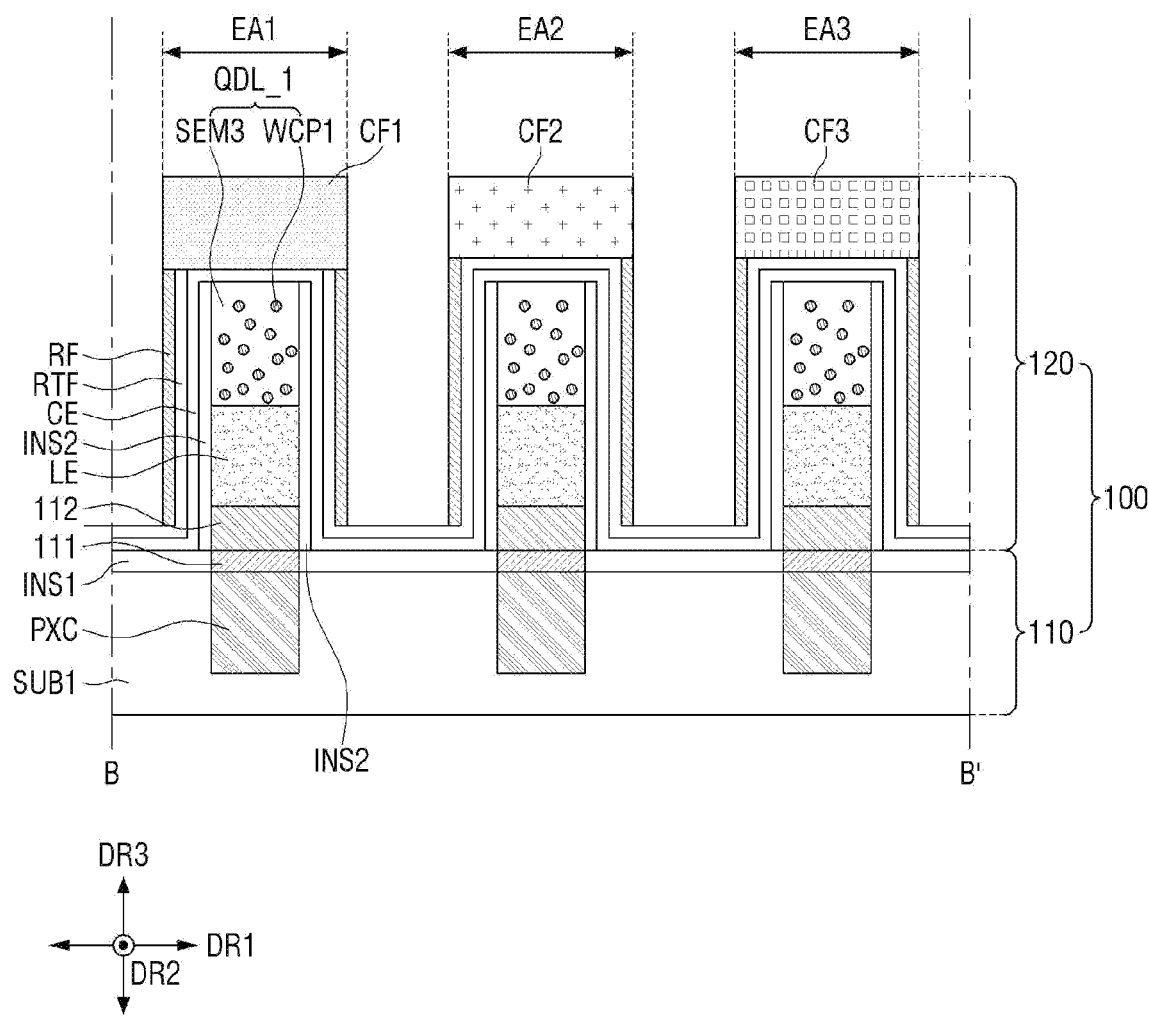

Seventh, as shown in FIG. 32, the reflection film RF and the plurality of color filters CF1, CF2, and CF3 are formed (S720 of FIG. 25).

A reflection layer is deposited to cover the upper surface of the wavelength conversion layer QDL_1 of each of the first light emission areas EA1 and the selective transmission film RTF.

Then, a relatively large voltage difference is formed in, or with respect to, the third direction DR3 without a separate mask, and the reflection layer is etched by the second etching material. In this case, the second etching material may etch the reflection layer while moving in the third direction DR3 (e.g., while moving from the top to the bottom) under the control of a voltage. For this reason, the reflection layer located on a horizontal plane defined by the first direction DR1 and the second direction DR2 is removed, whereas the reflection layer located on a vertical plane defined by the third direction DR3 may not be removed. Therefore, the reflection layer located on the upper surface of the wavelength conversion layer QDL_1 in each of the first light emission areas EA1, the second light emission areas EA2, and the third light emission areas EA3 may be removed. In contrast, the reflection layer located on the sides of the wavelength conversion layer QDL_1 in each of the first light emission areas EA1, the second light emission areas EA2, and the third light emission areas EA3 may not be removed. Therefore, the reflection film RF may be located on the selective transmission film RTF located on, or surrounds, the sides of the wavelength conversion layer QDL_1 (e.g., with the common electrode CE and the second insulating film INS2 therebetween) in each of the first light emission areas EA1, the second light emission areas EA2, and the third light emission areas EA3.

Then, the first color filter CF1 may be formed on the wavelength conversion layer QDL_1 in each of the first light emission areas EA1, the second color filter CF2 may be formed on the wavelength conversion layer QDL_1 in each of the second light emission areas EA2, and the third color filter CF3 may be formed on the wavelength conversion layer QDL_1 in each of the third light emission areas EA3.

Figure 33:
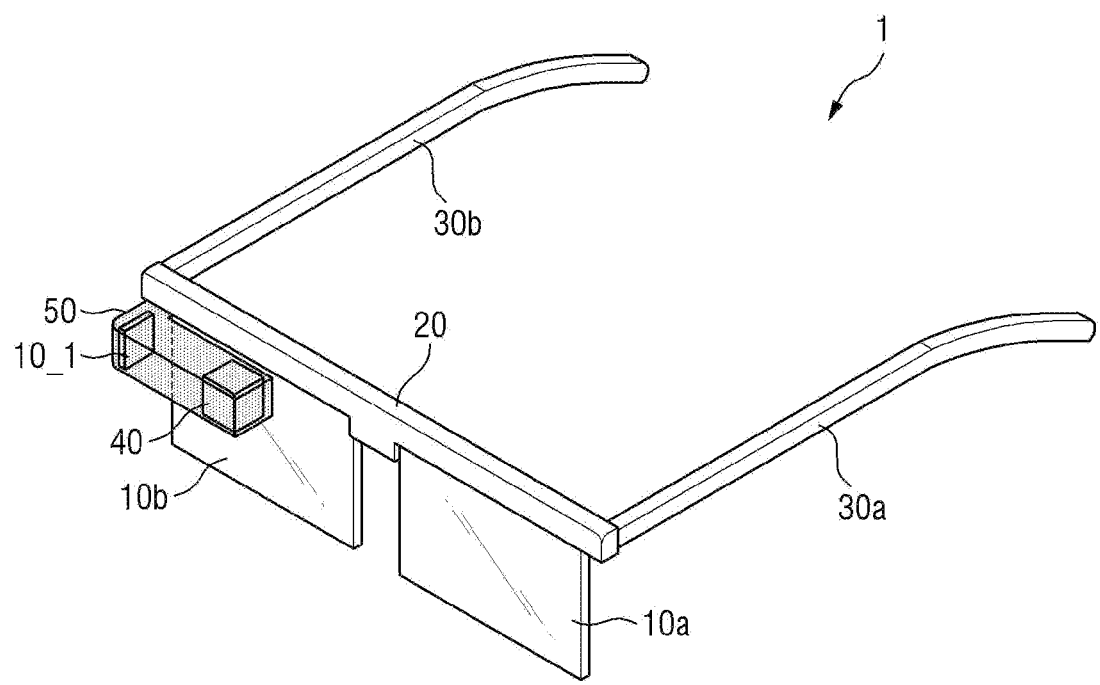
FIG. 33 is a view illustrating a virtual reality device including a display device according to some embodiments.

FIG. 33 is a view illustrating a virtual reality device including a display device according to some embodiments. In FIG. 33, a virtual reality device 1, to which a display device 10_1 according to some embodiments is applied, is shown.

Referring to FIG. 33, the virtual reality device 1 according to some embodiments may be a glasses-type device. The virtual reality device 1 according to some embodiments may include a display device 10_1, a left-eye lens 10a, a right-eye lens 10b, a support frame 20, glasses frame legs, or bows or arms, 30a and 30b, a reflection member 40, and a display device accommodating portion 50.

Although FIG. 33 illustrates the virtual reality device 1 that includes glasses frame legs 30a and 30b, the virtual reality device 1 according to some embodiments may be applied to a head mounted display including a head mounting band, which may be mounted on a head, instead of the glasses frame legs 30a and 30b. That is, the virtual reality device 1 according to some embodiments is not limited to that shown in FIG. 33, and is applicable to various electronic devices in various forms.

The display device accommodating portion 50 may include a display device 10_1 and a reflection member 40. The image displayed on the display device 10_1 may be reflected by the reflection member 40 and provided to a user's right eye through the right-eye lens 10*b*. For this reason, the user may view a virtual reality image displayed on the display device 10_1 through the right eye.

Although FIG. 33 illustrates that the display device accommodating portion 50 is located at a right end of the support frame 20, the present disclosure is not limited thereto. For example, the display device accommodating portion 50 may be located at a left end of the support frame 20, and in this case, the image displayed on the display device 10_1 may be reflected by the reflection member 40 and provided to the user's left eye through the left-eye lens 10*a*. For this reason, the user may view the virtual reality image displayed on the display device 10_1 through the left eye. Alternatively, the display device accommodating portion 50 may be located at both the left end and the right end of the support frame 20, and in this case, the user may view the virtual reality image displayed on the display device 10_1 through both the left eye and the right eye.

Figure 34:
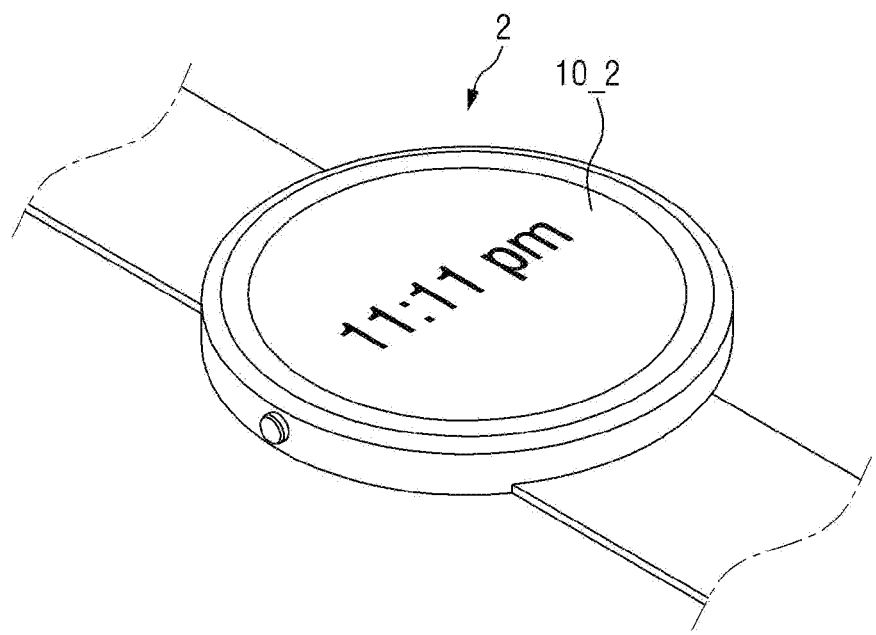
FIG. 34 is a view illustrating a smart device including a display device according to some embodiments.

FIG. 34 is a view illustrating a smart device including a display device according to some embodiments.

Referring to FIG. 34, a display device 10_2 according to some embodiments may be applied to a smart watch 2, which is one example of a smart device.

Figure 35:
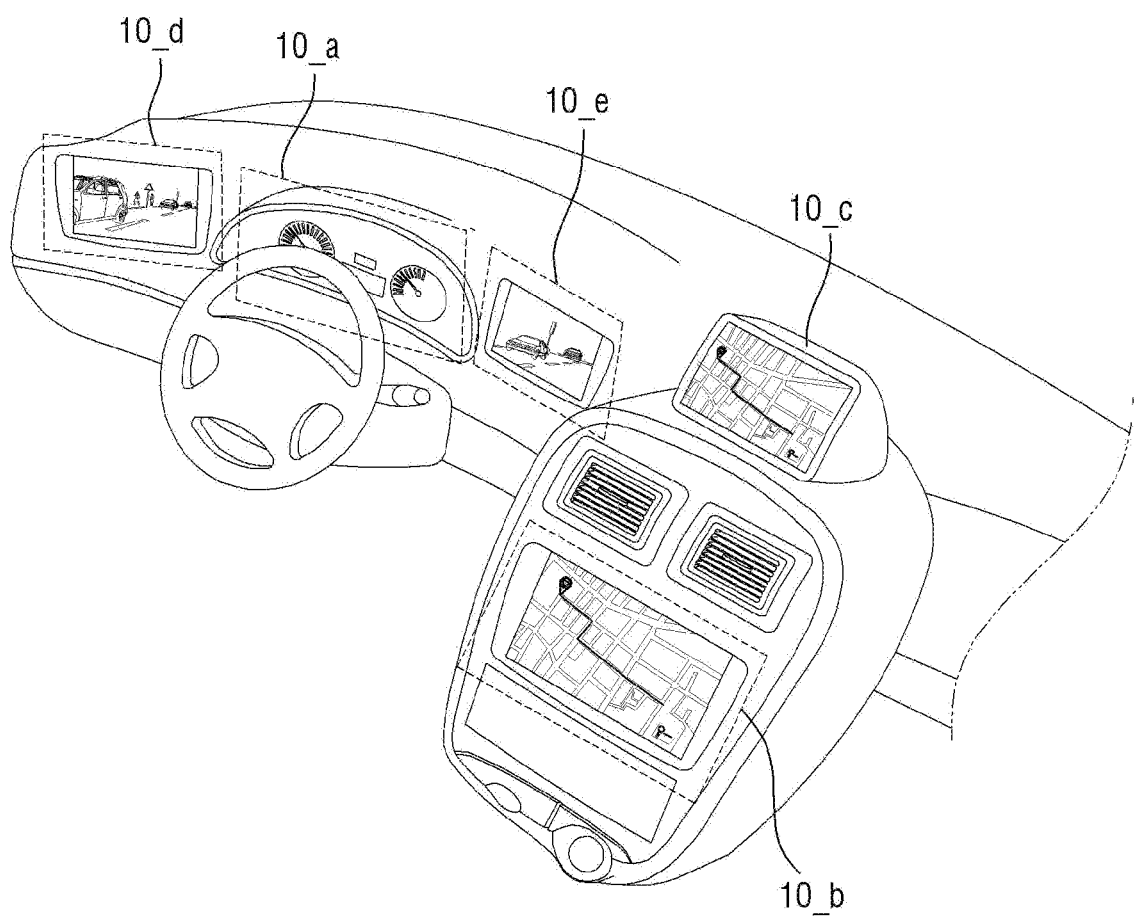
FIG. 35 is a view illustrating a vehicle dashboard and a center fascia including a display device according to some embodiments.

FIG. 35 is a view illustrating a vehicle dashboard and a center fascia including a display device according to some embodiments. A vehicle to which display devices 10_*a*, 10_*b*, 10_*c*, 10_*d* and 10_*e* according to some embodiments are applied is shown in FIG. 35.

Referring to FIG. 35, the display devices 10_*a*, 10_*b*, and 10_*c* according to some embodiments may be applied to a dashboard of the vehicle, applied to a center fascia of the vehicle, or applied to a center information display (CID) located on the dashboard of the vehicle. In addition, the display devices 10_*d* and 10_*e* according to some embodiments may be applied to a room mirror display that replaces a side mirror of the vehicle.

Figure 36:
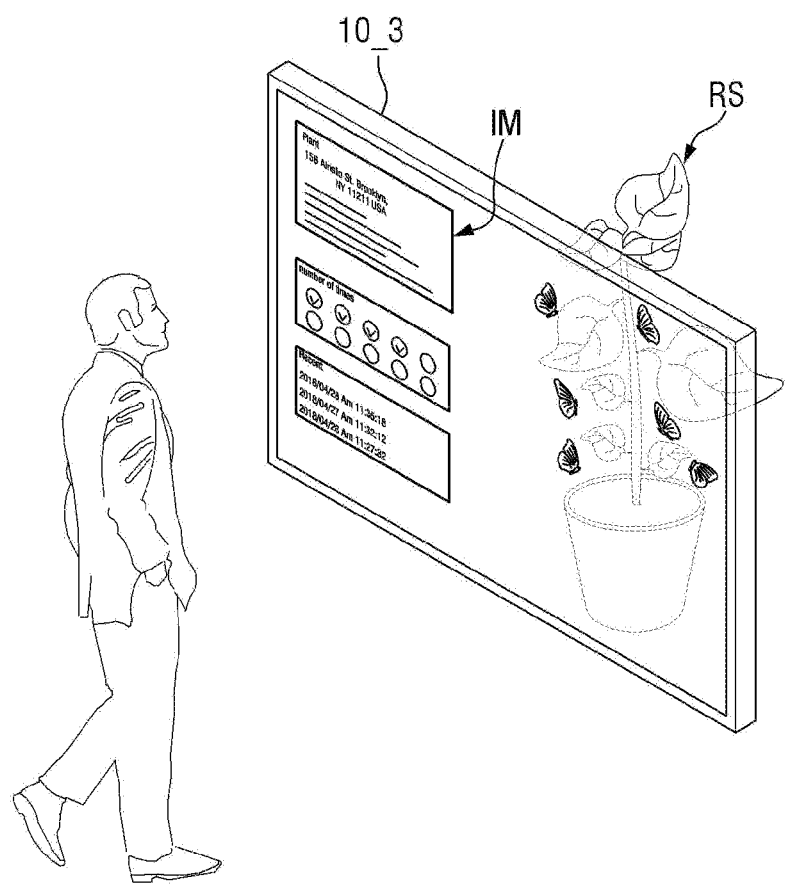
FIG. 36 is a view illustrating a transparent display device including a display device according to some embodiments.

FIG. 36 is a view illustrating a transparent display device including a display device according to some embodiments.

Referring to FIG. 36, a display device 10_3 according to some embodiments may be applied to the transparent display device. The transparent display device may display an image IM and, at the same time, may transmit light. Therefore, a user located in front of a front surface of the transparent display device may not only view the image IM displayed on the display device 10_3, but may also view an object RS or a background located on or behind a rear surface of the transparent display device. When the display device 10_3 is applied to the transparent display device, the first substrate SUB1 of the display device 10_3 shown in FIG. 5 may include a light transmitting portion capable of transmitting light, or may be formed of a material capable of transmitting light.

Figure 37:
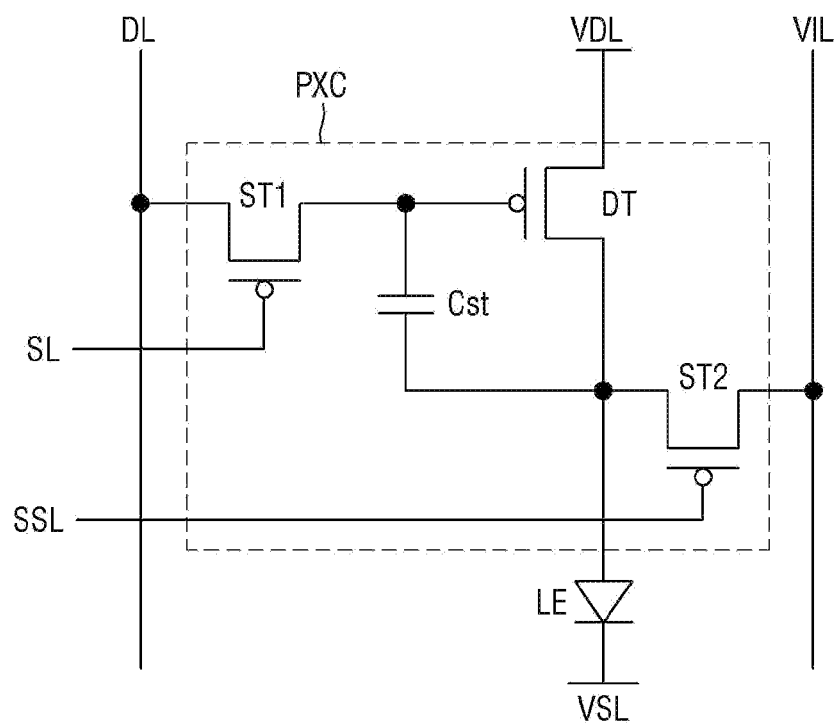
FIG. 37 is a circuit view of a pixel circuit area and a light emitting element according to some embodiments.

FIG. 37 is a circuit view of a pixel circuit area and a light emitting element according to some embodiments.

An example of the pixel circuit area PXC and the light emitting element LE of FIG. 5 is shown in FIG. 37.

Referring to FIG. 37, the light emitting element LE emits light in accordance with a driving current. The emission amount of the light emitting element LE may be proportional to the driving current. The light emitting element LE may be an inorganic light emitting element that includes an anode electrode, a cathode electrode, and an inorganic semiconductor located between the anode electrode and the cathode electrode. For example, the light emitting element LE may be a micro light emitting diode.

The anode electrode of the light emitting element LE may be connected to a source electrode of a driving transistor DT, and the cathode electrode of the light emitting element LE may be connected to a second power line VSL to which a low potential voltage that is lower than a high potential voltage is supplied.

The driving transistor DT adjusts a current flowing from a first power line VDL, to which a first power voltage is supplied, to the light emitting element LE in accordance with a voltage difference between a gate electrode and the source electrode of the driving transistor DT. The gate electrode of the driving transistor DT may be connected to a first electrode of a first transistor ST1, the source electrode of the driving transistor DT may be connected to the anode electrode of the light emitting element LE, and the drain electrode of the driving transistor DT may be connected to the first power line VDL to which a high potential voltage is applied.

The first transistor ST1 is turned on by a scan signal of a scan line SL to connect a data line DL to the gate electrode of the driving transistor DT. A gate electrode of the first transistor ST1 may be connected to the scan line SL, the first electrode of the first transistor ST1 may be connected to the gate electrode of the driving transistor DT, and the second electrode of the first transistor ST1 may be connected to the data line DL.

A second transistor ST2 is turned on by a sensing signal of a sensing signal line SSL to connect an initialization voltage line VIL to the source electrode of the driving transistor DT. A gate electrode of the second transistor ST2 may be connected to the sensing signal line SSL, the first electrode of the second transistor ST2 may be connected to the initialization voltage line VIL, and the second electrode of the second transistor ST2 may be connected to the source electrode of the driving transistor DT.

Although the first electrode of each of the first and second transistors ST1 and ST2 may be a source electrode, and the second electrode of each of the first and second transistors ST1 and ST2 may be a drain electrode, but it should be noted that they are not limited thereto. That is, the first electrode of each of the first and second transistors ST1 and ST2 may be a drain electrode, and the second electrode of the first and second transistors ST1 and ST2 may be a source electrode in some embodiments.

A capacitor Cst is formed between the gate electrode and the source electrode of the driving transistor DT. The capacitor Cst stores a differential voltage between a gate voltage and a source voltage of the driving transistor DT.

Although the driving transistor DT and the first and second transistors ST1 and ST2 are formed of N-type metal oxide semiconductor field effect transistors (MOSFETs) in FIG. 37, it should be noted that the transistors are not limited thereto. The driving transistor DT and the first and second transistors ST1 and ST2 may be formed of P-type MOSFETs.

Figure 38:
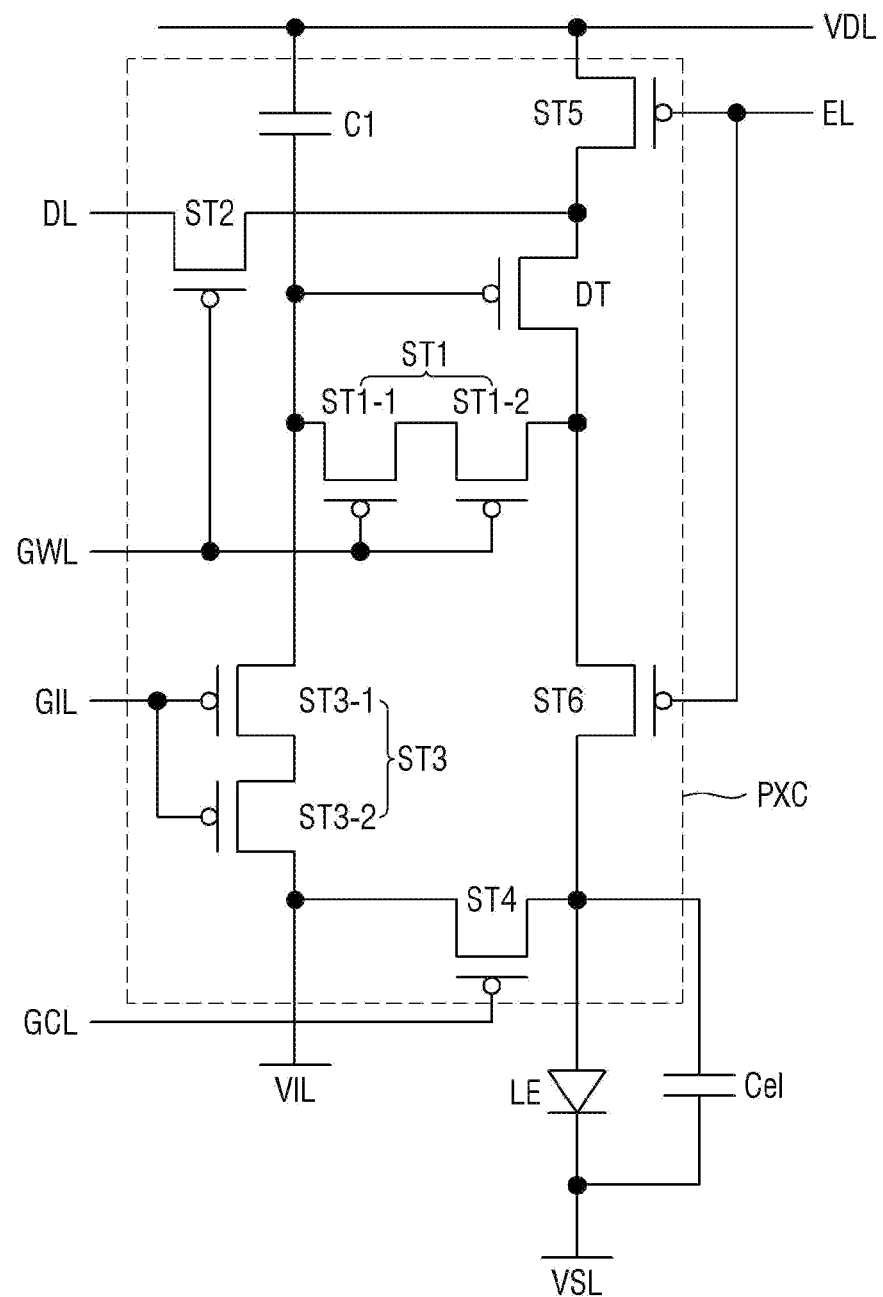
FIG. 38 is a circuit view of a pixel circuit area and a light emitting element according to other embodiments.

FIG. 38 is a circuit view of a pixel circuit area and a light emitting element according to other embodiments.

Another example of the pixel circuit area PXC and the light emitting element LE of FIG. 5 is shown in FIG. 38.

Referring to FIG. 38, the light emitting element LE emits light in accordance with the driving current. The emission amount of the light emitting element LE may be proportional to the driving current. The light emitting element LE may be an inorganic light emitting element that includes an anode electrode, a cathode electrode, and an inorganic semiconductor located between the anode electrode and the cathode electrode. For example, the light emitting element LE may be a micro light emitting diode.

The anode electrode of the light emitting element LE may be connected to a first electrode of a fourth transistor ST4 and to a second electrode of a sixth transistor ST6, and the cathode electrode of the light emitting element LE may be connected to the first power line VDL. A parasitic capacitance Cel may be formed between the anode electrode and the cathode electrode of the light emitting element LE.

The pixel circuit area PXC includes a driving transistor DT, switch elements, and a capacitor C1. The switch elements include first to sixth transistors ST1, ST2, ST3, ST4, ST5, and ST6.

The driving transistor DT includes a gate electrode, a first electrode, and a second electrode. The driving transistor DT controls a drain-source current (hereinafter, referred to as "driving current") flowing between the first electrode and the second electrode of the driving transistor DT in accordance with a data voltage applied to the gate electrode.

The capacitor C1 is formed between the gate electrode of the driving transistor DT and the first power line VDL. One electrode of the capacitor C1 may be connected to the gate electrode of the driving transistor DT, and the other electrode thereof may be connected to the first power line VDL.

When a first electrode of each of the first to sixth transistors ST1, ST2, ST3, ST4, ST5, and ST6 and the driving transistor DT is a source electrode, a second electrode thereof may be a drain electrode. Alternatively, when the first electrode of each of the first to sixth transistors ST1, ST2, ST3, ST4, ST5, and ST6 and the driving transistor DT is a drain electrode, the second electrode thereof may be a source electrode.

An active layer of each of the first to sixth transistors ST1, ST2, ST3, ST4, ST5, and ST6 and the driving transistor DT may be formed of any one of poly silicon, amorphous silicon, and oxide semiconductor. When the semiconductor layer of each of the first to sixth transistors ST1, ST2, ST3, ST4, ST5, and ST6 and the driving transistor DT is formed of poly silicon, a process of forming the same may be a low temperature poly silicon (LTPS) process.

Although the first to sixth transistors ST1, ST2, ST3, ST4, ST5, and ST6 and the driving transistor DT are formed of P-type MOSFETs in FIG. 38, the transistors are not limited thereto, and one or more thereof may be formed of N-type MOSFETs. Further, the first transistor ST1 includes a first sub-transistor ST1-1 and a second sub-transistor ST1-2 connected in series. The third transistor ST3 includes a third sub-transistor ST3-1 and a fourth sub-transistor ST3-2 connected in series.

Moreover, the first power voltage of the first power line VDL, a second power voltage of the second power line VSL, and a third power voltage of a third power line VIL may be set in consideration of characteristics of the driving transistor DT, characteristics of the light emitting element LE, and the like.

Figure 39:
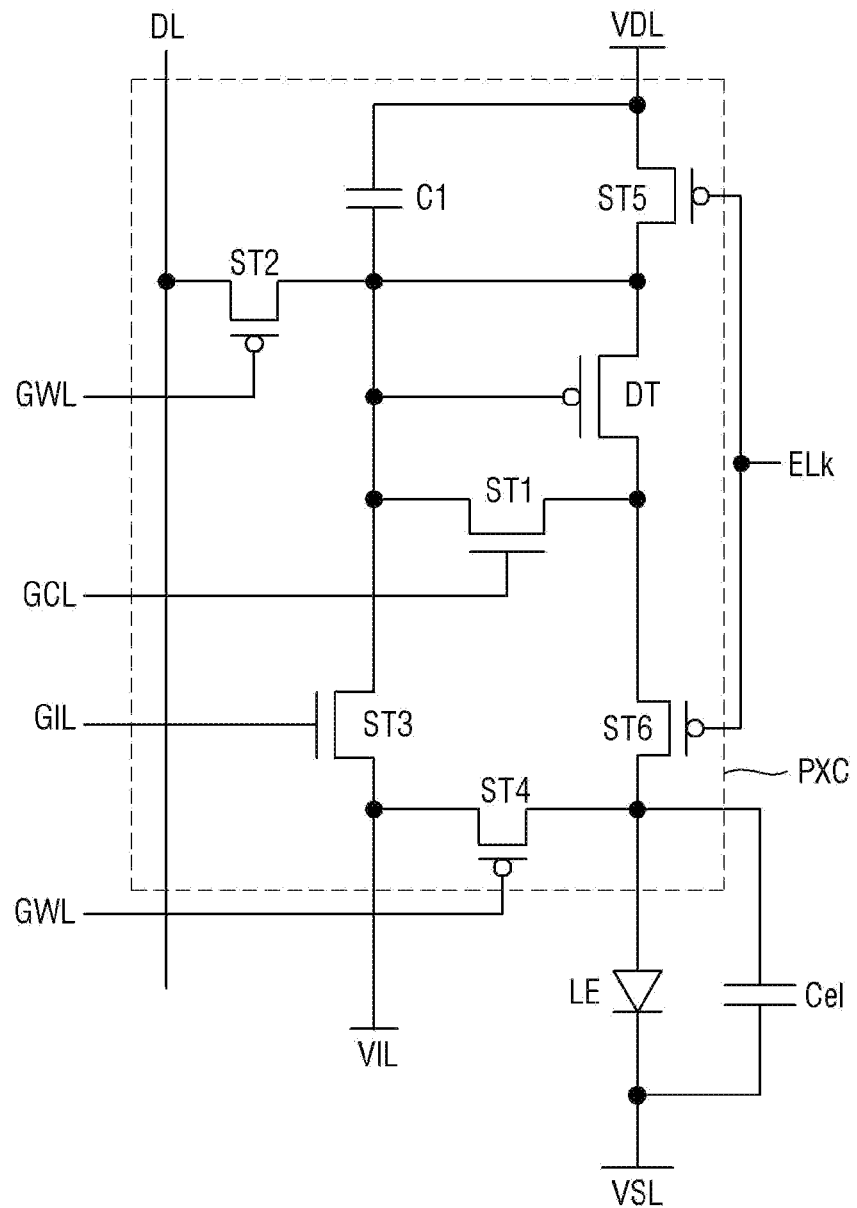
FIG. 39 is a circuit view of a pixel circuit area and a light emitting element according to other embodiments.

FIG. 39 is a circuit view of a pixel circuit area and a light emitting element according to other embodiments.

Other example of the pixel circuit area PXC and the light emitting element LE of FIG. 6 is shown in FIG. 39.

The embodiments of FIG. 39 are different from the embodiments of FIG. 38 in that the driving transistor DT, the second transistor ST2, the fourth transistor ST4, the fifth transistor ST5, and the sixth transistor ST6 are formed of P-type MOSFETs, and the first transistor ST1 and the third transistor ST3 are formed of N-type MOSFETs.

Referring to FIG. 39, the active layer of each of the driving transistor DT, the second transistor ST2, the fourth transistor ST4, the fifth transistor ST5, and the sixth transistor ST6, which are formed of P-type MOSFETs, may be formed of poly silicon, and the active layer of each of the first transistor ST1 and the third transistor ST3, which are formed of N-type MOSFETs, may be formed of oxide semiconductor.

The embodiments of FIG. 39 are different from the embodiments of FIG. 38 in that the gate electrode of the second transistor ST2 and the gate electrode of the fourth transistor ST4 are connected to a write scan line GWL, and the gate electrode of the first transistor ST1 is connected to a control scan line GCL. In FIG. 39, because the first transistor ST1 and the third transistor ST3 are formed of N-type MOSFETs, a scan signal of a gate high voltage may be applied to the control scan line GCL and an initialization scan line GIL. In contrast, because the second transistor ST2, the fourth transistor ST4, the fifth transistor ST5, and the sixth transistor ST6 are formed of P-type MOSFETs, a scan signal of a gate low voltage may be applied to the write scan line GWL and a light emission line EL.

It should be noted that the pixel circuit area PXC according to embodiments of the present disclosure is not limited to that shown in FIGS. 37 to 39. The pixel circuit area PXC according to some embodiments of the present disclosure may be formed in other circuit structures, which are known and may be adopted by those skilled in the art, in addition to the embodiments shown in FIGS. 37 to 39.

However, the aspects of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:

1. A display device comprising:
   a substrate;
   a pixel electrode on the substrate;
   a light-emitting element on the pixel electrode, and extending in a thickness direction of the substrate;
   a common electrode on the light-emitting element;
   a wavelength conversion layer on the common electrode, comprising wavelength conversion particles for converting first light emitted from the light-emitting element into second light; and
   a selective transmission film on an upper surface and on sides of the wavelength conversion layer, directly contacting the common electrode, and configured to reflect the first light, and to transmit the second light.

2. The display device of claim 1, wherein the selective transmission film comprises a plurality of odd layers having a first refractive index, and a plurality of even layers having a second refractive index that is higher than the first refractive index, and
   wherein the plurality of odd layers and the plurality of even layers are alternately located in the thickness direction of the substrate.

3. The display device of claim 1, further comprising a color filter on the selective transmission film, configured to block or absorb the first light, and configured transmit at least a portion of the second light.

4. The display device of claim 1, further comprising a reflection film on sides of the selective transmission film.

5. The display device of claim 4, further comprising a connection electrode between the pixel electrode and the light-emitting element.

6. The display device of claim 5, wherein the common electrode is on an upper surface of the light-emitting element, and surrounds the sides of the light-emitting element and sides of the connection electrode.

7. The display device of claim 6, further comprising a first insulating film on the substrate, wherein the common electrode is on the first insulating film.

8. The display device of claim 7, wherein the selective transmission film is on the common electrode.

9. The display device of claim 6, further comprising a second insulating film between the sides of the light-emitting element and the common electrode.

10. A display device comprising:
a substrate;
a pixel electrode on the substrate;
a light-emitting element on the pixel electrode, and extending in a thickness direction of the substrate;
a wavelength conversion layer on the light-emitting element, comprising wavelength conversion particles for converting first light emitted from the light-emitting element into second light;
a common electrode directly contacting the wavelength conversion layer; and
a selective transmission film directly contacting the common electrode, and configured to reflect the first light and transmit the second light.

11. The display device of claim 10, wherein the light-emitting element comprises:
a first semiconductor layer on the pixel electrode;
an active layer on the first semiconductor layer; and
a second semiconductor layer on the active layer.

12. The display device of claim 11, wherein the wavelength conversion layer comprises a third semiconductor layer defining a plurality of openings for accommodating the wavelength conversion particles.

13. The display device of claim 12, wherein the third semiconductor layer comprises a same material as that of the second semiconductor layer.

14. The display device of claim 12, wherein the first semiconductor layer comprises p-GaN doped with a first conductive type dopant, and
wherein each of the second semiconductor layer and the third semiconductor layer comprises n-GaN doped with a second conductive type dopant.

15. The display device of claim 10, wherein a thickness of the wavelength conversion layer is greater than that of the light-emitting element.

16. The display device of claim 10, wherein the wavelength conversion layer is on an upper surface and sides of the common electrode, and surrounds sides of the light-emitting element.

17. A display device comprising:
a light-emitting element in each of a first light emission area configured to emit first light, a second light emission area configured to emit second light, and a third light emission area configured to emit third light;
a light transmitting layer on the light-emitting element in the first light emission area;
a common electrode on the light-emitting element;
a wavelength conversion layer on the light-emitting element in the second light emission area and on the light-emitting element in the third light emission area; and a selective transmission film on sides of the light transmitting layer in the first light emission area, on upper surfaces and sides of the wavelength conversion layer in the second light emission area, directly contacting the common electrode, and configured to reflect the first light incident from the wavelength conversion layer and to transmit the second light.

18. The display device of claim 17, wherein the selective transmission film is on the upper surfaces and sides of the wavelength conversion layer in the third light emission area, and is configured to transmit the third light.

19. The display device of claim 18, further comprising:
a first color filter on the light transmitting layer in the first light emission area, configured to transmit the first light, and configured to absorb or block the second light and the third light;
a second color filter on the wavelength conversion layer in the second light emission area, configured to transmit the second light, and configured to absorb or block the first light and the third light; and
a third color filter on the wavelength conversion layer in the third light emission area, configured to transmit the third light, and configured to absorb or block the first light and the second light.

20. A method for fabricating a display device, the method comprising:
forming a first connection electrode layer on a first substrate;
forming a second connection electrode layer on a light-emitting material layer of a second substrate;
forming a connection electrode layer by bonding the first connection electrode layer to the second connection electrode layer;
removing the second substrate;
forming a mask pattern on the light-emitting material layer;
etching the light-emitting material layer and the connection electrode layer in accordance with the mask pattern to form light-emitting elements;
forming an insulating film on sides of each of the light-emitting elements;
forming a common electrode on an upper surface of each of the light-emitting elements and on the insulating film;
forming a light transmitting layer on the common electrode in a first light emission area;
forming a wavelength conversion layer, which is configured to convert first light emitted from one or more of the light-emitting elements into second light, on the common electrode in a second light emission area and in a third light emission area; and
forming a selective transmission film, which is configured to reflect the first light and transmit the second light, on the wavelength conversion layer of each of the second light emission area and the third light emission area such that the selective transmission film directly contacts the common electrode.

* * * * *